(12) United States Patent
Roy

(10) Patent No.: US 12,712,011 B2
(45) Date of Patent: Aug. 18, 2026

(54) DYNAMIC RANDOM ACCESS MEMORY SYSTEM INCLUDING SINGLE-ENDED SENSE AMPLIFIERS AND METHODS FOR OPERATING SAME

(71) Applicant: Atomera Incorporated, Los Gatos, CA (US)

(72) Inventor: Richard S. Roy, Lago Vista, TX (US)

(73) Assignee: Atomera Incorporated, Los Gatos, CA (US)

( * ) Notice: Subject to any disclaimer, the term of this patent is extended or adjusted under 35 U.S.C. 154(b) by 198 days.

(21) Appl. No.: 18/399,579

(22) Filed: Dec. 28, 2023

(65) Prior Publication Data

US 2024/0221823 A1 Jul. 4, 2024

Related U.S. Application Data

(60) Provisional application No. 63/477,942, filed on Dec. 30, 2022.

(51) Int. Cl.
*G11C 16/04* (2006.01)
*G11C 11/406* (2006.01)
*G11C 11/4091* (2006.01)
*G11C 11/4094* (2006.01)

(52) U.S. Cl.
CPC .... *G11C 11/4091* (2013.01); *G11C 11/40615* (2013.01); *G11C 11/4094* (2013.01)

(58) Field of Classification Search
CPC .......... G11C 11/4091; G11C 11/40615; G11C 11/4094
See application file for complete search history.

(56) References Cited

U.S. PATENT DOCUMENTS 4,937,204 A 6/1990 Ishibashi et al.
5,216,262 A 6/1993 Tsu
5,357,119 A 10/1994 Wang et al.
(Continued)

FOREIGN PATENT DOCUMENTS

CN 112771669 A 5/2021
CN 115335908 A 11/2022
(Continued)

OTHER PUBLICATIONS

Emilio, Maurizio Di Paolo, "Quantum-Engineered Material Boosts Transistor Performance" https://www.eetrimes.com/quantum-engineered-material-boosts-transistor-performance/# EE Times; retrieved from Internet Feb. 10, 2022, 3 pages.
(Continued)

*Primary Examiner* — Pho M Luu
(74) *Attorney, Agent, or Firm* — Bever, Hoffman & Harms, LLP

(57) ABSTRACT

A DRAM system having a first array of DRAM cells, wherein each column of DRAM cells is coupled to a corresponding bit line, and a plurality of single-ended sense amplifiers, each coupled to a corresponding bit line. Each of the single-ended sense amplifiers includes a kick capacitor coupled to the corresponding bit line, a latch circuit having a first internal node for storing a data bit, and an isolation transistor coupling the corresponding bit line to the first internal node of the latch circuit, wherein the corresponding bit line is the only bit line of the first array of DRAM cells coupled to the latch circuit.

48 Claims, 30 Drawing Sheets

(56) References Cited

U.S. PATENT DOCUMENTS 5,438,543 A 8/1995 Yoon
5,683,934 A 11/1997 Candelaria
5,712,825 A 1/1998 Hadderman et al.
5,796,119 A 8/1998 Seabaugh
5,822,264 A 10/1998 Tomishima et al.
6,058,061 A 5/2000 Ooishi
6,111,803 A 8/2000 Derner et al.
6,226,754 B1 5/2001 Ware et al.
6,376,337 B1 4/2002 Wang et al.
6,447,933 B1 9/2002 Wang et al.
6,472,685 B2 10/2002 Takagi
6,636,454 B2 10/2003 Fujino et al.
6,741,624 B2 5/2004 Mears et al.
6,830,964 B1 12/2004 Mears et al.
6,833,294 B1 12/2004 Mears et al.
6,878,576 B1 4/2005 Mears et al.
6,891,188 B2 5/2005 Mears et al.
6,897,472 B2 5/2005 Mears et al.
6,927,413 B2 8/2005 Mears et al.
6,952,018 B2 10/2005 Mears et al.
6,958,486 B2 10/2005 Mears et al.
6,993,222 B2 1/2006 Mears et al.
7,018,900 B2 3/2006 Kreps
7,033,437 B2 4/2006 Mears et al.
7,034,329 B2 4/2006 Mears et al.
7,045,377 B2 5/2006 Mears et al.
7,045,813 B2 5/2006 Mears et al.
7,071,119 B2 7/2006 Mears et al.
7,105,895 B2 9/2006 Wang et al.
7,109,052 B2 9/2006 Mears et al.
7,123,792 B1 10/2006 Mears et al.
7,148,712 B1 12/2006 Prey, Jr. et al.
7,153,763 B2 12/2006 Hytha et al.
7,202,494 B2 4/2007 Blanchard et al.
7,227,174 B2 6/2007 Mears et al.
7,229,902 B2 6/2007 Mears et al.
7,265,002 B2 9/2007 Mears et al.
7,279,699 B2 10/2007 Mears et al.
7,279,701 B2 10/2007 Kreps
7,288,457 B2 10/2007 Kreps
7,303,948 B2 12/2007 Mears et al.
7,402,512 B2 7/2008 Derraa et al.
7,432,524 B2 10/2008 Mears et al.
7,435,988 B2 10/2008 Mears et al.
7,436,026 B2 10/2008 Kreps
7,446,002 B2 11/2008 Mears et al.
7,446,334 B2 11/2008 Mears et al.
7,491,587 B2 2/2009 Rao
7,514,328 B2 4/2009 Rao
7,517,702 B2 4/2009 Halilov et al.
7,531,828 B2 5/2009 Mears et al.
7,531,829 B2 5/2009 Blanchard
7,531,850 B2 5/2009 Blanchard
7,570,531 B2 8/2009 Nakamura et al.
7,586,116 B2 9/2009 Kreps et al.
7,586,165 B2 9/2009 Blanchard
7,598,515 B2 10/2009 Mears et al.
7,612,366 B2 11/2009 Mears et al.
7,625,767 B2 12/2009 Huang et al.
7,659,539 B2 2/2010 Kreps et al.
7,700,447 B2 4/2010 Dukovski et al.
7,718,996 B2 5/2010 Dukovski et al.
7,781,827 B2 8/2010 Rao
7,812,339 B2 10/2010 Mears et al.
7,848,166 B2 12/2010 Hsu et al.
7,863,066 B2 1/2011 Mears et al.
7,880,161 B2 2/2011 Mears et al.
7,928,425 B2 4/2011 Rao
7,929,367 B2 4/2011 Yoo et al.
8,164,941 B2 4/2012 Kang et al.
8,243,486 B2 * 8/2012 Riho ........................ G11C 5/04
365/189.05
8,320,208 B2 11/2012 Kajigaya et al.
8,389,974 B2 3/2013 Mears et al.
8,605,532 B2 12/2013 Kajigaya et al.
9,275,996 B2 3/2016 Mears et al.
9,406,753 B2 8/2016 Mears et al.
9,558,939 B1 1/2017 Stephenson et al.
9,716,147 B2 7/2017 Mears
9,721,790 B2 8/2017 Mears et al.
9,722,046 B2 8/2017 Mears et al.
9,899,479 B2 2/2018 Mears et al.
9,941,359 B2 4/2018 Mears et al.
9,972,685 B2 5/2018 Mears et al.
10,084,045 B2 9/2018 Mears et al.
10,107,854 B2 10/2018 Roy
10,109,342 B2 10/2018 Roy
10,109,479 B1 10/2018 Mears et al.
10,170,560 B2 1/2019 Mears
10,170,603 B2 1/2019 Mears et al.
10,170,604 B2 1/2019 Mears et al.
10,191,105 B2 1/2019 Roy
10,249,745 B2 4/2019 Mears et al.
10,276,625 B1 4/2019 Mears et al.
10,304,881 B1 5/2019 Chen et al.
10,324,760 B2 * 6/2019 Meswani .............. G06F 9/5016
10,355,151 B2 7/2019 Chen et al.
10,361,243 B2 7/2019 Mears et al.
10,367,028 B2 7/2019 Chen et al.
10,367,064 B2 7/2019 Rao
10,381,242 B2 8/2019 Takeuchi
10,396,223 B2 8/2019 Chen et al.
10,410,880 B2 9/2019 Takeuchi
10,453,945 B2 10/2019 Mears et al.
10,461,118 B2 10/2019 Chen et al.
10,468,245 B2 11/2019 Weeks et al.
10,529,757 B2 1/2020 Chen et al.
10,529,768 B2 1/2020 Chen et al.
10,566,191 B1 2/2020 Weeks et al.
10,580,866 B1 3/2020 Takeuchi et al.
10,580,867 B1 3/2020 Takeuchi et al.
10,593,761 B1 3/2020 Takeuchi et al.
10,608,027 B2 3/2020 Chen et al.
10,608,043 B2 3/2020 Chen et al.
10,615,209 B2 4/2020 Chen et al.
10,622,057 B2 4/2020 Kawamura et al.
10,636,879 B2 4/2020 Rao
10,727,049 B2 7/2020 Weeks et al.
10,741,436 B2 8/2020 Stephenson et al.
10,763,370 B2 9/2020 Stephenson
10,777,451 B2 9/2020 Stephenson et al.
10,811,498 B2 10/2020 Weeks et al.
10,818,755 B2 10/2020 Takeuchi et al.
10,825,901 B1 11/2020 Burton et al.
10,825,902 B1 11/2020 Burton et al.
10,840,335 B2 11/2020 Takeuchi et al.
10,840,336 B2 11/2020 Connelly et al.
10,840,337 B2 11/2020 Takeuchi et al.
10,840,388 B1 11/2020 Burton et al.
10,847,618 B2 11/2020 Takeuchi et al.
10,854,717 B2 12/2020 Takeuchi et al.
10,868,120 B1 12/2020 Burton et al.
10,879,356 B2 12/2020 Stephenson et al.
10,879,357 B1 12/2020 Burton et al.
10,884,185 B2 1/2021 Stephenson
10,937,868 B2 3/2021 Burton et al.
10,937,888 B2 3/2021 Burton et al.
11,075,078 B1 7/2021 Cody et al.
11,094,355 B1 8/2021 Simon et al.
11,094,818 B2 8/2021 Takeuchi et al.
11,177,351 B2 11/2021 Weeks et al.
11,183,565 B2 11/2021 Burton et al.
11,302,823 B2 4/2022 Weeks et al.
11,329,154 B2 5/2022 Takeuchi et al.
11,355,667 B2 6/2022 Stephenson
11,469,302 B2 10/2022 Takeuchi et al.
2001/0012214 A1 8/2001 Akita et al.
2002/0110016 A1 8/2002 Ooishi et al.
2002/0181307 A1 12/2002 Fifield et al.
2003/0034529 A1 2/2003 Fitzgerald et al.
2003/0057416 A1 3/2003 Currie et al.
2004/0190362 A1 9/2004 Hosokawa et al.
2004/0262594 A1 12/2004 Mears et al.
2004/0266116 A1 12/2004 Mears et al.

(56) References Cited

U.S. PATENT DOCUMENTS

2005/0029510 A1 2/2005 Mears et al.
2005/0032241 A1 2/2005 Coassin et al.
2005/0279991 A1 12/2005 Mears et al.
2005/0282330 A1 12/2005 Mears et al.
2006/0011905 A1 1/2006 Mears et al.
2006/0220118 A1 10/2006 Stephenson et al.
2006/0223215 A1 10/2006 Blanchard
2006/0231857 A1 10/2006 Blanchard
2006/0243963 A1 11/2006 Kreps et al.
2006/0243964 A1 11/2006 Kreps et al.
2006/0263980 A1 11/2006 Kreps et al.
2006/0267130 A1 11/2006 Rao
2006/0273299 A1 12/2006 Stephenson et al.
2006/0289049 A1 12/2006 Rao
2006/0292765 A1 12/2006 Blanchard et al.
2007/0010040 A1 1/2007 Mears et al.
2007/0012910 A1 1/2007 Mears et al.
2007/0015344 A1 1/2007 Mears et al.
2007/0020833 A1 1/2007 Mears et al.
2007/0020860 A1 1/2007 Mears et al.
2007/0063185 A1 3/2007 Rao
2007/0063186 A1 3/2007 Rao
2007/0158640 A1 7/2007 Halilov et al.
2007/0166928 A1 7/2007 Halilov et al.
2007/0187667 A1 8/2007 Halilov et al.
2008/0012004 A1 1/2008 Huang et al.
2008/0025113 A1 1/2008 Kitagawa
2009/0251948 A1 10/2009 Kajigaya et al.
2010/0270535 A1 10/2010 Halilov et al.
2011/0063891 A1 3/2011 Kajigaya
2011/0215299 A1 9/2011 Rao
2011/0248697 A1 10/2011 Kajigaya et al.
2013/0240744 A1 9/2013 Hurst, Jr. et al.
2014/0063992 A1 3/2014 Yoshida
2014/0085959 A1 3/2014 Saraswat et al.
2014/0169069 A1 6/2014 Oh
2014/0293715 A1 10/2014 Barth, Jr. et al.
2015/0206556 A1 7/2015 Song et al.
2015/0357002 A1 12/2015 Ware et al.
2017/0301679 A1 10/2017 Masuoka et al.
2018/0358059 A1 12/2018 Manning et al.
2019/0043869 A1 2/2019 Masuoka et al.
2019/0157166 A1 5/2019 Masuoka et al.
2019/0187930 A1* 6/2019 Chinnakkonda Vidyapoornachary .. G11C 5/06
2019/0267074 A1 8/2019 Fishburn et al.
2020/0176420 A1 6/2020 Or-Bach et al.
2020/0258897 A1 8/2020 Yan et al.
2021/0011645 A1 1/2021 Martinelli et al.
2021/0193245 A1 6/2021 Ryu et al.
2021/0382804 A1 12/2021 Alrod et al.
2022/0100404 A1 3/2022 Martinelli et al.
2022/0285367 A1 9/2022 Fackenthal
2022/0335283 A1 10/2022 Woo et al.
2023/0079504 A1 3/2023 Manning
2023/0130969 A1* 4/2023 Dutu ........................ G11C 7/08 365/189.05
2023/0223088 A1 7/2023 Lee et al.
2023/0259283 A1 8/2023 Kim et al.

FOREIGN PATENT DOCUMENTS

GB 2347520 A 9/2000
TW I277983 B 4/2007
TW 200816373 A 4/2008
TW I398875 B 6/2013
TW I585774 B 6/2017

OTHER PUBLICATIONS

JEDEC Standard—High Bandwidth Memory DRAM (HBM3), JESD238A (Revision of JESD238, Jan. 2022), Jan. 2023, JEDEC Solid State Technology Association, 270 pages.

Luo et al., “Chemical Design of Direct-Gap Light-Emitting Silicon” published in Physical Review Letters, vol. 89, No. 7; Aug. 12, 2002, 4 pages.

Mears et al., “Simultaneous Carrier Transport Enhancement and variability reduction in Si MOSFETs by insertion of partial Monolayers of oxygen” IEEE Silicon Nanoelectronics Workshop (2012); Conference Date Jun. 10-11, 2012, 2 pages.

Novikov et al. “Silicon-based Optoelectronics” 1999-2003, pp. 1-6.

Tsu, R. “Si Based Green ELD: Si-Oxygen Superlattice” ysiwyg://1/http://www3.interscience,wiley.com/cgi-bin/abstract/72512946/start: published online Jul. 21, 2000; 2 pages, Abstract Only.

Tsu, R. “Phenomena in silicon nanostructure device” published online Sep. 6, 2000 by Applied Physics and Materials Science & Processing, pp. 391-402.

Xu et al. “Effectiveness of Quasi-Confinement Technology for Improving P-channel Si and Ge MOSFET Performance” Department of Electrical Engineering and Computer Science, University of California, Berkeley, 2012, 2 pages, mearstech.net; retrieved from Internet Jan. 18, 201.

Xu et al., “Extension of planar bulk n-channel MOSFET scaling with oxygen insertion technology” IEEE Transactions on Electron Devices, vol. 61, No. 9; Sep. 2014, pp. 3345-3349.

Xu et al., “MOSFET performance and scalability enhancement by insertion of oxygen layers”, Department of Electrical Engineering and Computer Science, University of California, Berkeley, 2012, pp. 1-4.

* cited by examiner

1000

| MWL [23:0] | SRS [7:0] | $SWS_{A0}$ [3:0] | $SWS_{A1}$ [3:0] | $SWS_{A2}$ [3:0] | $SWS_{A3}$ [3:0] | $SWS_{A4}$ [3:0] | $SWS_{A5}$ [3:0] | $SWS_{A6}$ [3:0] | $SWS_{A7}$ [3:0] | Y-DEC [7:0] | BANK [7:0] | RW | BURST [1:0] |
|---|---|---|---|---|---|---|---|---|---|---|---|---|---|

FIG. 10

DYNAMIC RANDOM ACCESS MEMORY SYSTEM INCLUDING SINGLE-ENDED SENSE AMPLIFIERS AND METHODS FOR OPERATING SAME

PRIORITY APPLICATION

This application claims priority to U.S. Provisional Patent Application 63/477,942 entitled "DRAM Architecture With Decoded Sub-World Line (SWL) Configuration And Related Methods", filed by Richard Stephen Roy on Dec. 30, 2022.

FIELD OF THE INVENTION

The present invention relates to dynamic random access memory (DRAM) systems. More specifically, the present invention relates to DRAM systems that include single-ended sense amplifiers.

BACKGROUND

DRAM has been used in many system configurations to provide data storage for applications such as machine learning. As these applications become more complicated, it becomes more difficult to provide DRAM systems capable of handling all of the access requirements of these applications (e.g., random access bandwidth, latency, power, random access ability, memory capacity and density, refresh). JEDEC standard No. 238A describes specifications for a high bandwidth memory (HBM3) DRAM, which is coupled to a host computer die with a distributed interface. The HBM3 DRAM uses a wide-interface architecture in an attempt to achieve high-speed, low power operation. However, there is a need to have an improved DRAM system that exhibits an increased random access bandwidth, reduced access latency, reduced operating/standby power, improved random access capability, increased memory capacity capabilities, higher memory density, and an improved refresh scheme. Current HBM architectures focus on extending the current paradigm by increasing the data bandwidth for large data block accesses (with a significant power penalty for the analog circuits required to achieve data rates approaching 10 Gb/sec/pin) with very low ability to apply random (or nearly random) addresses at a high rate.

SUMMARY

Accordingly, the present invention focuses on increasing the number of Sustained Independent Transactions per second (SIT/s), which requires a much higher rate of nearly independent addresses to be applied to a stack of DRAM chips coupled by through silicon via (TSV) structures, while improving the power per transaction significantly. Additional features include significant improvements in power per transaction, latency, and data bandwidth, with little or no penalty in terms of area overhead.

In accordance with one embodiment, the present invention includes a dynamic random access memory (DRAM) system that includes a first array of DRAM cells arranged in a plurality of rows and columns, wherein each of the columns of DRAM cells is coupled to a corresponding bit line and a plurality of single-ended sense amplifiers, each coupled to a corresponding bit line of the first array of DRAM cells. Each of the single-ended sense amplifiers includes a kick capacitor coupled to the corresponding bit line, a latch circuit having a first internal node for storing a data value, and an isolation transistor coupling the corresponding bit line to the first internal node of the latch circuit, wherein the corresponding bit line is the only bit line of the first array of DRAM cells coupled to the latch circuit.

In a particular embodiment, the latch circuit includes a first p-channel transistor (P1) having a source coupled to a first control node (PCOM), a gate coupled to the first internal node (INT0) and a drain coupled to a second internal node INT0#), a first n-channel transistor (N1) having a source coupled to a second control node (NCOM), a gate coupled to the first internal node and a drain coupled to the second internal node, a second p-channel transistor (P2) having a source coupled to the first control node, a gate coupled to the second internal node and a drain coupled to the first internal node, and a second n-channel transistor (N2) having a source coupled to the second control node, a gate coupled to the second internal node and a drain coupled to the first internal node.

In a particular embodiment, a pre-charge circuit is coupled to the latch circuit, wherein the pre-charge circuit includes a first pre-charge transistor for selectively coupling the first internal node to a ground voltage supply, and a second pre-charge transistor for selectively coupling the second internal node to the ground voltage supply.

In a particular embodiment, the latch circuit further includes means for varying a voltage applied to the first control node (PCOM) between ground and a positive supply voltage, and means for varying a voltage applied to the second control node (NCOM) between ground and a negative supply voltage.

In a particular embodiment, each of the single-ended sense amplifiers further includes a refresh control transistor having a gate coupled to the second internal node, a drain coupled to the corresponding bit line, and a source coupled to receive a bit line refresh control signal.

In a particular embodiment, the means for varying a voltage applied to the kick capacitor during a read access is provided.

In accordance with another embodiment of the present invention, a method for operating a DRAM system is provided, including: pre-charging a bit line coupled to a DRAM cell to ground, pre-charging first and second internal nodes of a sense amplifier latch to ground, and disabling the sense amplifier latch by driving first and second supply voltage terminals of the sense amplifier latch to ground. A word line coupled to the DRAM cell is activated, thereby causing the DRAM cell to develop a read voltage on the bit line. A kick capacitor is then activated to drive down the read voltage developed on the bit line. The bit line is then coupled to the first internal node of the sense amplifier latch, thereby applying the read voltage developed on the bit line to the first internal node of the sense amplifier latch. The bit line is then isolated from the first internal node of the sense amplifier latch, and the sense amplifier latch is enabled by driving the first supply voltage terminal of the sense amplifier latch to a positive supply voltage and driving the second supply voltage terminal of the sense amplifier latch to a negative supply voltage. The bit line is then coupled to the first internal node of the sense amplifier latch to refresh the DRAM cell. In a particular embodiment, the word line is activated by initially applying a positive voltage to the word line, and then boosting this positive voltage.

In accordance with another embodiment, the present invention includes a DRAM system including a first integrated circuit chip including a plurality of processors, a second integrated circuit chip including a first plurality of independent DRAM arrays, each connected to a corresponding one of the plurality of processors on the first integrated circuit chip; and refresh control circuitry located on the first integrated circuit chip, wherein the refresh control circuitry initiates refresh operations to the first plurality of DRAM arrays on the second integrated circuit chip. In a particular embodiment, an interconnect structure couples each of the plurality of processors on the first integrated circuit chip. In another embodiment, a first plurality of through silicon via (TSV) structures connect the first and second integrated circuit chips.

In another embodiment, the DRAM system further includes a third integrated circuit chip including a plurality of DRAM arrays, wherein each of the plurality of DRAM arrays of the third integrated circuit chip is connected to a corresponding one of the plurality of processors on the first integrated circuit chip. In this embodiment, a second plurality of through silicon via (TSV) structures connect the first and third integrated circuit chips, wherein the second plurality of TSV structures extend through the first integrated circuit chip. In accordance with another embodiment, a power management integrated circuit is coupled to the first and second integrated circuit chips, wherein the power management integrated circuit provides a first plurality of supply voltages to the first integrated circuit chip and the second integrated circuit chip, and a second plurality of supply voltages only to the second integrated circuit chip.

In accordance with another embodiment, the present invention includes a DRAM system including a first integrated circuit chip having a plurality of DRAM blocks, each including a plurality of DRAM banks, and each extending in parallel along a width of the first integrated circuit chip, and a plurality of through silicon via (TSV) regions, each including a plurality of TSV interconnect structures, and each extending in parallel along the width of the integrated circuit chip, wherein each of the plurality of TSV regions is located between, and is connected to, a corresponding pair of the plurality of DRAM blocks.

In a particular embodiment, the plurality of DRAM blocks and plurality of TSV regions are configured to form a plurality of independent DRAM sectors, wherein each of the DRAM sectors includes a set of the plurality of DRAM banks and a set of the plurality of TSV interconnect structures.

In another embodiment, the DRAM system includes a second integrated circuit chip comprising a plurality of processors, wherein each of the processors is connected to a corresponding one of the independent DRAM sectors via the set of the plurality of TSV interconnect structures included in the corresponding one of the independent DRAM sectors. In another embodiment, all of the processors are coupled to one another by an interconnect structure on the second integrated circuit chip.

In accordance with another embodiment, the present invention includes a DRAM system including: a first integrated circuit chip including a plurality of processors, a second integrated circuit chip including a first plurality of independent DRAM sectors, wherein each of the first plurality of independent DRAM sectors is connected to a corresponding one of the plurality of processors on the first integrated circuit chip via a first plurality of through silicon via (TSV) interconnect structures, and a third integrated circuit chip including a second plurality of independent DRAM sectors, wherein each of the second plurality of independent DRAM sectors is connected to a corresponding one of the plurality of processors on the first integrated circuit chip via a second plurality of TSV interconnect structures, wherein the second plurality of TSV interconnect structures extend through the first integrated circuit chip.

In accordance with another embodiment, the present invention includes a DRAM system having: a first integrated circuit chip including a plurality of processors, a plurality of DRAM integrated circuit chips, each including a plurality of independent DRAM sectors, and a plurality of sets of through silicon via (TSV) interconnect structures, wherein each of the sets of TSV interconnect structures connects a corresponding one of the plurality of processors on the first integrated circuit chip with a corresponding one of the DRAM sectors on each of the plurality of DRAM integrated circuit chips.

In accordance with another embodiment, the present invention includes a DRAM unit cell located on an integrated circuit chip, wherein the DRAM unit cell includes: a plurality of through silicon vias (TSVs) that extend through the integrated circuit chip; a first plurality of DRAM banks that are aligned along a first axis, and a second plurality of DRAM banks that are aligned along the first axis, wherein the plurality of TSVs are located between the first and second plurality of DRAM banks along the first axis, wherein the plurality of TSVs transmit address and control signals for accessing the first and second plurality of DRAM banks, and wherein the plurality of TSVs transmit read and write data for the first and second plurality of DRAM banks.

In a particular embodiment, each of the first and second plurality of DRAM banks includes: a plurality of strips, wherein each strip includes: a plurality of corresponding rows of DRAM bit cells of the DRAM bank; a first primary sense amplifier circuit located adjacent to a first one of the plurality of corresponding rows of DRAM bit cells, wherein a first subset of the DRAM bit cells are coupled to the first primary sense amplifier circuit; and a second primary sense amplifier circuit located adjacent to a last one of the plurality of corresponding rows of DRAM bit cells, wherein a second subset of the DRAM bit cells are coupled to the second primary sense amplifier circuit.

In accordance with another embodiment, the present invention includes a DRAM unit cell having a first memory bank and a second memory bank. The first memory bank includes a plurality of rows and columns of DRAM cells, wherein the plurality of rows of the first memory bank are divided into N DRAM strips, wherein N is an integer greater than one, and wherein each of the N DRAM strips of the first memory bank includes a plurality of consecutive rows of the DRAM cells of the first memory bank. The first memory bank also includes a plurality of N+1 primary sense amplifier circuits, wherein each of the N DRAM strips of the first memory bank is coupled to a corresponding pair of the primary sense amplifier circuits of the first memory bank. The second memory bank includes a plurality of rows and columns of DRAM cells, wherein the plurality of rows of the second memory bank are divided into N DRAM strips, and wherein each of the N DRAM strips of the second memory bank includes a plurality of consecutive rows of the DRAM cells of the second memory bank. The second memory bank also includes a plurality of N+1 primary sense amplifier circuits, wherein each of the N DRAM strips of the second memory bank is coupled to a corresponding pair of the primary sense amplifier circuits of the second memory bank. A secondary sense amplifier circuit is located between the first and second memory banks, wherein the secondary sense amplifier circuit is coupled to each of the primary sense amplifier circuits of the first and second memory banks.

In a particular embodiment, a first half of the columns of DRAM cells in one of the N DRAM strips of the first memory bank is coupled to a first one of the primary sense amplifier circuits of the first memory bank, and a second half of the columns of the one of the N DRAM strips of the first memory bank is coupled to a second one of the primary sense amplifier circuits of the first memory bank.

In another embodiment, each of the N DRAM strips of the first memory bank includes a plurality of main word lines and a plurality of virtual sub-word lines, wherein each of the main word lines is coupled to a corresponding plurality of the virtual sub-word lines, and wherein each of the virtual sub-word lines is coupled to a row of the DRAM cells of the first memory bank.

In another embodiment, each of the virtual sub-word lines includes a plurality of independent sub-word line segments, wherein each sub-word line segment is coupled to a plurality of consecutive DRAM cells in a row of the DRAM cells of the first memory bank.

In another embodiment, the DRAM unit cell includes a plurality of sub-word line drivers, wherein each of the sub-word line drivers is coupled to a corresponding one of the sub-word line segments.

In another embodiment, each of the sub-word line drivers is coupled to receive a main word line signal from a corresponding one of the plurality of main word lines, and a sub-word line segment select signal for selecting the sub-word line segment coupled to the sub-word line driver.

In accordance with another embodiment, the present invention includes a DRAM system having a first set of DRAM cells arranged in a plurality of rows and four columns, wherein each of the four columns of DRAM cells in the first set of DRAM cells is coupled to a corresponding bit line of a first group of four bit lines; a second set of DRAM cells arranged in a plurality of rows and four columns, wherein each of the four columns of DRAM cells in the second set of DRAM cells is coupled to a corresponding bit line of a second group of four bit lines; and a first single-ended sense amplifier pair located between the first and second sets of DRAM cells, wherein the first single-ended sense amplifier pair comprises: a first single-ended sense amplifier; a second single-ended sense amplifier; a first transistor for selectively coupling and decoupling the first single-ended sense amplifier to a first bit line of the first group of bit lines; a second transistor for selectively coupling and decoupling the first single-ended sense amplifier to a first bit line of the second group of bit lines, wherein the first and second transistors are controlled such that the first single-ended sense amplifier is coupled to, at most, one bit line at a time; a third transistor for selectively coupling and decoupling the second single-ended sense amplifier to a second bit line of the first group of bit lines; and a fourth transistor for selectively coupling and decoupling the second single-ended sense amplifier to a second bit line of the second group of bit lines, wherein the third and fourth transistors are controlled such that the second single-ended sense amplifier is coupled to, at most, one bit line at a time.

In one embodiment, the first single-ended sense amplifier pair has a width less than or equal to a width corresponding to four times a pitch between adjacent bit lines.

In another embodiment, the DRAM system further includes a second single-ended sense amplifier pair located adjacent to the first set of DRAM cells. The second single-ended sense amplifier pair includes: a third single-ended sense amplifier; a fourth single-ended sense amplifier; a fifth transistor for selectively coupling and decoupling the third single-ended sense amplifier to a third bit line of the first group of bit lines; and a sixth transistor for selectively coupling and decoupling the fourth single-ended sense amplifier to a fourth bit line of the first group of bit lines.

In another embodiment, the DRAM system further includes a global bit line coupled to the first and second single-ended sense amplifiers of the first single-ended sense amplifier pair and the third and fourth single-ended sense amplifiers of the second single-ended sense amplifier pair.

The present invention will be more fully understood in view of the following description and drawings.

BRIEF DESCRIPTION OF THE DRAWINGS

FIG. 10 is a diagram illustrating a read/write access instruction for accessing an MTDRAM unit cell in accordance with one embodiment of the present invention.

DETAILED DESCRIPTION

The present invention includes a multi-threaded DRAM (MTDRAM) architecture that implements through-silicon via (TSV) structures to couple multiple MTDRAM chips to a dedicated controller chip. The system is optimized for power, including reduced power consumption for refresh during standby conditions (IDD6), and reduced power consumption per read/write transaction. The MTDRAM system also provides a significant increase in the maximum random address access rate (nearly random as well as fully random) when compared with conventional DRAM systems. In addition, the MTDRAM system does not require significant additional costs in terms of area overhead, design, materials or fabrication.

In accordance with one embodiment, the required power per transaction is significantly reduced with respect to conventional DRAM systems, wherein: the use of primary sense amplifiers using transistors with well-matched threshold voltages (due to the use of MST processes in the transistors of these sense amplifiers) provide up to 2× mismatch improvement; the use of small-signal single-ended primary sense amplifiers (which are operated with a reference voltage of ground) provide up to 10× refresh power savings by increasing the refresh interval; the use of small-signals (i.e., signals with a voltage swing of significantly less than Vdd) on the on-chip data path that extends between the primary sense amplifiers and the input/output TSV structures, along with the use of small-signals on the portions of the address and control paths leading to the final decoders (where the voltage swing must be increased to Vdd to allow for the operation of conventional NAND or NOR logic) provides up to 5× power savings; the use of decoded sub-word line segments provide up to 8× power savings, and use of a small unit cell greatly reduces long line power waste by up to 1.5× when compared to a conventional DRAM. Full chip connection paths are provided on the ASIC controller, which is far more power efficient and enables complex connections.

In addition, the random address access rate of the MTDRAM architecture is significantly greater than the random address access rate associated with a conventional HBM DDR5 system, and a newly defined nearly random address rate increases the SIT/s by orders of magnitude.

As described in more detail below, the MTDRAM architecture is optimized for future TSV production and test flow evolution. That is, the MTDRAM architecture will readily scale with reductions in the minimum TSV pitch. Moreover, it is trivial to overlay standard logical interfaces for legacy systems.

Figure 1:
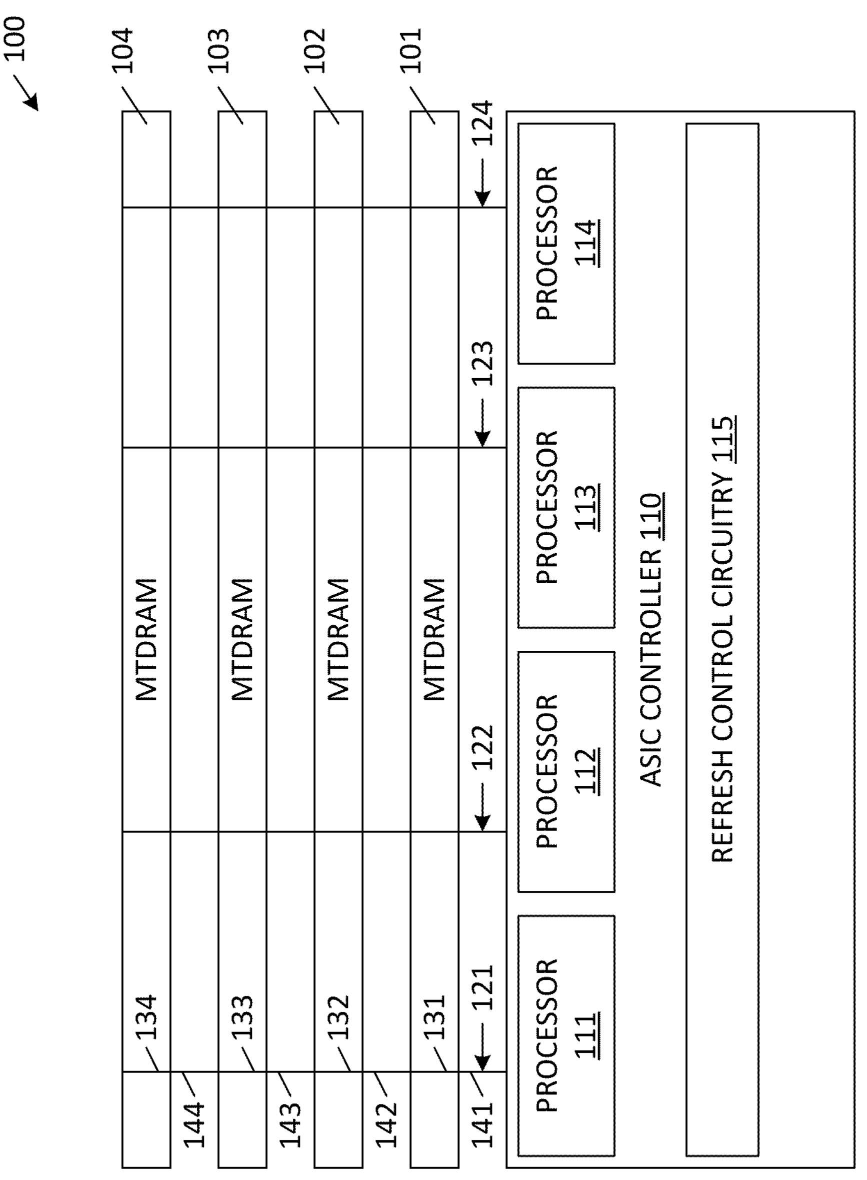
FIG. 1 is a side view of a multi-threaded dynamic random access memory (MTDRAM) system including a plurality of MTDRAM chips and ASIC controller in accordance with one embodiment of the present invention.

FIG. 1 is a side view of a multi-threaded dynamic random access memory (MTDRAM) system 100 in accordance with one embodiment of the present invention. In the illustrated embodiment, MTDRAM system 100 includes an application specific integrated circuit (ASIC) controller 110 that includes a plurality of distributed processors 111-114 and refresh control circuitry 115, which are fabricated with an advanced logic process. Although only four distributed processors 111-114 are illustrated in FIG. 1, it is understood that ASIC controller 110 will typically include more than four processors, in accordance with the teachings provided below. MTDRAM system 100 further includes a plurality of MTDRAM integrated circuit chips 101-104, each having DRAM memory structures (described in more detail below) which are accessed by the processors of the ASIC controller 110. The controller 110 and MTDRAM chips 101-104 are connected in a stacked configuration using a plurality of through-silicon via (TSV) interconnect structures. TSV interconnect structures 121-124 are generally represented by vertical lines in FIG. 1, wherein each of the TSV interconnect structures 121-124 includes TSVs that extend through the MTDRAM chips 101-104 (e.g., TSVs 131-134 of TSV interconnect structure 121), as well as interconnects that join the TSVs between the MTDRAM chips 101-104 and the controller 110 (e.g., interconnects 141-144 of TSV interconnect structure 121). Although only four TSV interconnect structures 121-124 are illustrated in FIG. 1, it will be understood that there are many more TSV interconnect structures included in MTDRAM system 100. As described in more detail below, the TSV interconnect structures 121-124 are used to route address signals, input/output signals and supply voltages to the various elements of MTDRAM system 100.

Figure 2:
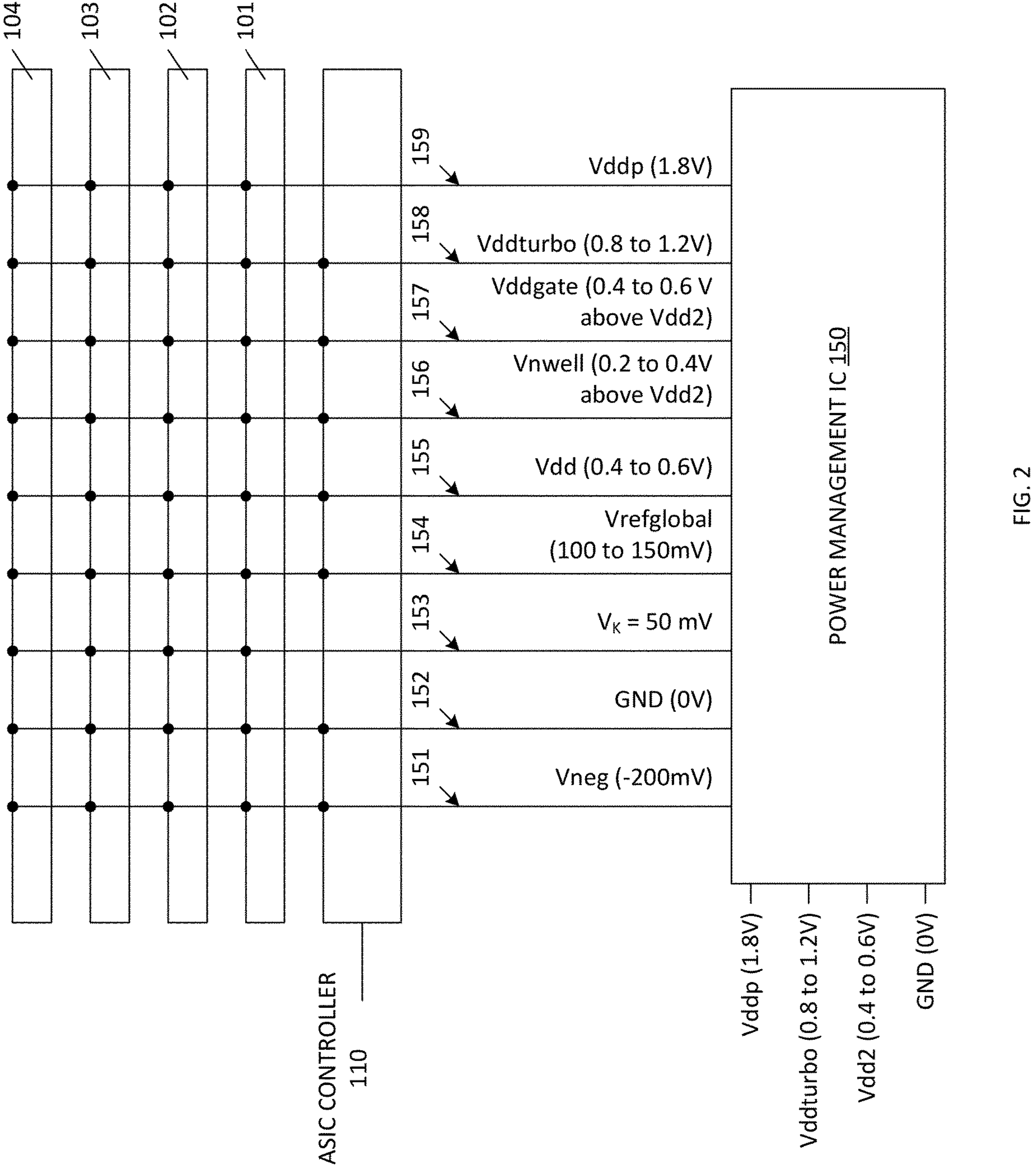
FIG. 2 is a side view illustrating a power management integrated circuit (IC) coupled to the MTDRAM system of FIG. 1 in accordance with one embodiment of the present invention.

FIG. 2 is a side view illustrating a power management integrated circuit (IC) coupled to the MTDRAM chips 101-104 and ASIC controller 110 in accordance with one embodiment. Power management IC 150 receives a plurality of supply voltages (e.g., Vddp=1.8 V, Vddturbo=0.8 to 1.2V, Vdd=0.4-0.6V, and GND=0V), and in response, generates a plurality of control/supply voltages for use in MTDRAM chips 101-104 and ASIC controller 110. TSV interconnect structures 151-159 provide the various voltages from the power management IC 150 to MTDRAM chips 101-104 and ASIC controller 110 as illustrated. Note that some voltages (e.g., Vneg=−200 mV, GND, Vrefglobal=100-150 mV, Vdd=0.4 to 0.6V, Vnwell=0.6 to 1.0 V, Vddturbo, and Vddgate=0.8 to 1.2V) are provided to both MTDRAM chips 101-104 and ASIC controller 110, while other voltages (e.g., $V_K$=50 mV and Vddp=1.8V) are only provided to MTDRAM chips 101-104 (i.e., pass through ASIC controller 110 without connection). The use of these voltages within MTDRAM chips 101-104 is described in more detail below.

In the illustrated embodiment, MTDRAM system 100 includes four MTDRAM chips 101-104, each having a DRAM storage capacity of 32 Gigabits (Gb). However, it is understood that in other embodiments, MTDRAM system 100 can be modified to include other numbers of MTDRAM chips 101-104 and/or include MTDRAM chips having other DRAM storage capacities. In the described embodiments, ASIC controller 110 includes refresh control circuitry 115 necessary to refresh the DRAM cells located on the MTDRAM chips 101-104. As described in more detail below, the refresh interval of the DRAM cells on MTDRAM chips 101-104 is advantageously increased by the present invention, advantageously reducing the number of refresh operations that must be performed over a given time period. As a result, significant power savings are realized.

Figure 3:
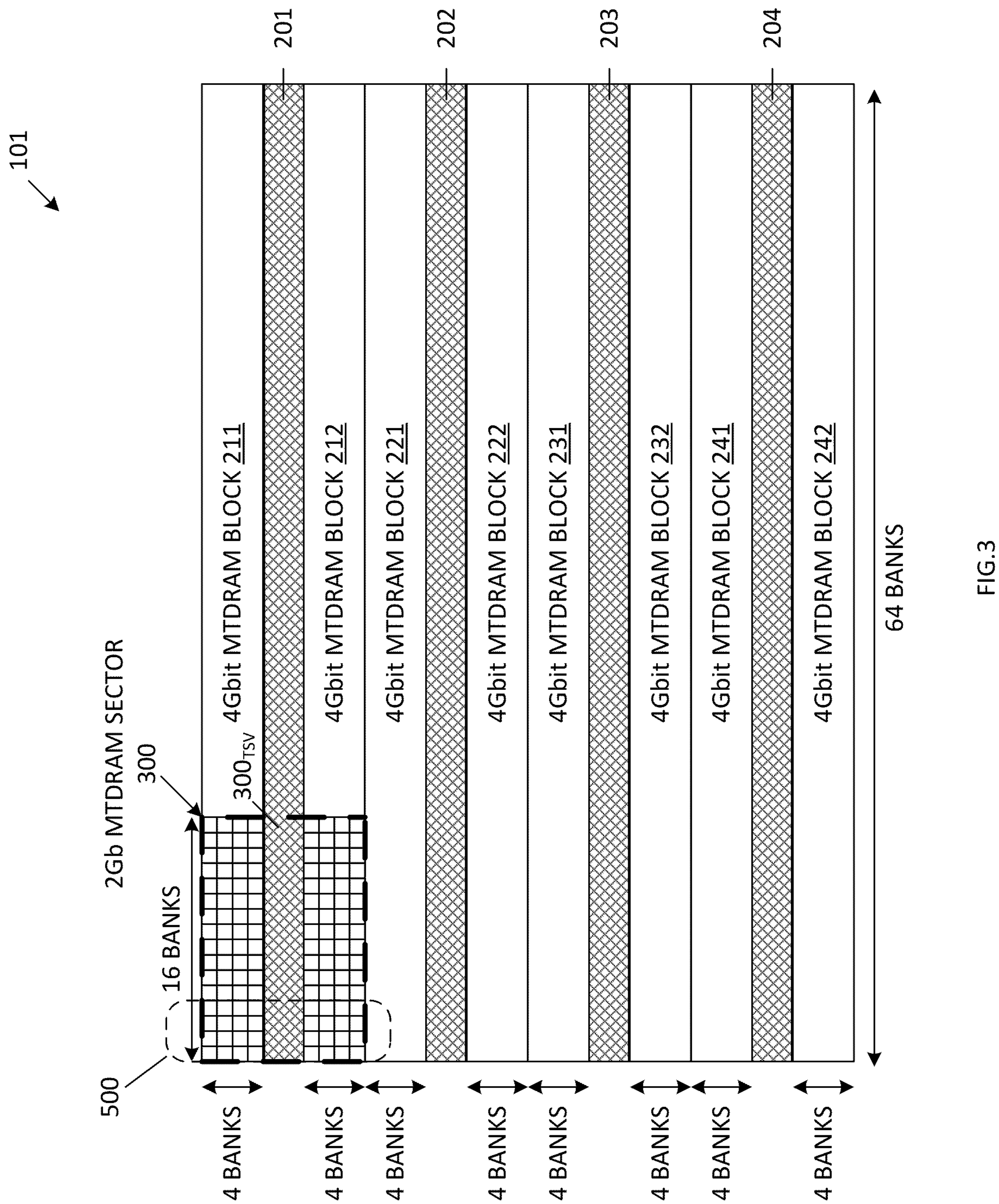
FIG. 3 is a top view of an MTDRAM chip in accordance with one embodiment of the present invention.

FIG. 3 is a top view of MTDRAM chip 101 in accordance with one embodiment. Note that MTDRAM chips 102-104 are laid out in the same manner as MTDRAM chip 101 to facilitate the stacked interconnection of these four MTDRAM chips as illustrated by FIGS. 1 and 2. As illustrated by FIG. 3, MTDRAM chip includes four TSV regions 201-204, wherein the TSVs of the MTDRAM chip 101 are located within these regions 201-204. TSV regions 201-204 extend horizontally across the MTDRAM chip 101, as illustrated. Eight 4 Gb MTDRAM memory blocks 211-212, 221-222, 231-232 and 241-242 also extend horizontally across the MTDRAM chip 101, wherein the TSV regions 201-204 are interleaved with these 4 Gb MTDRAM memory blocks. More specifically, TSV region 201 is located between MTDRAM memory blocks 211 and 212, wherein TSV region 201 includes TSVs that carry address, data and control signals used to operate MTDRAM memory blocks 211-212. Similarly, TSV regions 202, 203 and 204 are located between (and include TSVs that carry address/data/control signals used to operate) MTDRAM memory block pairs 221-222, 231-232 and 241-242, respectively. Although the described embodiments include four TSV regions 201-204 and eight corresponding memory blocks, it is understood that other numbers of TSV regions (and corresponding memory blocks) can be used in other embodiments.

Each of the MTDRAM memory blocks 211-212, 221-222, 231-232 and 241-242 includes 64 MTDRAM memory banks along the horizontal axis of FIG. 3, and four MTDRAM memory banks along the vertical axis of FIG. 2. In the described embodiments, each of the MTDRAM memory banks has a storage capacity of 16 Mb (e.g., a 4 k×4 k array of MTDRAM bit cells). In other embodiments, the MTDRAM memory blocks can have other numbers of MTDRAM memory banks, and each of the MTDRAM memory banks can have other storage capacities.

TSV regions 201-204 and MTDRAM memory blocks 211-212, 221-222, 231-232 and 241-242 are subdivided into sixteen independently accessed 2 Gb MTDRAM sectors. An exemplary 2 Gb sector 300 is illustrated in FIG. 3 wherein this 2 Gb sector 300 includes: 64 (16×4) MTDRAM memory banks of MTDRAM memory block 211, 64 (16×4) MTDRAM memory banks of MTDRAM memory block 212, and the portion of TSV region 201 located between the above-specified MTDRAM memory banks, wherein this portion of TSV region 201 is labeled as TSV section $\mathbf{300}_{TSV}$ in FIG. 3.

Figure 4:
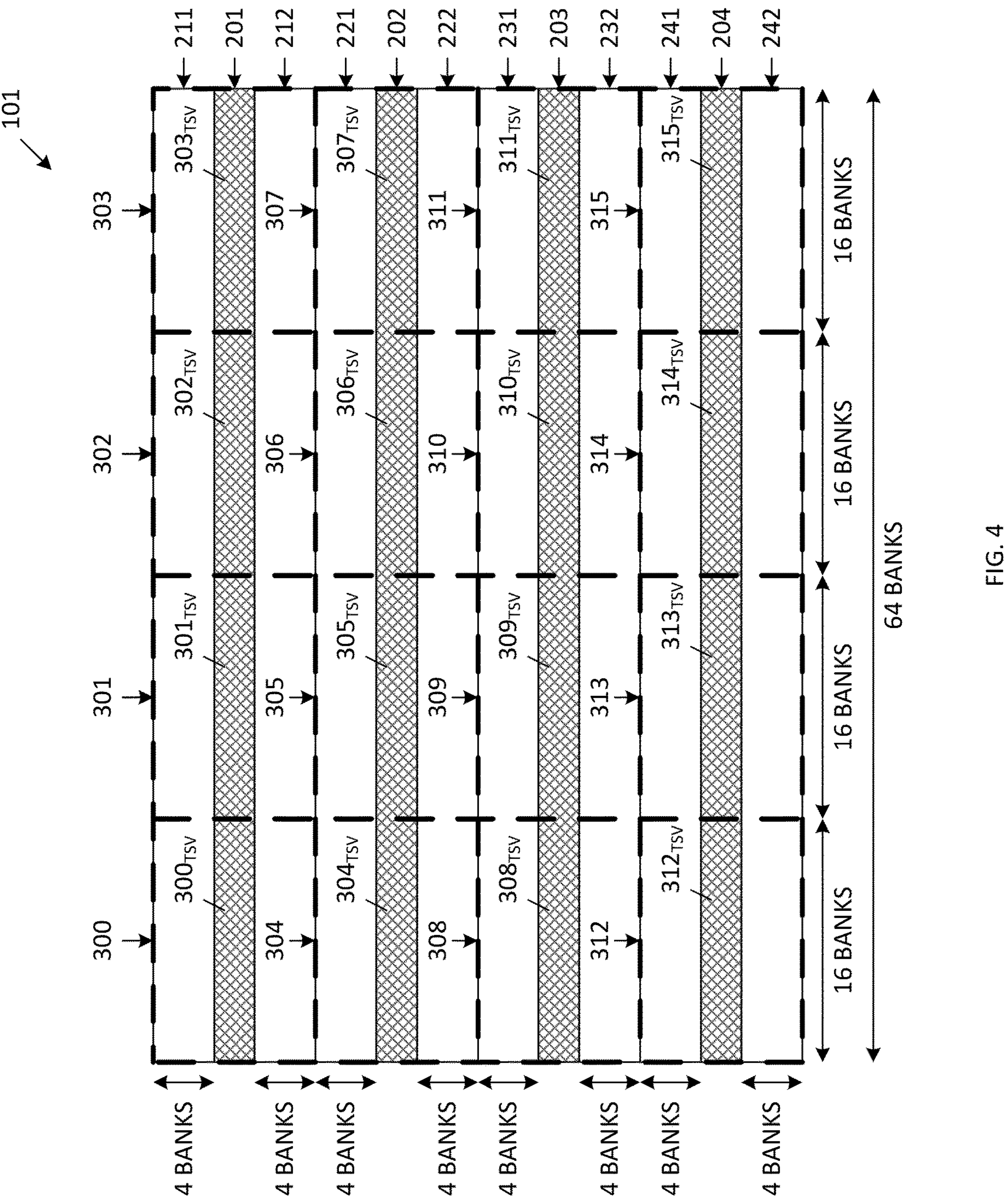
FIG. 4 is a top view of the MTDRAM chip of FIG. 3, illustrating the locations of sixteen 2 GB MTDRAM sectors.

A total of sixteen 2 Gb MTDRAM sectors (each identical to Sector 300) are included on MTDRAM chip 101. FIG. 4 is a top view of MTDRAM chip 101, illustrating the locations of sixteen 2 GB MTDRAM sectors 300-315. Each of the sixteen MTDRAM sectors 300-315 on MTDRAM chip 101 is operated independently (i.e., the sixteen MTDRAM Sectors 300-315 do not communicate with one another on MTDRAM chip 101). In accordance with one embodiment, each of the sixteen MTDRAM sectors 300-315 is accessed by a corresponding processor located on the ASIC controller 110. In other embodiments, the MTDRAM sectors can have a capacity other than 2 Gb, and there may be more or less than sixteen MTDRAM sectors on MTDRAM chip 101.

Figure 5:
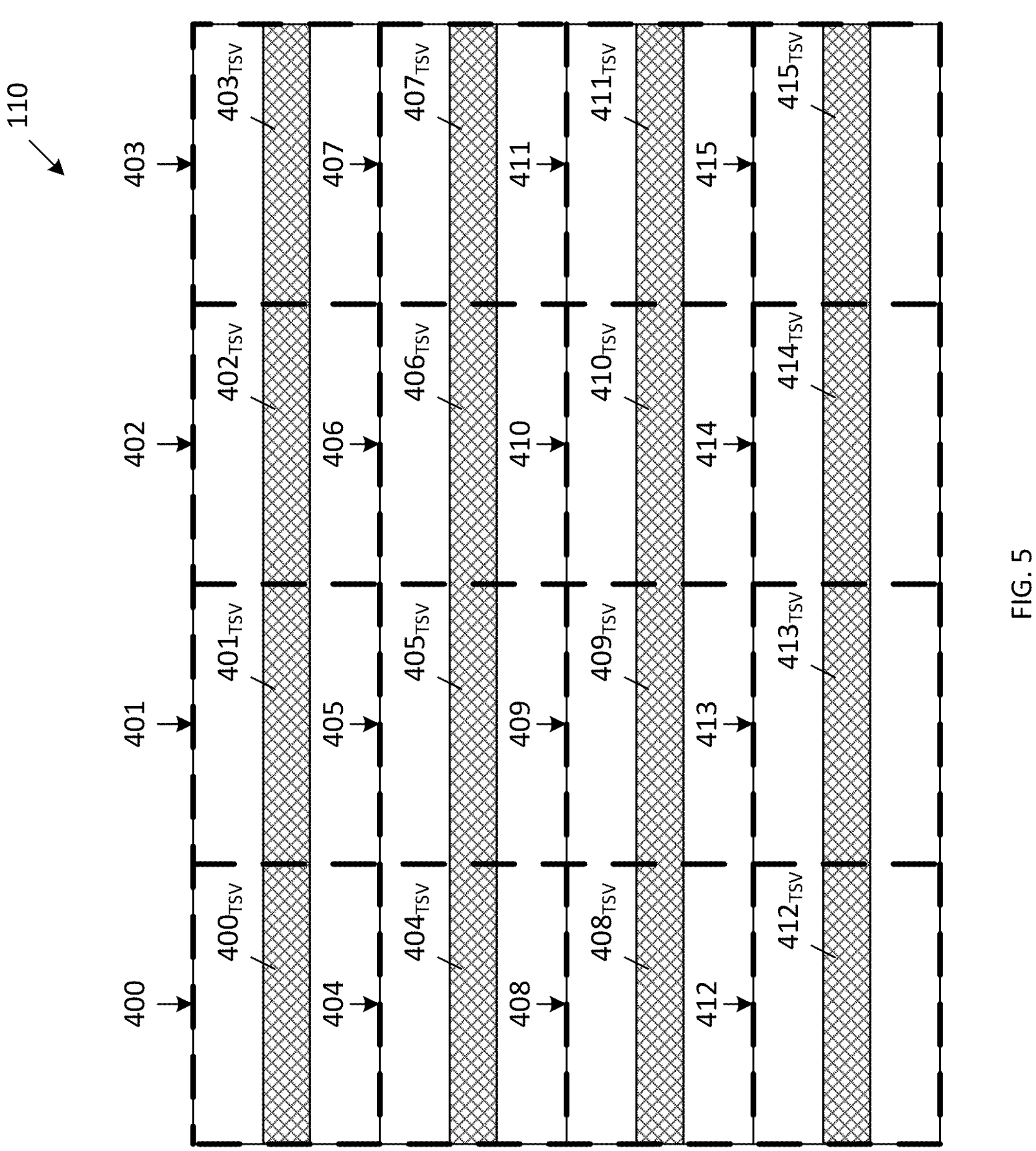
FIG. 5 is a top view of the ASIC controller of FIG. 1, which shows the general locations of a plurality of processors, along with corresponding TSV sections for interfacing with the MTDRAM chip of FIG. 3.

FIG. 5 is a top view of ASIC controller 110, which shows the general location of processors 400-415, along with corresponding TSV sections $\mathbf{400}_{TSV}$-$\mathbf{415}_{TSV}$. In the illustrated embodiment, processors 400-415 are coupled to access MTDRAM sectors 300-315, respectively, on MTDRAM chip 101. More specifically, TSVs in TSV sections $\mathbf{400}_{TSV}$-$\mathbf{415}_{TSV}$ of controller 110 are connected with corresponding TSVs in TSV sections $\mathbf{300}_{TSV}$-$\mathbf{315}_{TSV}$, respectively, of MTDRAM chip 101. Although the number of processors 400-415 corresponds with the number of independent MTDRAM sectors 300-315 in the described embodiment, it is understood that other configurations are possible. For example, a single processor on controller 110 may be configured to access a plurality of the MTDRAM sectors 300-315 in parallel. Note that in this embodiment, the plurality of MTDRAM sectors on chip 101 that are accessed by the single processor on controller 110 continue to operate independently (i.e., these MTDRAM sectors do not communicate with each other on MTDRAM chip 101). In addition, it is understood that each of the processors 400-415 can implement one or more multi-core processors. In another embodiment, multiple processors on ASIC controller 110 are configured to independently access corresponding groups of memory banks (i.e., unit cells) within a single MTDRAM sector.

In the described embodiments, MTDRAM chips 102-104 are identical to MTDRAM chip 101. Thus, MTDRAM chips 102-104 may be stacked on MTDRAM chip 101 (as illustrated by FIG. 1), wherein vertically aligned 2 Gb MTDRAM Sectors on the chips 101-104 are connected to a corresponding processor on ASIC controller 110 using the corresponding TSV regions.

Figure 6C:
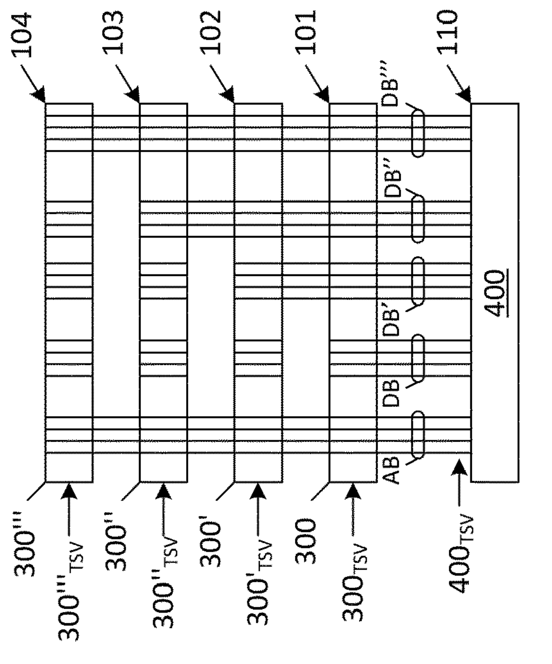
FIG. 6C is a side view illustrating the manner in which a processor on the ASIC controller is coupled to corresponding MTDRAM sectors on a plurality of MTDRAM chips in accordance with yet another embodiment of the present invention.
Figure 6B:
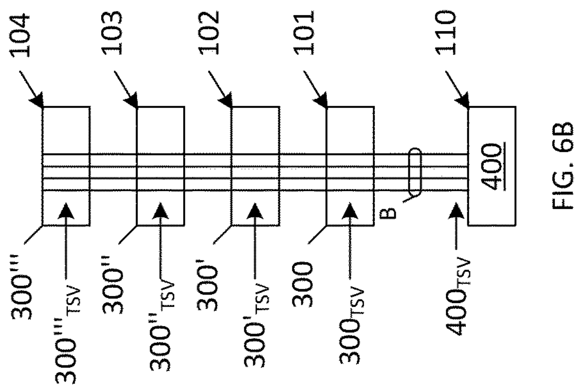
FIG. 6B is a side view illustrating the manner in which a processor on the ASIC controller is coupled to corresponding MTDRAM sectors on a plurality of MTDRAM chips in accordance with another embodiment of the present invention.
Figure 6A:
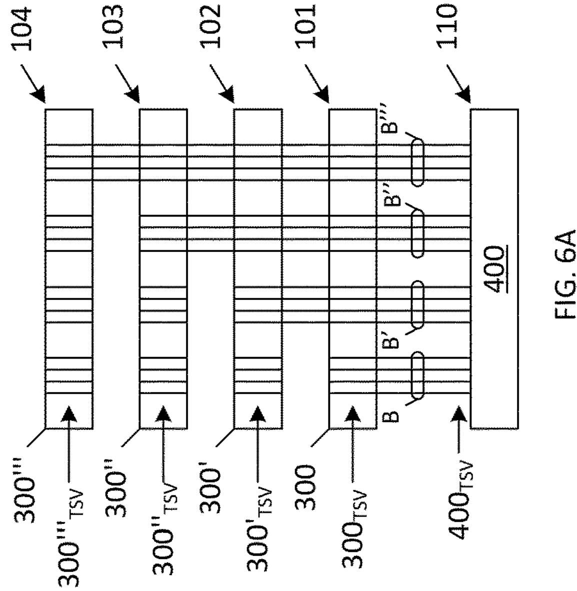
FIG. 6A is a side view illustrating the manner in which a processor on the ASIC controller is coupled to corresponding MTDRAM sectors on a plurality of MTDRAM chips in accordance with one embodiment of the present invention.

FIG. 6A is a side view illustrating the manner in which the processor 400 is coupled to corresponding 2 Gb MTDRAM sectors in chips 101-104. In this embodiment, the processor block 400 is coupled to the 2 Gb MTDRAM sector 300 in MTDRAM chip 101 by a bus B, which includes one quarter of the TSVs in TSV section $\mathbf{400}_{TSV}$ and one quarter of the TSVs in TSV section $\mathbf{300}_{TSV}$. Similarly, processor 400 is independently coupled to the corresponding 2 GB MTDRAM sectors 300', 300" and 300'" in MTDRAM chips 102, 103 and 104, respectively, by buses B', B" and B'", respectively, each of which includes one quarter of the TSVs in TSV section $\mathbf{400}_{TSV}$ and one quarter of the TSVs in the TSV sections $\mathbf{300'}_{TSV}$, $\mathbf{300''}_{TSV}$ and $\mathbf{300'''}_{TSV}$ in MTDRAM chips 102, 103 and 104, respectively. Note that the TSV configuration illustrated by FIG. 6A advantageously allows all of the stacked MTDRAM chips 101-104 to have the same TSV pattern (even though only one quarter of the TSVs are used to access MTDRAM memory within any MTDRAM chip). The bus configuration of FIG. 6A can be readily realized by selectively connecting (and not connecting) the TSV sections $\mathbf{300}_{TSV}$, $\mathbf{300'}_{TSV}$, $\mathbf{300''}_{TSV}$ and $\mathbf{300'''}_{TSV}$ in the manner illustrated. When using the configuration of FIG. 6A, each of the MTDRAM chips 101-104 includes TSV selection circuitry, which selectively couples the appropriate ¼ of the TSVs in its TSV section to access the MTDRAM memory within the chip. This TSV selection circuitry can be controlled in accordance with JTAG or other similar means. In one embodiment, the processor 400 controls the TSV selection circuitry on the MTDRAM chips to perform this setup based on the known interconnection pattern of the TSVs between the MTDRAM chips (i.e., processor 400 specifies that the TSV selection circuitry on MTDRAM chips 101, 102, 103 and 104 will select buses B, B', B" and B'", respectively. In the above-described manner, each of the four stacked 2 Gb sectors 300, 300', 300" and 300'" in MTDRAM chips 101-104 has separate, independent address and data buses.

FIG. 6B is a side view illustrating the manner in which the processor 400 is coupled to corresponding 2 Gb MTDRAM sectors in chips 101-104 in accordance with an alternate embodiment. In this embodiment, all of the MTDRAM chips 101-104 share the same address and data bus B. In this case, means for separately addressing the MTDRAM chips 101-104 is required (e.g., a 2-bit address may be used to select one of the four MTDRAM chips 101-104 for any given access). In one embodiment, the required identification values are loaded by JTAG ahead of time to each of the MTDRAM chips 101-104 and processor 400. In this embodiment, data can only be read from (or written to) one MTDRAM chip sub-array at a time by the processor 400.

FIG. 6C is a side view illustrating the manner in which the processor 400 is coupled to corresponding 2 Gb MTDRAM sectors in chips 101-104 in accordance with another embodiment. In this embodiment, the stack of four 2 Gb Sectors in MTDRAM chips 101-104 share a common address bus AB, but have separate data buses DB, DB', DB" and DB'", respectively. In this case, means for separately addressing the MTDRAM chips 101-104 is required (e.g., a 4-bit address may be used to select any combination of the four MTDRAM chips 101-104 for any given access). In this embodiment, data can be read from (or written to) the same address within any combination of the MTDRAM chips 101-104, in parallel. In one embodiment, the required identification values are loaded by JTAG ahead of time to each of the MTDRAM chips 101-104 and processor 400. The embodiments described above teach the manner in which the required number of TSVs can be modified by modifying the operating capabilities of the MTDRAM system.

Although the MTDRAM sectors 300-315 are independently accessed on MTDRAM chip 101, all the processors 400-415 on ASIC controller 110 can be interconnected with one another. Conventional logic processes used to fabricate ASIC controller 110 typically include 10-15 metal layers, which can be used to interconnect the processors 400-415. In one embodiment, these connections enable all of the processors 400-415 to communicate with each other, such that data retrieved from any one of the MTDRAM Sectors on MTDRAM chips 101-104 can be shared among any of the processors 400-415 on ASIC controller 110.

Returning now to the configuration of the MTDRAM chip 101, each of the 2 Gb MTDRAM sectors 300-315 is further subdivided into sixteen independent unit cells, wherein each unit cell includes: 8 MTDRAM banks and the corresponding TSVs required to access these 8 MTDRAM banks. The MTDRAM chip 101 therefore includes 256 unit cells. Each of these unit cells can be independently accessed by a corresponding processor on ASIC controller 110, using one of the TSV configurations specified by FIGS. 6A, 6B and 6C.

Figure 7:
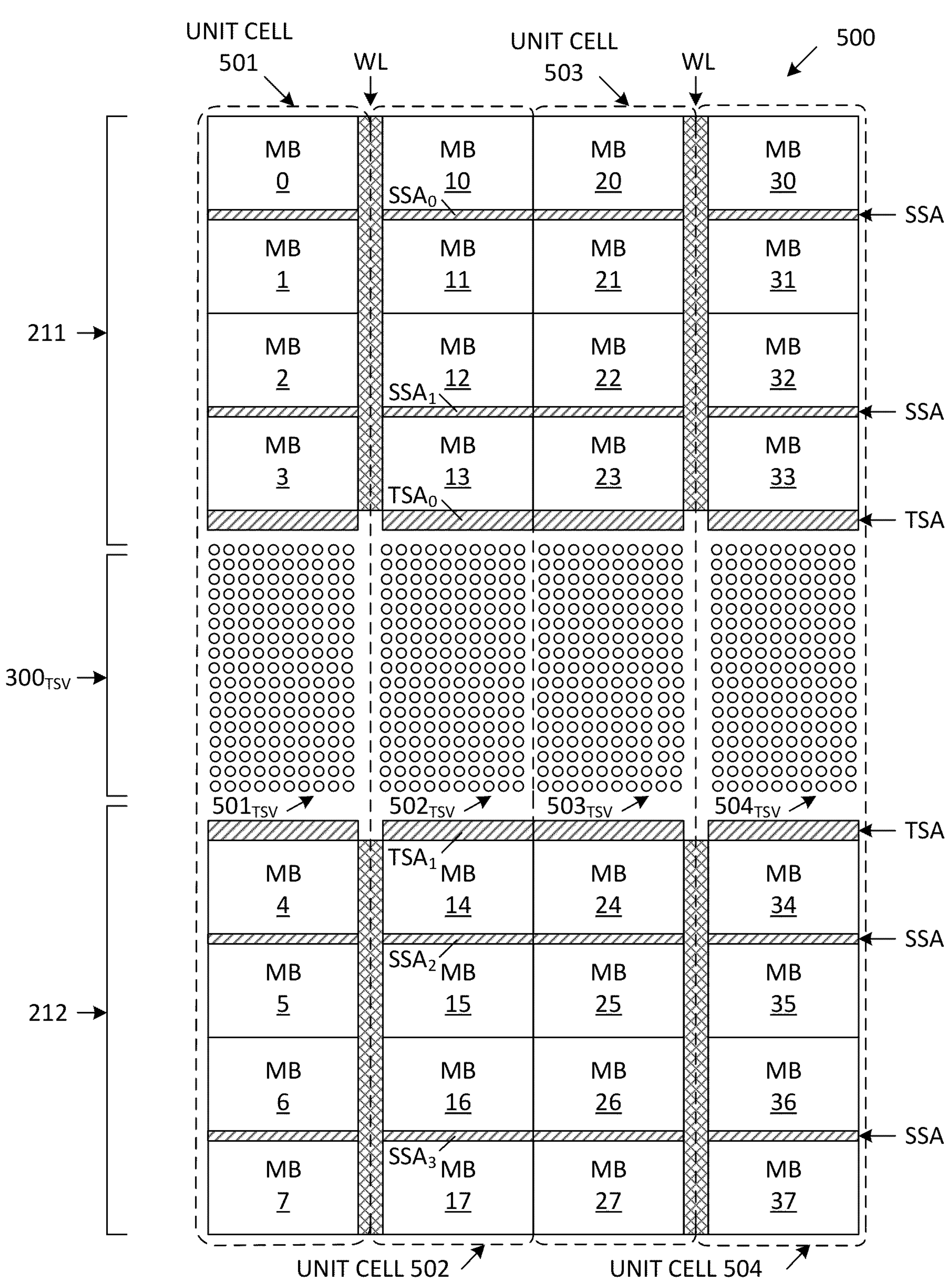
FIG. 7 is a top view of a set of four MTDRAM unit cells included in a 2 Gb sector of a MTDRAM chip in accordance with one embodiment of the present invention.

FIG. 7 is a top view of a set 500 of four unit cells 501-504 of 2 Gb sector 300 (FIG. 3) in accordance with one embodiment. The boundaries of the four unit cells 501-504 are specified by dashed lines. Unit cells 501, 502, 503 and 504 include MTDRAM banks (MB) 0-7, 10-17, 20-27, and 30-37, respectively. Within each unit cell, the 8 corresponding MTDRAM banks are arranged in eight rows and one column, as illustrated. Although the embodiment of FIG. 7 includes eight banks per unit cell, it is understood that each unit cell can include other numbers of banks (e.g., 2, 4 or 16 banks) in other embodiments. Moreover, although the banks of the unit cells of FIG. 7 are arranged in eight rows and one column, it is understood that a unit cell can include other numbers of rows and columns (e.g., four rows and two columns) in other embodiments. Word line driver circuits (WL) generally extend vertically through each unit cell. Each of the MTDRAM banks includes a corresponding plurality of primary sense amplifier (PSA) circuits (not shown in FIG. 7). Each of the MTDRAM banks also shares a secondary sense amplifier circuit (generally labeled SSA) with a vertically adjacent MTDRAM bank. For example, vertically adjacent MTDRAM banks 10 and 11 share a secondary sense amplifier circuit $SSA_0$ in unit cell 502. Data is transferred between the primary sense amplifier circuits of MTDRAM banks 10 and 11 and the secondary sense amplifier circuit $SSA_0$ in a manner described in more detail below. Primary sense amplifier circuits in vertically adjacent MTDRAM bank pairs 12-13, 14-15 and 16-17 are similarly configured to share corresponding secondary sense amplifier circuits $SSA_1$, $SSA_2$ and $SSA_3$, respectively. Each set of four vertically adjacent MTDRAM banks also share a tertiary sense amplifier circuit (generally labeled TSA). More specifically, vertically adjacent MTDRAM banks 10-13 share a tertiary sense amplifier circuit $TSA_0$ and vertically adjacent MTDRAM banks 14-17 share a tertiary sense amplifier circuit $TSA_1$ in unit cell 502. Data is transferred between the secondary sense amplifier circuits $SSA_0$-$SSA_1$ and $SSA_2$-$SSA_3$ and the tertiary sense amplifier circuits $TSA_0$ and $TSA_1$, respectively.

Each of the unit cells 501-504 has a corresponding identical set of TSV structures in TSV region $\mathbf{300}_{TSV}$. For example, unit cells 501, 502, 503 and 504 include TSV sets $\mathbf{501}_{TSV}$, $\mathbf{502}_{TSV}$, $\mathbf{503}_{TSV}$ and $\mathbf{504}_{TSV}$, respectively, as illustrated in FIG. 7. Each unit cell is independently accessed through its corresponding TSV set. More specifically, each TSV set includes TSV structures (shown as circles in FIG. 7) that carry instructions (including addresses) from the corresponding processor 400 in the ASIC controller 110 to the corresponding unit cell (for accessing the unit cell), and TSV structures that carry input/output signals (e.g., data) between the processor 400 and the corresponding unit cell. Each set of TSV structures can also include supply/control voltages from the power management IC 150 to the corresponding unit cell. In addition, each TSV set includes the TSV structures necessary for the corresponding processor 400 in the ASIC controller 110 to communicate with corresponding unit cells in the stacked MTDRAM chips 102, 103 and 104 (as illustrated by FIGS. 6A-6C). It is understood that FIG. 7 is not drawn to scale, and that each of the TSV sets $\mathbf{501}_{TSV}$, $\mathbf{502}_{TSV}$, $\mathbf{503}_{TSV}$ and $\mathbf{504}_{TSV}$ will include many more TSVs than illustrated in FIG. 7. The required number of TSV structures required for each unit cell can be calculated in view of the description provided herein. Note that the minimum TSV pitch defines various aspects of the layout of MTDRAM chip. As TSV processes improve, and the minimum TSV pitch decreases, the area efficiency of the design of the MTDRAM chip 101 will advantageously improve.

In the illustrated embodiment of FIG. 7, the unit cells 501-504 are physically divided into halves (e.g., unit cell 502 is divided into an upper half that includes memory banks 10-13 and a lower half that includes memory banks 14-17), and the TSV set (e.g., TSV set $\mathbf{502}_{TSV}$) is located between the two halves. As a result, the TSV set associated with each unit cell is located in the common TSV region 201 of the MTDRAM chip 101.

Although only four unit cells 501-504 are illustrated in FIG. 7, it is understood that these unit cells are replicated in the horizontal and vertical directions (based on the configuration of FIGS. 3-4) to complete the layout of the MTDRAM chip 101.

Figure 8:
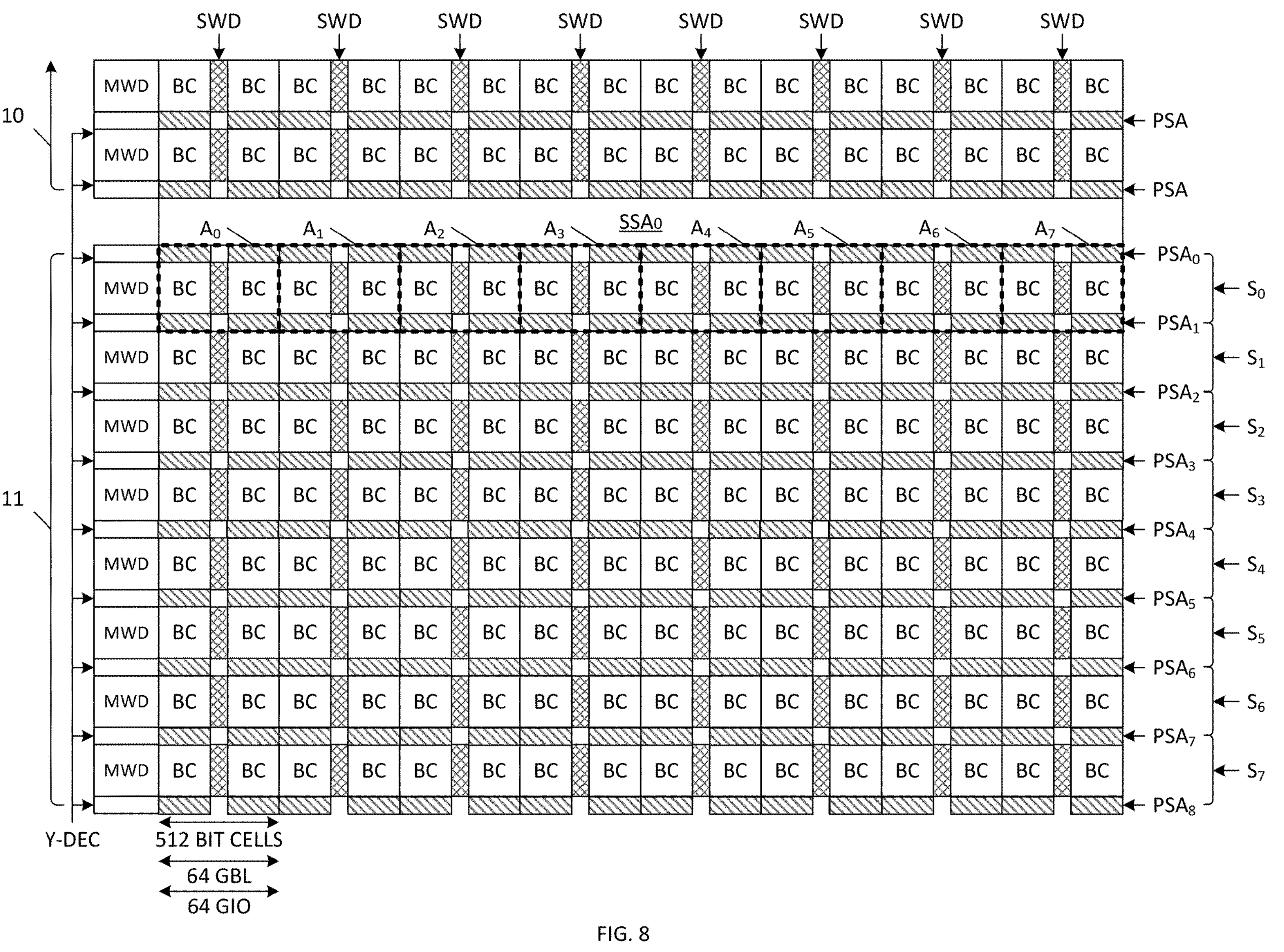
FIG. 8 is a top view of an MTDRAM bank included in a MTDRAM unit cell, wherein the MTDRAM bank includes a plurality of MTDRAM strips, each having a plurality of sub-arrays, in accordance with one embodiment of the present invention.

FIG. 8 is a top view of MTDRAM bank 11 (and an adjacent portion of MTDRAM bank 10) of unit cell 502 in accordance with one embodiment. Main word line driver circuitry is generally indicated by MWD, sub-word line driver circuitry is generally indicated by SWD, the primary sense amplifier circuitry is generally indicated by PSA (with the primary sense amplifier circuitry of MTDRAM bank 11 labeled $PSA_0$-$PSA_8$), Y-decoder driver circuitry associated with the primary sense amplifier circuitry is generally indicated by Y-DEC, and bit cell arrays are generally indicated by BC. Each bit cell array (BC) includes 512 rows×256 columns of MTDRAM bit cells, such that the entire MTDRAM bank 11 includes a 4096×4096 array of MTDRAM bit cells (16 Mb). In this embodiment, each unit cell has a capacity of 128 Mb (8×16 Mb).

Each MTDRAM bank is subdivided into a plurality of strips, wherein each strip includes 512 corresponding rows of the MTDRAM bank (along with the corresponding MWD circuitry, SWD circuitry, primary sense amplifiers and Y-DEC driver circuitry). For example, MTDRAM bank 11 includes eight MTDRAM strips $S_0$-$S_7$, each including 512 consecutive rows of MTDRAM bank 11.

Each MTDRAM strip is further subdivided to include a plurality of MTDRAM sub-arrays. In the embodiment of FIG. 8, each MTDRAM strip includes eight MTDRAM sub-arrays. For example, MTDRAM strip $S_0$ includes MTDRAM sub-arrays $A_0$-$A_7$. As described in more detail below, each sub-array includes: a pair of horizontally adjacent bit cell (BC) arrays (which form a 512×512 sub-array of bit cells), sub-word line driver (SWD) circuitry located between the adjacent bit cell arrays, and primary sense amplifiers located vertically adjacent to (both above and below) the bit cell arrays.

Each MTDRAM bank includes 1024 main word lines (MWLs) and 4096 virtual sub-word lines (SWLs), wherein each main word line is coupled to four corresponding virtual sub-word lines. Thus, each MTDRAM strip includes 128 main word lines and 512 virtual sub-word lines. As described in more detail below, each virtual sub-word line is subdivided into eight independently addressable sub-word line segments, wherein each sub-word line segment is located in a corresponding sub-array of the corresponding strip.

For example, each virtual sub-word line of the MTDRAM strip $S_0$ is divided into eight sub-word line segments, wherein each of the eight sub-word line segments is located in a corresponding one of the eight MTDRAM sub-arrays $A_0$-$A_7$ of the strip $S_0$. Each of these sub-word line segments is independently controlled by a corresponding sub-word line driver, such that an access to strip $S_0$ may access data from any combination of the MTDRAM sub-arrays $A_0$-$A_7$ of MTDRAM bank 11. As described in more detail below, this configuration advantageously increases the flexibility with which the MTDRAM strip $S_0$ can be accessed, and can also reduce the power requirements of accesses to the MTDRAM bank 11.

Although the MTDRAM bank 11 is described in accordance with a particular bank size (16 Mb), a particular bit cell array size (512 rows×256 columns), a particular strip size (512 rows), a particular number of strips (8), a particular number of sub-arrays (8) per strip, a particular number of virtual sub-word lines (4) per main word line, it is understood that these parameters can be varied to implement MTDRAM banks in accordance with other embodiments of the present invention.

Figure 9:
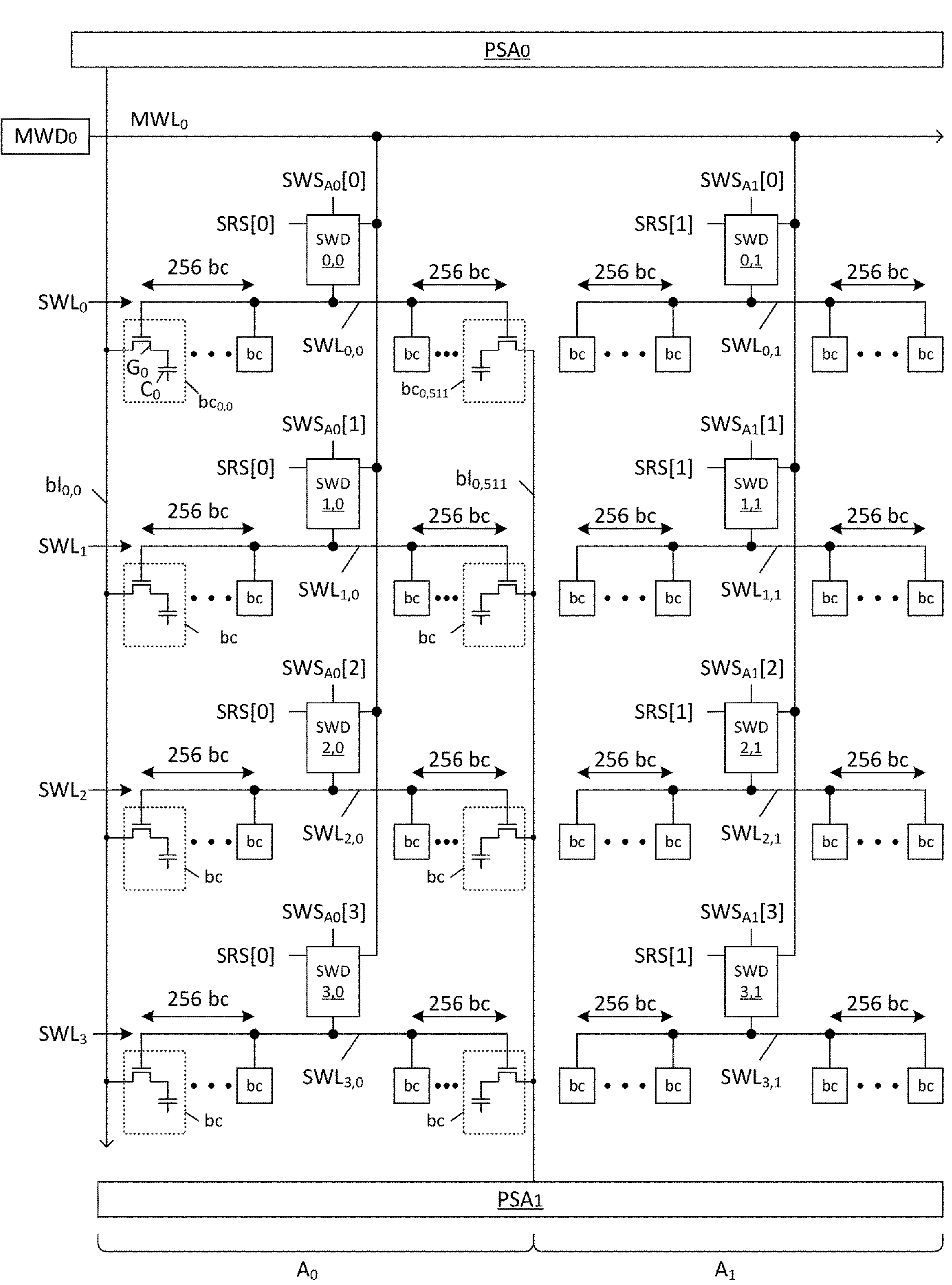
FIG. 9 is a circuit diagram illustrating a portion of a MTDRAM strip, including a main word line driver, a main word line, a plurality of virtual sub-word lines, each having a plurality of sub-word line segments, a plurality of sub-word line drivers, and a plurality of primary sense amplifier circuits in accordance with one embodiment of the present invention.

FIG. 9 is a circuit diagram illustrating the first main word line/signal $MWL_0$ (and first main word line driver $MWD_0$) of MTDRAM strip $S_0$, and the first four virtual sub-word lines $SWL_0$-$SWL_3$ of strip $S_0$, which are driven in response to the main word line signal $MWL_0$. As described above, each of the virtual sub-word lines $SWL_0$-$SWL_3$ includes eight sub-word line segments. The sub-word lines $SWL_0$-$SWL_3$ are referred to as 'virtual' sub-word lines, because the eight sub-word line segments that form each of these sub-word lines $SWL_0$-$SWL_3$ are not continuous (although each of the sub-word lines $SWL_0$-$SWL_3$ services a corresponding row of DRAM bit cells within the strip $S_0$). The first two sub-word line segments of each of the virtual sub-word lines $SWL_0$-$SWL_3$ are illustrated in FIG. 9. More specifically, sub-word line segments $SWL_{0,0}$ and $SWL_{0,1}$ of virtual sub-word line $SWL_0$, sub-word line segments $SWL_{1,0}$ and $SWL_{1,1}$ of virtual sub-word line $SWL_1$, sub-word line segments $SWL_{2,0}$ and $SWL_{2,1}$ of virtual sub-word line $SWL_2$, and sub-word line segments $SWL_{3,0}$ and $SWL_{3,1}$ of virtual sub-word line $SWL_3$ are illustrated in FIG. 9. It is understood that the pattern of FIG. 9 is repeated horizontally to include the remaining six sub-word line segments of each of the virtual sub-word lines $SWL_0$-$SWL_3$ (i.e., sub-word line segments $SWL_{0,2}$-$SWL_{0,7}$ of $SWL_0$, sub-word line segments $SWL_{1,2}$-$SWL_{1,7}$ of $SWL_1$, sub-word line segments $SWL_{2,2}$-$SWL_{2,7}$ of $SWL_2$, and sub-word line segments $SWL_{3,2}$-$SWL_{3,7}$ of $SWL_3$). As described above, the first sub-word line segment of each virtual sub-word line (i.e., sub-word line segments $SWL_{0,0}$, $SWL_{1,0}$, $SWL_{2,0}$ and $SWL_{3,0}$) is associated with the first sub-array $A_0$, of strip $S_0$, and the second sub-word line segment of each virtual sub-word line (e.g., sub-word line segments $SWL_{0,1}$, $SWL_{1,1}$, $SWL_{2,1}$ and $SWL_{3,1}$) is associated with the second sub-array $A_1$ of strip $S_0$.

Although FIG. 9 only illustrates one main word line $MWL_0$ and its four corresponding virtual sub-word lines $SWL_0$-$SWL_3$, it is understood that this pattern is repeated vertically to implement the remaining main word lines and virtual sub-word lines of the MTDRAM strip $S_0$ (i.e., main word lines $MWL_1$-$MWL_{127}$ and virtual sub-word lines $SWL_4$-$SWL_{511}$).

As illustrated in FIG. 9, each of the sub-word line segments is connected to a corresponding sub-word line driver. More specifically, sub-word line segments $SWL_{0,0}$, $SWL_{1,0}$, $SWL_{2,0}$ and $SWL_{3,0}$ are connected to sub-word line drivers $SWD_{0,0}$, $SWD_{1,0}$, $SWD_{2,0}$ and $SWD_{3,0}$, respectively. Similarly, sub-word line segments $SWL_{0,1}$, $SWL_{1,1}$, $SWL_{2,1}$ and $SWL_{3,1}$ are connected to sub-word line drivers $SWD_{0,1}$, $SWD_{1,1}$, $SWD_{2,1}$ and $SWD_{3,1}$, respectively. The sub-word drivers are controlled to drive the sub-word line segments in a manner that is described in more detail below.

Each of the sub-word line segments is coupled to 512 corresponding DRAM bit cells, wherein 256 bit cells are located on either side of the corresponding sub-word line driver. The left-most bit cell of each of the sub-word line segments $SWL_{0,0}$, $SWL_{1,0}$, $SWL_{2,0}$ and $SWL_{3,0}$ is illustrated in detail in FIG. 9, wherein these bit cells are coupled to a common bit line $bl_{0,0}$. Similarly, the right-most bit cell in each of the sub-word line segments $SWL_{0,0}$ $SWL_{1,0}$, $SWL_{2,0}$ and $SWL_{3,0}$ is illustrated in detail in FIG. 9, wherein these bit cells are coupled to a common bit line $bl_{0,511}$. Although only two bit lines are illustrated in FIG. 9, it is understood that each column of bit cells in MTDRAM strip $S_0$ is coupled to a corresponding bit line (for a total of 4096 bit lines in strip $S_0$), and each of the bit lines in MTDRAM strip $S_0$ is coupled to a primary sense amplifier circuit. In one embodiment, bit cells in 'even' numbered columns are coupled to 'even' numbered bit lines (e.g., $bl_{0,0}$), wherein these even numbered bit lines are coupled to primary sense amplifier circuit $PSA_0$ at the upper edge (top) of the MTDRAM strip $S_0$. More specifically, each of the 2048 even numbered bit lines of MTDRAM strip $S_0$ is coupled to a corresponding one of 2048 primary single-ended sense amplifiers in primary sense amplifier circuit $PSA_0$.

Similarly, bit cells in 'odd' numbered columns are coupled to odd numbered bit lines (e.g., $bl_{0,511}$), wherein these odd numbered bit lines are coupled to primary sense amplifier circuit $PSA_1$ located at the lower edge (bottom) of the MTDRAM strip $S_0$. More specifically, each of the 2048 odd numbered bit lines of MTDRAM strip $S_0$ is coupled to a corresponding one of 2048 primary single-ended sense amplifiers in primary sense amplifier circuit $PSA_1$.

The non-edge primary sense amplifier circuit $PSA_n$ (wherein n=1 to 7) is shared by adjacent MTDRAM strips $S_{(n-1)}$ and $S_n$. For example, primary sense amplifier circuit $PSA_1$ is shared by adjacent MTDRAM strips $S_0$ and $S_1$, and primary sense amplifier circuit $PSA_4$ is shared by adjacent strips $S_3$ and $S_4$. As described above, during an access to MTDRAM strip $S_0$, the odd numbered bit lines of MTDRAM strip $S_0$ are accessed using the 2048 sense amplifiers of primary sense amplifier circuit $PSA_1$. However, during a different access to MTDRAM strip $S_1$, the odd numbered bit lines of MTDRAM strip $S_1$ are also accessed using the 2048 sense amplifiers of primary sense amplifier circuit $PSA_1$ (and the even numbered bit lines of MTDRAM strip $S_1$ are accessed using the 2048 sense amplifiers of primary sense amplifier circuit $PSA_2$).

This primary sense amplifier sharing configuration enables the efficient layout of the required primary sense amplifier circuits and global input/output lines in MTDRAM bank 11. The configuration and operation of the primary sense amplifier circuitry is described in more detail below.

Each of the primary sense amplifier circuits $PSA_0$-$PSA_8$ of MTDRAM bank 11 is coupled to secondary sense amplifier circuit $SSA_0$, wherein data read from/written to MTDRAM bank 11 is routed between the primary sense amplifier circuits $PSA_0$-$PSA_8$ and the secondary sense amplifier circuit $SSA_0$. Similarly, each of the primary sense amplifier circuits in the adjacent MTDRAM bank 10 is coupled to secondary sense amplifier circuit $SSA_0$. Thus, the MTDRAM banks 10-11 share the secondary sense amplifier circuit $SSA_0$.

MTDRAM banks 12 and 13 of unit cell 502 are configured in the same manner as MTDRAM banks 10 and 11, wherein the primary sense amplifier circuits in MTDRAM banks 12 and 13 are coupled to the secondary sense amplifier circuit $SSA_1$ (i.e., the MTDRAM banks 12-13 share the secondary sense amplifier circuit $SSA_1$). The secondary sense amplifier circuits $SSA_0$ and $SSA_1$ are coupled to the tertiary sense amplifier circuit $TSA_0$. MTDRAM banks 14-17 are configured in the same manner as MTDRAM banks 10-14, wherein the primary sense amplifier circuits in MTDRAM banks 14 and 15 are coupled to the secondary sense amplifier circuit $SSA_2$, the primary sense amplifier circuits in MTDRAM banks 16 and 17 are coupled to the secondary sense amplifier circuit $SSA_3$ and the secondary sense amplifier circuits $SSA_2$ and $SSA_3$ are coupled to the tertiary sense amplifier circuit $TSA_1$. (FIG. 7)

In the illustrated embodiments, the pass gate transistor of each DRAM bit cell (e.g., pass gate transistor $G_0$ of DRAM bit cell $bc_{0,0}$ of FIG. 9) is an n-channel transistor having a gate coupled to a corresponding one of the sub-word line segments. In one embodiment, this n-channel transistor $G_0$ is fabricated to include MST layers/technology described by commonly owned U.S. Pat. Nos. 10,109,342 and 10,107,854, which are hereby incorporated herein in their entireties by reference, wherein this MST technology enables the n-channel pass gate transistor $G_0$ to be effectively overdriven during write/refresh operations. To perform an access to a particular sub-word line segment, the sub-word line driver of the sub-word line segment is activated, thereby driving a high read/write control voltage onto the corresponding sub-word line segment (i.e., to the pass gate transistors of the bit cells coupled to the sub-word line segment). As described in more detail below, the sub-word line driver is activated in response to: main word line address signals identifying a main word line (MWL) to be accessed within a bank, sub-word line segment address signals identifying a sub-word line segment to be accessed, and a sub-word line segment reset signal. For example, the first sub-word line segment $SWL_{0,0}$ of bank 11 is accessed in response to bank address signals that specify bank 11, main word line address signals that specify main word line $MWL_0$, sub-word line segment address signals that specify sub-word line segment $SWL_{0,0}$ and a sub-word line segment reset signal associated with sub-array $A_0$, in a manner described in more detail below. In general, the sub-word line driver $SWD_{0,0}$ drives the corresponding sub-word line segment $SWL_{0,0}$ from a low voltage (e.g., −200 mV) to a high voltage (e.g., 1.8V or higher), such that the 512 bit cells coupled to the sub-word line segment $SWL_{0,0}$ are read/written via the primary sense amplifier circuits $PSA_0$ and $PSA_1$ and the corresponding bit lines. Y-decoder circuit performs 8-to-1 multiplexing/de-multiplexing between the primary sense amplifier circuits and the secondary sense amplifier circuits, wherein the 512 bit input/output data from the sub-word line segment is multiplexed to 64 corresponding global bit lines.

The ability to individually access individual sub-word line segments results in significant power savings within the memory bank. For example, a data value can be read from sub-word line segment $SWL_{0,0}$, without requiring the activation of the other seven sub-word line segments ($SWL_{0,1}$, $SWL_{0,2}$, $SWL_{0,3}$, $SWL_{0,4}$, $SWL_{0,5}$, $SWL_{0,6}$, and $SWL_{0,7}$) of the corresponding virtual sub-word line $SWL_0$. Power savings are also realized due to the use of relatively short bit lines (i.e., the bit line length corresponds with only 512 rows of bit cells) and the use of relatively small unit cells, which enables data to be transmitted between the unit cell and the corresponding TSVs on relatively short I/O lines.

The addressing of MTDRAM chips 101-104 will now be described in more detail. Each unit cell on MTDRAM chip 101 is independently addressed using a corresponding set of TSVs (e.g., MTDRAM unit cell 502 is addressed through the corresponding set of TSVs $\mathbf{502}_{TSV}$ of FIG. 7). Address and control signals (i.e., instructions) are transmitted from processor 400 on ASIC controller 110 to MTDRAM unit cell 502 on MTDRAM chip 101 (and corresponding MTDRAM unit cells on MTDRAM chips 102, 103 and 104) through TSVs $\mathbf{502}_{TSV}$. In the described embodiments, these address and control signals are transmitted to MTDRAM chips 101-104 in a pre-decoded state, thereby reducing/eliminating the need for decoder circuitry on the MTDRAM chips 101-104. The use of pre-decoded signals also advantageously reduces the number of activated signals that must be transmitted from the processor 400 to the MTDRAM chips 101-104 (on TSV structures having relatively high capacitances), thereby saving power. In an alternate embodiment, these address and control signals are transmitted in an undecoded state, wherein these signals are decoded locally on MTDRAM chips 101-104. In other embodiments, a combination of predecoded and undecoded signals can be transmitted from the ASIC controller 110 to the MTDRAM chips 101-104.

The use of TSV set $\mathbf{502}_{TSV}$ to access MTDRAM unit cell 502 will now be described in accordance with a specific example. This example assumes that processor 400 transmits information in a pre-decoded manner to MTDRAM chip 101. It is understood that all of the MTDRAM unit cells of system 100 can be simultaneously accessed in parallel in a similar manner, but to completely independent address locations in each unit cell. A subset of TSVs in the TSV set $\mathbf{502}_{TSV}$ is used to transmit read/write (R/W) access instructions from processor 400 to MTDRAM unit cell 502.

Figure 10:
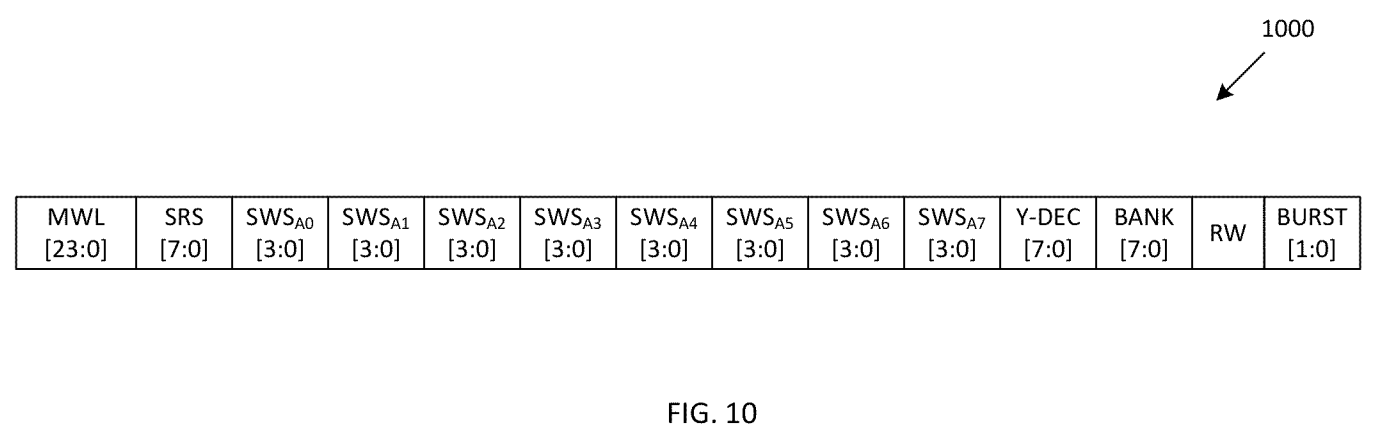

FIG. 10 is a diagram illustrating a R/W access instruction 1000 for accessing MTDRAM unit cell 502 in accordance with one embodiment. In this embodiment, the TSV set $\mathbf{502}_{TSV}$ includes 64 TSVs that transmit a 64 bit input/output (I/O) value between unit cell 502 and processor 400.

Access instruction 1000 includes a 2-bit burst length value BURST[1:0], which indicates a burst length of the access. More specifically, BURST[1:0] values of '00', '01', '10' and '11' specify burst lengths of 1, 2, 4 and 8 data values, respectively. Access instruction 1000 also includes a 1-bit read/write value (RW), which indicates whether the access is a read or write operation.

Access instruction 1000 also includes an 8-bit bank address value BANK[7:0], wherein each bit of the BANK [7:0] address value is used to individually select/deselect a corresponding one of the eight MTDRAM banks 10-17 of the unit cell 502. For example, a bank address value BANK [7:0] of '0000 0001' specifies that bank 10 is selected for the access, while banks 11-17 are not selected for the access. Similarly, a bank address value BANK[7:0] of '0000 0010' specifies that bank 11 is selected for the access, while banks 10 and 12-17 are not selected for the access.

Access instruction 1000 also includes a 24-bit decoded main word line address value MWL[23:0], which is used to select one of the 1024 main word lines (MWLs) in the bank selected for the access. In one embodiment, the main word line is selected using 1024 4-input NAND gates (wherein a first input of each NAND gate is coupled to receive one of the eight MWL bits MWL[23:16], each of which identifies one of the eight strips ($S_0$-$S_7$), a second input of each NAND gate is couple to receive one of the eight MWL bits MWL [15:8], a third input of each NAND gate is coupled to receive one of four MWL bits MWL[7:4], and a fourth input of each NAND gate is coupled to receive one of four MWL bits MWL[3:0], wherein only one of the MWL[23:16] bits, one of the MWL[15:8] bits, one of the MWL[7:4] bits and one of the MWL bits MWL[3:0] is activated for an access, in a manner known to one skilled in the art). Other decoding schemes can be used to select the main word line to be accessed in other embodiments. Note that only 10-bits are required to select one of 1024 MWLs if decoding is performed within unit cell 502.

Access instruction 1000 also includes a 4-bit predecoded sub-word line segment address value for each of the eight sub-arrays of the selected bank. More specifically, access instruction includes 4-bit decoded sub-word line segment address values $SWS_{A0}$[3:0], $SWS_{A1}$[3:0], $SWS_{A2}$[3:0], $SWS_{A3}$[3:0], $SWS_{A4}$[3:0], $SWS_{A5}$[3:0], $SWS_{A6}$[3:0] and $SWS_{A7}$ [3:0], which address sub-word line segments in sub-arrays $A_0$, $A_1$, $A_2$, $A_3$, $A_4$, $A_5$, $A_6$ and $A_7$, respectively. More specifically, each of the 4-bit decoded sub-word line segment address values is used to select one of the four sub-word line segments associated with the selected main word line in the corresponding sub-array. Only one of these four sub-word line segment address bits is activated for each access. For example, if the MWL address value MWL[23:0]selects main word line $MWL_0$ (FIG. 9), a sub-word line segment address value $SWS_{A0}$[3:0] having a value of '0001' would select the corresponding sub-word line segment $SWL_{0,0}$ of sub-array $A_0$. Similarly, a sub-word line segment address value $SWS_{A1}$[3:0] having a value of '0100' would select the corresponding sub-word line segment $SWL_{2,1}$ of sub-array $A_1$ (FIG. 9). Note that the sub-word line segment address is indexed to the selected main word line (i.e., $SWS_{A0}$[0], $SWS_{A0}$[1], $SWS_{A0}$[2] and $SWS_{A0}$[3] select the first, second, third and fourth sub-word line segments, respectively, associated with the selected main word line in sub-array $A_0$).

Thus, as illustrated by FIG. 9, the sub-word line segment address bits $SWS_{A0}$[0], $SWS_{A0}$[1], $SWS_{A0}$[2] and $SWS_{A0}$[3] are provided to corresponding sub-word line driver circuits $SWD_{0,0}$, $SWD_{1,0}$, $SWD_{2,0}$ and $SWD_{3,0}$, respectively, and the sub-word line segment address bits $SWS_{A1}$[0], $SWS_{A1}$[1], $SWS_{A1}$[2] and $SWS_{A1}$ [3] are provided to corresponding sub-word line driver circuits $SWD_{0,1}$, $SWD_{1,1}$, $SWD_{2,1}$ and $SWD_{3,1}$, respectively. This pattern is repeated for the remaining sub-word line driver circuits of unit cell 502.

Access instruction 1000 also includes an 8-bit decoded sub-word line segment reset value SRS[7:0], which is used to reset the sub-word line driver circuits in sub-arrays $A_0$-$A_7$, respectively. More specifically, the sub-word line segment reset bits SRS[0], SRS[1], SRS[2], SRS[3], SRS[4], SRS[5], SRS[6] and SRS[7] are used to reset sub-word line driver circuits in sub-arrays $A_0$, $A_1$, $A_2$, $A_3$, $A_4$, $A_5$, $A_6$ and $A_7$, respectively. Thus, as illustrated by FIG. 9, the sub-word line segment reset bit SRS[0] is provided to the sub-word line driver circuits $SWD_{0,0}$, $SWD_{1,0}$, $SWD_{2,0}$ and $SWD_{3,0}$ of sub-array $A_0$, and the sub-word line segment reset bit SRS[1] is provided to the sub-word line driver circuits $SWD_{0,1}$, $SWD_{1,1}$, $SWD_{2,1}$ and $SWD_{3,1}$ of sub-array $A_1$. This pattern is repeated for the remaining sub-word line driver circuits of unit cell 502.

Access instruction 1000 also includes an 8-bit decoded Y-address value Y-DEC[7:0] which specifies the 8-to-1 decoding used to couple the 512 primary sense amplifiers of each accessed sub-word line segment to 64 secondary sense amplifiers in the corresponding secondary sense amplifier circuit.

The above-described addressing scheme allows the unit cell to be accessed in a flexible manner. A couple of possible access patterns will now be described.

Figures 11, 12:
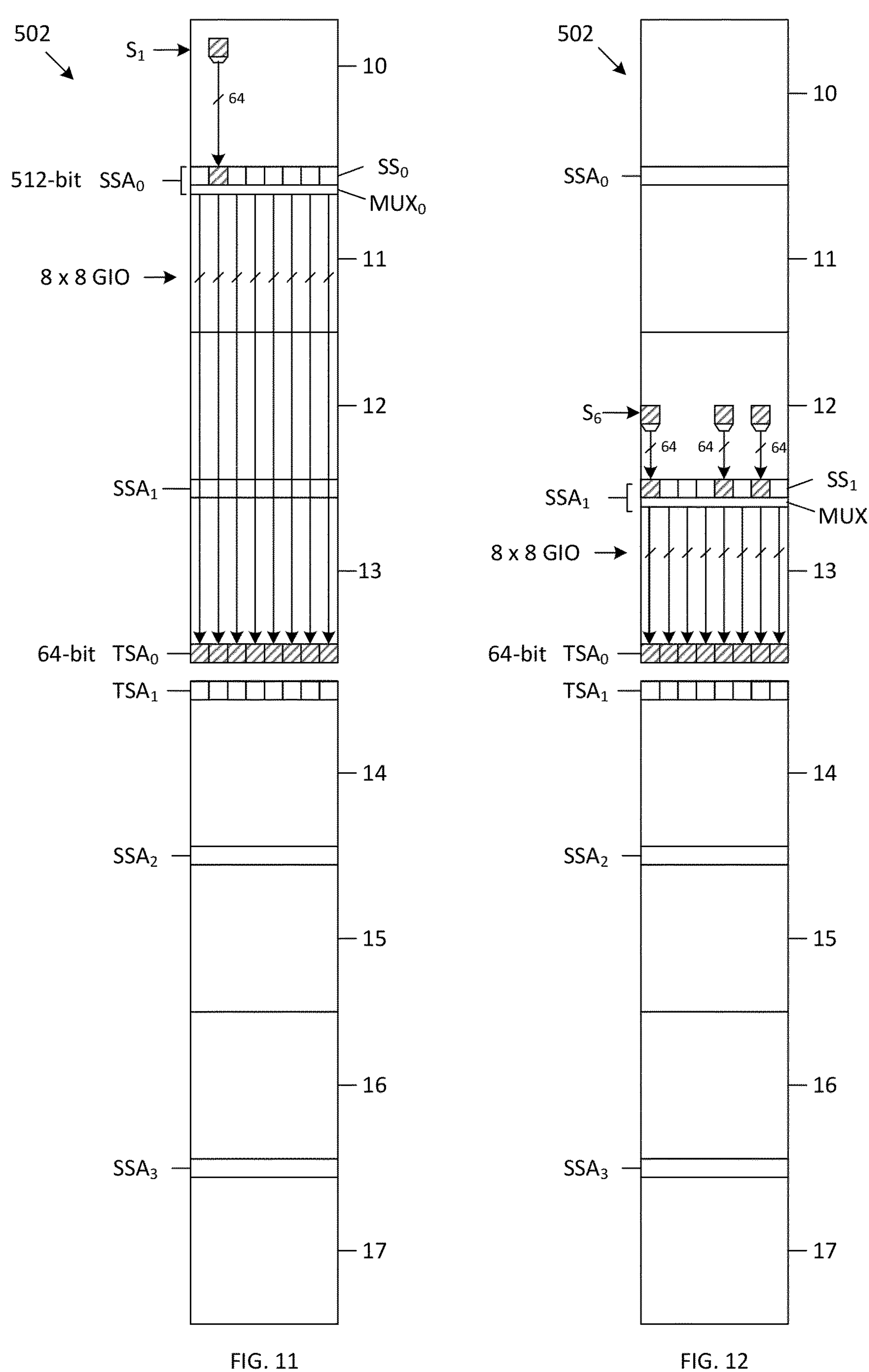
FIG. 11 is a block diagram illustrating a first access pattern implemented within a MTDRAM unit cell in accordance with the read/write access instruction of FIG. 10.
FIG. 12 is a block diagram illustrating a second access pattern implemented within a MTDRAM unit cell in accordance with the read/write access instruction of FIG. 10.

FIG. 11 is a block diagram illustrating an exemplary read access using the addressing scheme of FIG. 10. With reference to FIG. 9, this access reads data from sub-word line segment $SWL_{1,1}$ within sub-array $A_1$ of strip $S_1$ of the memory bank 10 (BANK[7:0]='0000 0001' specifies bank 10, RW='1' specifies a read operation, MWL[23:0] specifies main word line $MWL_0$ within strip $S_1$ of bank 10, BURST [1:0]='00' specifies no burst operation, and $SWS_{A1}$[3:0]='0010' specifies the sub-word line segment $SWL_{1,1}$, within sub-array $A_1$ of bank 10). This access reads data from the addressed sub-word line segment $SWL_{1,1}$ within strip $S_1$, sub-array $A_1$ of memory bank 10. The selected sub-word line segment $SWL_{1,1}$ provides 512 read data bits to the corresponding primary sense amplifier circuits $PSA_0$ and $PSA_1$ within memory bank 10. The Y-address value (Y-DEC[7:0]) selects one 64-bit word from this set of 512 read data bits. This 64-bit word is transferred from the primary sense amplifier circuits $PSA_0$ and $PSA_1$ to the corresponding secondary sense amplifier circuit $SSA_0$, as illustrated. In the illustrated embodiment, the secondary sense amplifier circuit $SSA_0$ includes 512 secondary sense amplifiers $SS_0$ (i.e., 64-bits for each of the eight sub-word line segments in the corresponding memory banks 10-11) and an 8-to-1 multiplexer circuit $MUX_0$. The 64-bit word stored in the secondary sense amplifiers $SS_0$ is routed through the 8-to-1 multiplexer circuit $MUX_0$ to the tertiary sense amplifier circuit $TSA_0$ (in response to the activated bit of the sub-word line segment address $SWS_{A1}$[3:0]), as illustrated. The tertiary sense amplifier circuit $TSA_0$, in turn, transmits this 64-bit word to the ASIC controller 110 using 64 TSV structures of TSV set $\mathbf{502}_{TSV}$. Note that the tertiary sense amplifier circuit $TSA_0$ has a width of 64 bits in this embodiment, wherein data is routed from the multiplexer circuit $MUX_0$ to the tertiary sense amplifier circuit $TSA_0$ on 64 global input/output (GIO) lines. Note that the secondary sense amplifier circuit $SSA_1$ has the same configuration as the secondary sense amplifier circuit $SSA_0$, wherein both $SSA_0$ and $SSA_1$ share the same set of 64 GIO lines.

Further note that the secondary sense amplifier circuits $SSA_2$ and $SSA_3$ and the tertiary sense amplifier circuit $TSA_1$ have the same configuration as the secondary sense amplifier circuits $SSA_0$ and $SSA_1$ and the tertiary sense amplifier circuit $TSA_0$, respectively. Secondary sense amplifier circuits $SSA_2$ and $SSA_3$ share a second set of 64 GIO lines, which are used to route data to/from the tertiary sense amplifier circuit $TSA_1$. In one embodiment, the tertiary sense amplifier circuits $TSA_0$ and $TSA_1$ share the same 64 TSV structures of the TSV set $\mathbf{502}_{TSV}$. In another embodiment (which is described in more detail below), the tertiary sense amplifier circuits $TSA_0$ and $TSA_1$ share a pair of 64 TSV structures of the TSV set $\mathbf{502}_{TSV}$.

FIG. 12 is a block diagram illustrating a pre-specified series of six read accesses (RW=1) to memory bank 12 (BANK[7:0]='0000 0100') of unit cell 502. More specifically, consecutive read accesses are performed to three different sub-word line segments SWS[0], SWS[4] and SWS[6] of memory bank 12 (SWS[7:0]='0101 0001') of the addressed main word line and virtual sub-word line (as specified by MWL[23:0]/SWL[3:0]), wherein each of the three different sub-word line segments is accessed with a burst length of 2 (BURST[1:0]='01').

This access reads data from sub-word line segments $SWL_{0,0}$, $SWL_{0,4}$ and $SWL_{0,6}$ within sub-arrays $A_0$, $A_4$ and $A_6$ of strip $S_6$ of the memory bank 12 (BANK[7:0]='0000 0100' specifies bank 12, RW='1' specifies a read operation, MWL[23:0] specifies main word line $MWL_0$ within strip $S_6$ of bank 12, BURST[1:0]='01' specifies a burst length of 2, $SWS_{A0}$[3:0]='0001' specifies the sub-word line segment $SWL_{0,0}$ within sub-array $A_0$ of bank 12, $SWS_{A4}$[3:0]='0001' specifies the sub-word line segment $SWL_{0,4}$, within sub-array $A_4$ of bank 12 and $SWS_{A6}$[3:0]='0001' specifies the sub-word line segment $SWL_{0,6}$, within sub-array $A_6$ of bank 12).

In the illustrated example, the addressed main word line and sub-word line segments are found in strip $S_6$ of memory bank 12. Each of the three selected sub-word line segments $SWL_{0,0}$, $SWL_{0,4}$ and $SWL_{0,6}$ provides 512 read data bits to the corresponding primary sense amplifier circuits within memory bank 12. The Y-address value (e.g., Y-DEC[7:0]='0000 0001') initially selects one 64-bit word from each of the sub-word line segments $SWL_{0,0}$, $SWL_{0,4}$ and $SWL_{0,6}$. These three 64-bit words are transferred from the primary sense amplifier circuits to the corresponding secondary sense amplifier circuit $SSA_1$, as illustrated. The secondary sense amplifier circuit $SSA_1$ includes 512 secondary sense amplifiers $SS_1$ (i.e., 64-bits for each of the eight sub-word line segments in the corresponding memory banks 12-13) and an 8-to-1 multiplexer circuit $MUX_1$.

Multiplexer circuit $MUX_1$ is controlled to route the 64-bit word provided by the sub-word line segment $SWL_{0,0}$ to the tertiary sense amplifier $TSA_0$. The Y-address value is then incremented (e.g., Y-DEC[7:0]='0000 0010'), such that the second 64-bit word of the burst operation is transferred from the sub-word line segment $SWL_{0,0}$ to the secondary sense amplifiers $SS_1$. Multiplexer circuit $MUX_1$ routes this second 64-bit word of the burst operation from the secondary sense amplifiers $SS_1$ to the tertiary sense amplifier $TSA_0$.

The Y-address value is then reset (e.g., Y-DEC[7:0]='0000 0001'), and a corresponding 64-bit word is routed from the sub-word line segment $SWL_{0,4}$ to the secondary sense amplifiers $SS_1$. Multiplexer circuit $MUX_1$ is controlled to route this 64-bit word provided by the sub-word line segment $SWL_{0,4}$ to the tertiary sense amplifier $TSA_0$, as the third 64-bit word of the burst operation. The Y-address value is then incremented (e.g., Y-DEC[7:0]='0000 0010'), such that the fourth 64-bit word of the burst operation is transferred from the sub-word line segment $SWL_{0,4}$ to the secondary sense amplifiers $SS_1$. Multiplexer circuit $MUX_1$ routes this fourth 64-bit word of the burst operation from the secondary sense amplifiers $SS_1$ to the tertiary sense amplifier $TSA_0$.

The Y-address value is again reset (e.g., Y-DEC[7:0]='0000 0001'), and a corresponding 64-bit word is routed from the sub-word line segment $SWL_{0,6}$ to the secondary sense amplifiers $SS_1$. Multiplexer circuit $MUX_1$ is controlled to route this 64-bit word provided by the sub-word line segment $SWL_{0,6}$ to the tertiary sense amplifier $TSA_0$, as the fifth 64-bit word of the burst operation. The Y-address value is then incremented (e.g., Y-DEC[7:0]='0000 0010'), such that the sixth 64-bit word of the burst operation is transferred from the sub-word line segment $SWL_{0,6}$ to the secondary sense amplifiers $SS_1$. Multiplexer circuit $MUX_1$ routes this sixth 64-bit word of the burst operation from the secondary sense amplifiers $SS_1$ to the tertiary sense amplifier $TSA_0$.

Although specific examples are illustrated by FIGS. 11 and 12, it is understood from these examples that many different access patterns are enabled by the present embodiment.

In accordance with one embodiment, the cycle time of the primary sense amplifier circuit is 32 ns, and the cycle time of accesses to the unit cell is 4 ns. Thus, once a strip has been accessed within a memory bank, that strip is not available for another access for 32 ns. Because each strip shares primary sense amplifiers with its adjacent strips (above and below, if present), these adjacent strips are also not available for another access for 32 ns. For example, in the example of FIG. 11, the read access to strip $S_1$ of memory bank 10 renders accesses to strip $S_1$ and adjacent strips $S_0$ and $S_2$ of memory bank 10 unavailable for 32 ns. These periods of strip unavailability prevent fully random access to all addresses of the unit cell 502. However, each new access address for a 64-bit data value can specify anywhere in unit cell 502 other than the strips and adjacent strip(s) accessed during the preceding 32 ns period. Because the unit cell 502 has a total of 64 strips (8 strips in each of eight memory banks 10-17), and the access to a strip can eliminate access to up to two adjacent strips, the next access address can be located in 61 of the 64 strips, which corresponds with a 95% random address availability, which is referred to herein as 'nearly random'. Accessing unit cell 502 in a nearly random manner, with data being transferred on the TSVs at a rate of 2 GHz results in a nearly random address bandwidth of 2e9/sec. The nearly random address bandwidth of all 256 unit cells on MTDRAM chip 101 becomes 2.048e12/sec. The fully random address access rate to any strip of unit cell 502 is 32 ns or 31.25 MHz, such that the fully random address bandwidth of the 256 unit cells on MTDRAM chip 101 is 8e9/see, and the fully random address bandwidth of the 1024 unit cells on MTDRAM chips 101-104 is 3.2e10/sec. All of these embodiments provide a significant improvement over conventional DDR5 random access bandwidth of about 1e7/sec.

In view of the description provided above, different addressing schemes can be implemented to meet the particular requirements of the memory system 100, in view of limitations introduced by the available number of TSVs.

Figure 13:
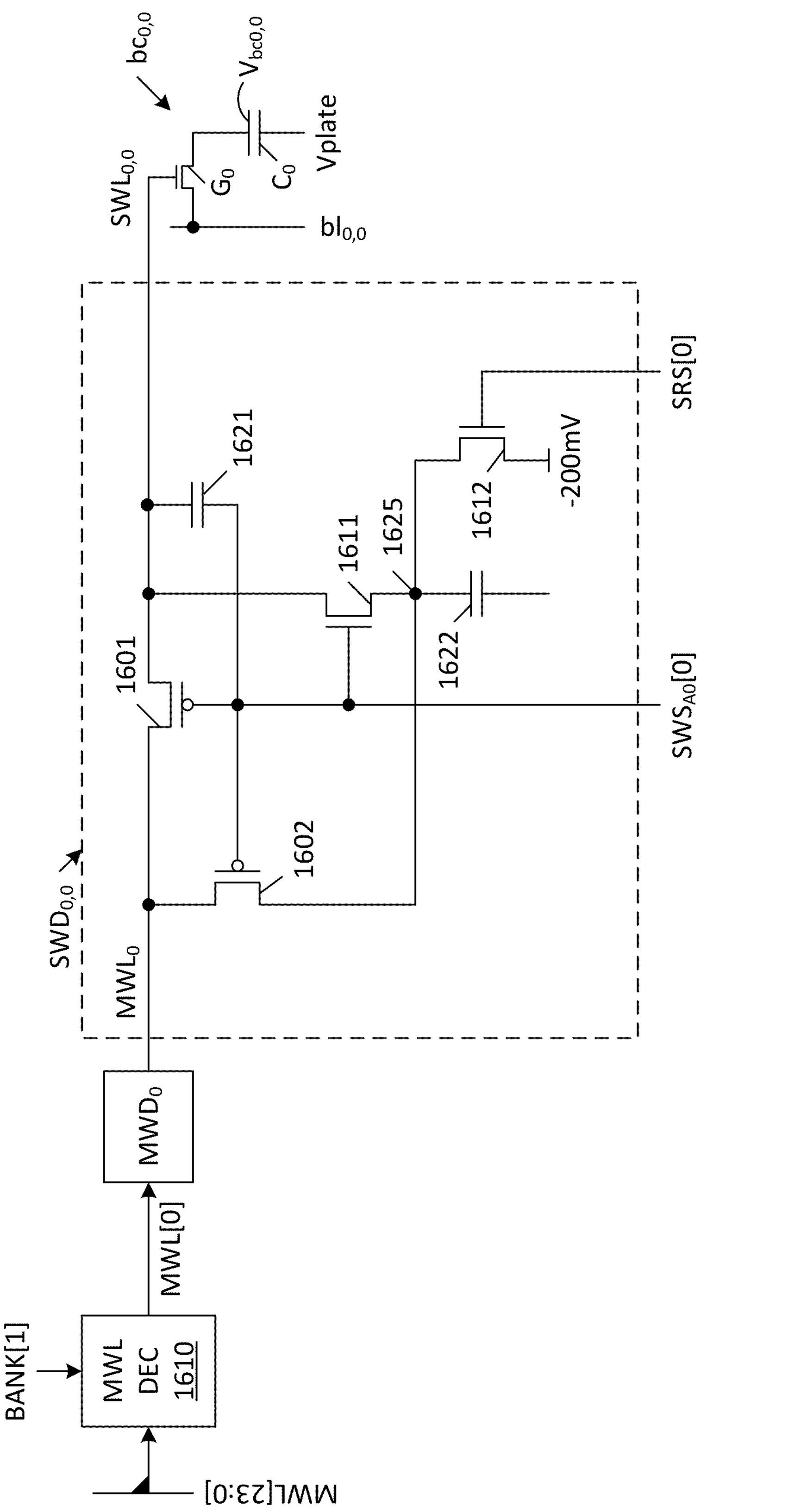
FIG. 13 is a circuit diagram illustrating a sub-word line driver of the MTDRAM strip of FIG. 9 in accordance with one embodiment of the present invention.

The sub-word line driver circuitry will now be described in more detail. FIG. 13 is a circuit diagram illustrating the sub-word line driver $SWD_{0,0}$ of FIG. 9 in accordance with one embodiment. It is understood that all sub-word line drivers on MTDRAM chip 101 are identical to sub-word line driver $SWD_{0,0}$. Sub-word line driver $SWD_{0,0}$ includes PMOS transistors 1601-1602, NMOS transistors 1611-1612 and capacitor 1621, which are connected as illustrated. Capacitor 1622 represents the parasitic capacitance on node 1625.

Main word line decoder circuit 1610 decodes selected signals of the main word line address MWL[23:0] (and the bank address signal BANK[1]) to determine whether a current access addresses the main word line $MWL_0$ of bank 11. If the main word line address MWL[23:0] AND BANK address signal BANK[1] specifies the main word line $MWL_0$ of bank 11, the main word line decoder circuit 1610 activates the corresponding main word line activation signal MWL[0].

As described in more detail below, during an access to the sub-word line segment $SWL_{0,0}$, the sub word line driver $SWD_{0,0}$ is activated to drive the sub-word line segment $SWL_{0,0}$ to a high voltage (1.8-2.0V) in response to the MWL[0] signal, the sub-word line segment address signal $SWS_{A0}$[0] and the sub-word line segment reset signal SRS [0].

Figure 14:
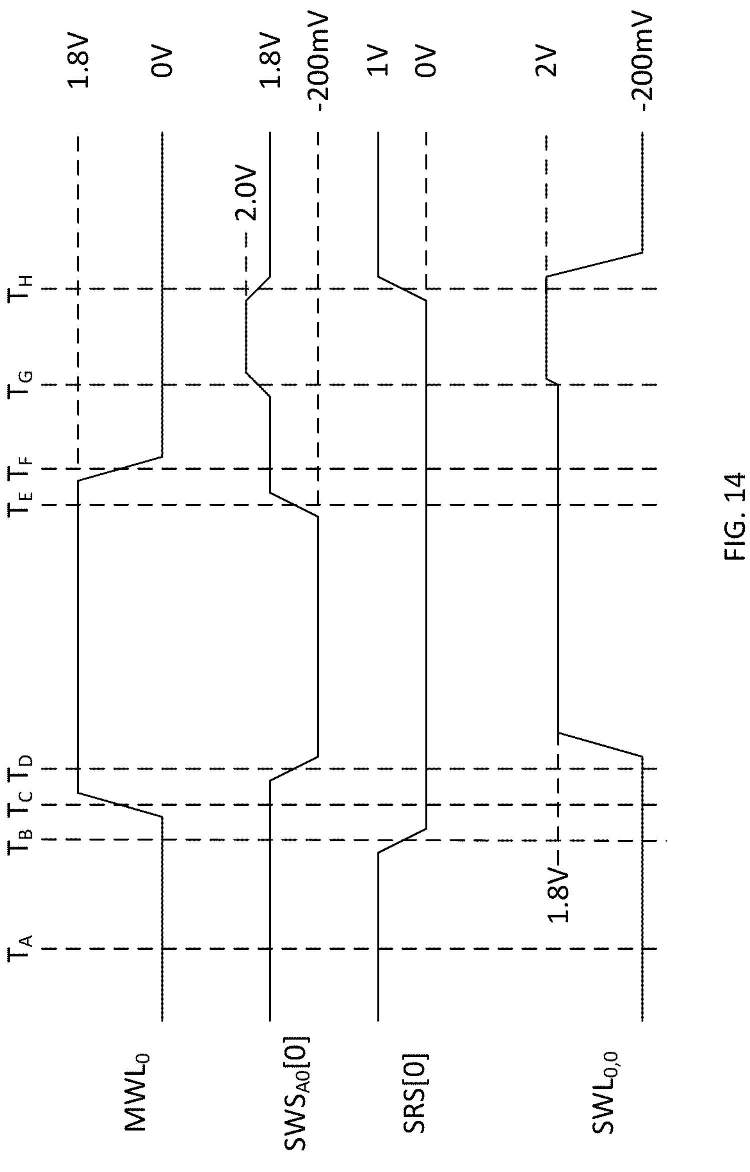
FIG. 14 is a waveform diagram illustrating the operation of the sub-word line driver of FIG. 13 in accordance with one embodiment of the present invention.

FIG. 14 is a waveform diagram illustrating the operation of sub-word line driver $SWD_{0,0}$ in accordance with one embodiment. At time $T_A$, the MWL[0] signal is deactivated low (0V), the sub-word line segment address signal $SWS_{A0}$ [0] is held at a logic high voltage of 1.8V, and the sub-word line segment reset signal SRS[0] is held at a logic high voltage of 1V. Under these conditions, the main word line driver $MWD_0$ provides a voltage of GND (0V) on main word line $MWL_0$. The logic high $SWS_{A0}$[0] and SRS[0] signals turn on NMOS transistors 1611 and 1612, respectively, thereby pulling down the voltage on the sub-word line segment $SWL_{0,0}$ to −200 mV. Note that this negative voltage applied to the sub-word line segment $SWL_{0,0}$ reduces charge leakage from the DRAM bit cells coupled to this sub-word line segment $SWL_{0,0}$.

At time $T_B$, the sub-word line segment reset signal SRS[0] is deactivated to a logic low state (GND), thereby turning off NMOS transistor 1612, such that the sub-word line segment $SWL_{0,0}$ is no longer actively pulled down to −200 mV.

At time $T_C$, the main word line driver $MWD_0$ drives the voltage on main word line $MWL_0$ to a high voltage of 1.8V (in response to the MWL[0] signal being activated).

At time $T_D$, the sub-word line segment address signal $SWS_{A0}$[0] is driven to a logic low state (−200 mV), thereby turning off NMOS transistor 1611 and turning on PMOS transistors 1601-1602. Turned on PMOS transistor 1601 couples the main word line $MWL_0$ to the sub-word line segment $SWL_{0,0}$, such that the voltage on the sub-word line segment $SWL_{0,0}$ is driven toward 1.8V. Under these conditions, a voltage of 1.8V exists across capacitor 1621, whereby this capacitor 1621 is charged. Turned on PMOS transistor 1602 couples the main word line $MWL_0$ to parasitic capacitor 1622, such that node 1625 is driven toward 1.8V. Under these conditions, the parasitic capacitor 1622 is charged.

At time $T_E$, after the capacitors 1621 and 1622 have been fully charged and the sub-word line segment $SWL_{0,0}$ is fully pulled up to 1.8V, the sub-word line segment address signal $SWS_{A0}[0]$ is pulled up from −200 mV to 1.8V, thereby turning on NMOS transistor 1611 and turning off PMOS transistors 1601-1602. At time $T_F$, the main word line driver $MWD_0$ drives the voltage on the main word line $MWL_0$ to GND (0V). Under these conditions, the voltage on the sub-word line segment $SWL_{0,0}$ remains at 1.8V.

At time $T_G$, the sub-word line segment address signal $SWS_{A0}[0]$ is driven slightly higher, to a boosted voltage of about 2.0V. Under these conditions, the voltage on sub-word line segment $SWL_{0,0}$ is boosted higher by capacitor 1621, to a boosted voltage of about 2.0V. This boosted voltage on sub-word line segment $SWL_{0,0}$ overdrives the pass gate transistors of the DRAM bit cells coupled to the sub-word line segment $SWL_{0,0}$ (e.g., the pass gate transistors of bit cells $bc_{0,0}$-$bc_{0,511}$, including pass gate transistor $G_0$), thereby ensuring that a maximum bit cell voltage ($Vbc_{0,0}$=1.4V) is written to the bit cells (e.g., bit cell $bc_{0,0}$) in response to a high voltage (1.4V) on the corresponding bit line (e.g., bit line $bl_{0,0}$). Note that the sub-word line segment address signal $SWS_{A0}[0]$ is not boosted in the above-described manner if the pass gate transistors of the DRAM bit cells are not fabricated in accordance with MST technology. In this case, the maximum bit cell voltage only reaches 1.8V minus the threshold voltage of the pass gate transistor $G_0$ (i.e., 1.8V−0.6V=1.2V), rather than 2.0V minus the threshold voltage of the pass gate transistor G0 (i.e., 2.0V−0.6V=1.4V). This lower maximum bit cell voltage in the bit cell reduces the required refresh interval. Consequently, using a pass gate transistor $G_0$ that implements MST technology allows lower standby IDD6 power due to an extended refresh interval.

At time $T_H$, the sub-word line segment reset signal SRS[0] is driven to a logic high state (1V) and the sub-word line segment address signal $SWS_{A0}[0]$ is driven to a voltage of 1.8V. Under these conditions, the sub-word line segment $SWL_{0,0}$ is pulled down to −200 mV through turned on NMOS transistors 1611 and 1612 to prepare for a subsequent access.

In accordance with one embodiment, the sub-word line segment address signal $SWS_{A0}[0]$ and the sub-word line segment reset signal SRS[0] are generated by the processor 400 on the ASIC controller 110, and are transmitted to the sub-word line driver $SWD_{0,0}$ on two corresponding TSV structures. This advantageously eliminates the requirement for decoding circuitry within the sub-word line driver $SWD_{0,0}$ on MTDRAM chip 101.

Figure 15A:
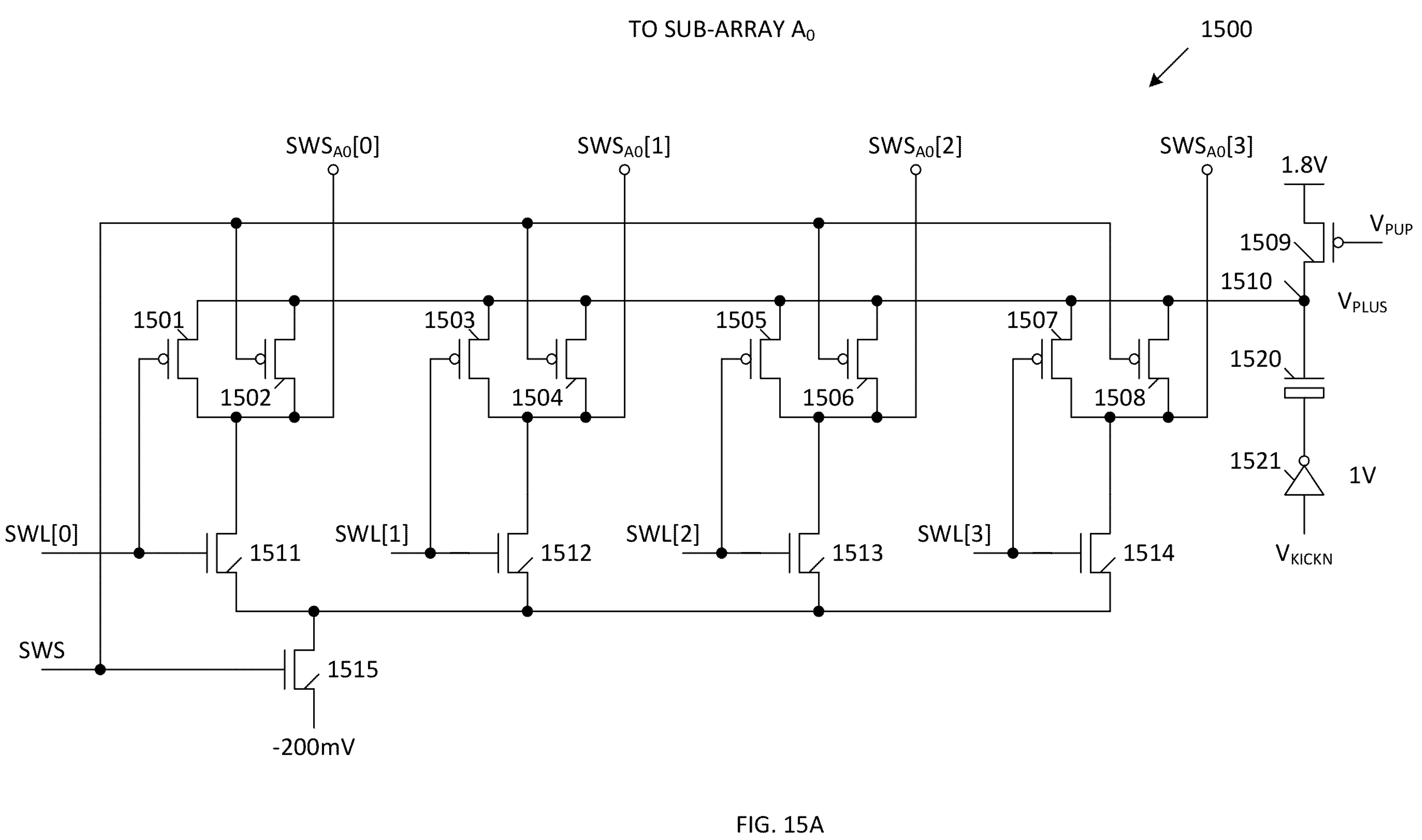
FIG. 15A is a circuit diagram illustrating a circuit implemented by an ASIC controller to generate pre-decoded sub-word line segment address signals to access a sub-array of an MTDRAM unit cell in accordance with one embodiment of the present invention.
Figure 16:
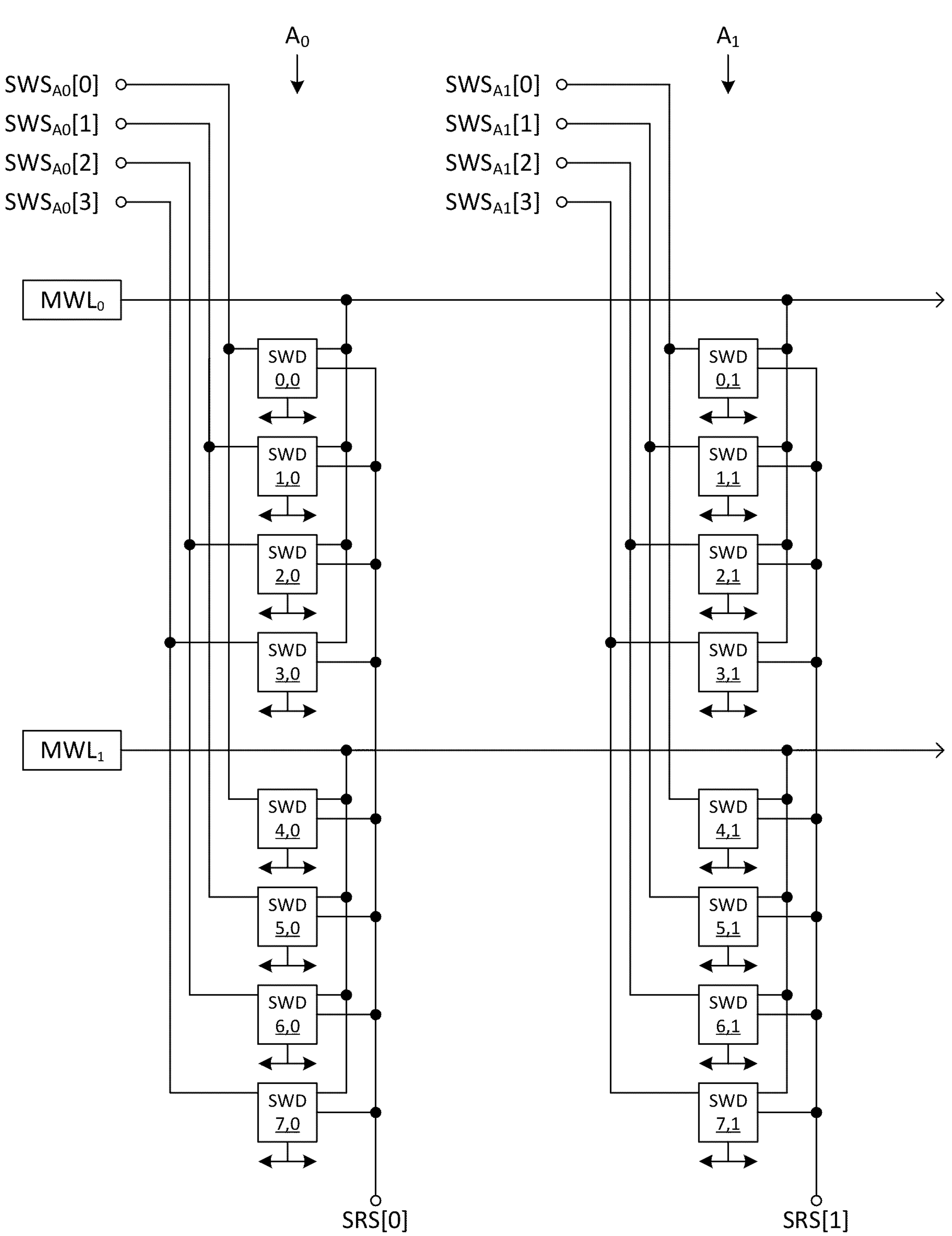
FIG. 16 is a block diagram illustrating the manner in which the sub-word line segment access signals generated by the circuit of FIG. 15A are used to control the sub-word line driver circuits of a portion a sub-array of the MTDRAM unit cell in accordance with one embodiment of the present invention.

FIG. 15A is a circuit diagram illustrating circuit 1500 for generating the sub-word line segment address signal $SWS_{A0}[0]$ (as well as the sub-word line segment address signals $SWS_{A0}[1]$, $SWS_{A0}[2]$ and $SWS_{A0}[3]$, which are provided to sub-array $A_0$ as illustrated by FIGS. 9 and 16) within the processor 400 of ASIC controller 110. Because the sub-word line segment reset signal SRS[0] is a simple signal that switches between 0V and 1V at times $T_B$ and $T_H$ as illustrated by FIG. 14, there is no need to show the generation of this signal within processor 400. Circuit 1500 includes p-channel transistors 1501-1509, n-channel transistors 1511-1515 capacitor 1520 and inverter 1521, which are connected as illustrated.

Figure 15B:
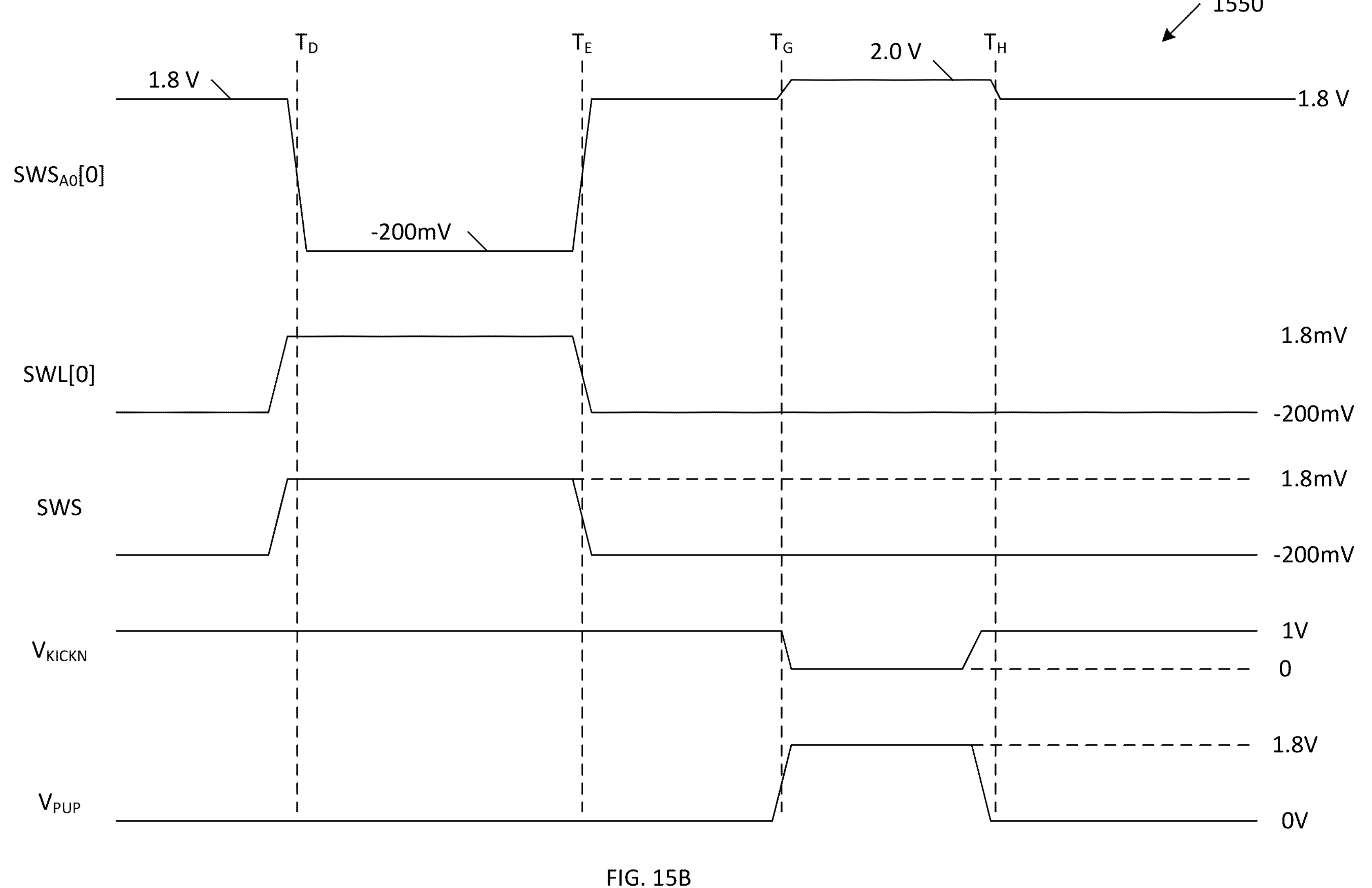
FIG. 15B is a waveform diagram illustrating the generation of the sub-word line segment address signals by the circuit of FIG. 15A in accordance with one embodiment of the present invention.

FIG. 15B is a waveform diagram 1550 illustrating the generation of the sub-word line segment address signal $SWS_{A0}[0]$, using circuit 1500. It is understood that $SWS_{A0}[1]$, $SWS_{A0}[2]$ and $SWS_{A0}[3]$ are generated in a similar manner.

Prior to time $T_D$, (see, FIG. 14) the $V_{PUP}$ signal is low (0V), thereby turning on p-channel transistor 1509, such that the voltage $V_{PLUS}$ on node 1510 is 1.8V. The $V_{KICKN}$ signal is high (1V), such that the output of inverter 1521 is 0V. Under these conditions, capacitor 1520 charges to 1.8V. The sub-word line control signals SWL[0], SWL[1], SWL[2], SWL[3] signals are initially low (0V), thereby turning off n-channel transistors 1511-1514, and turning on p-channel transistors 1501, 1503, 1505 and 1507. The SWS signal is initially low (CV), thereby turning off n-channel transistor 1515 and turning on p-channel transistors 1502, 1504, 1506 and 1508. Under these conditions, the 1.8V signal on node 1510 is transmitted to sub-word line decoders $SWD_{0,0}$, $SWD_{1,0}$, $SWD_{2,0}$ and $SWD_{3,0}$ on corresponding TSV structures, as the signals $SWL_{A0}[0]$, $SWL_{A0}[1]$, $SWL_{A0}[2]$ and $SWL_{A0}[3]$ in the manner illustrated by FIG. 9.

Just prior to time $T_D$, the SWS and SWL[0] signals are driven high (1.8V), thereby turning off p-channel transistors 1501-1502, 1504, 1506 and 1508, and turning on n-channel transistors 1511 and 1515. At time $T_D$, the sub-word line segment address signal $SWS_{A0}[0]$ is pulled down to −200 mV through turned on n-channel transistors 1511 and 1515. Note that the sub-word line segment address signals $SWS_{A0}[1]$, $SWS_{A0}[2]$ and $SWS_{A0}[3]$ remain at 1.8V at time $T_D$.

At time $T_E$, the SWS and SWL[0] signals are driven low (−200 mV), thereby turning on p-channel transistors 1501-1502, 1504, 1506 and 1508, and turning off n-channel transistors 1511 and 1515. At time $T_E$, the sub-word line segment address signal $SWS_{A0}[0]$ is pulled up to 1.8V through turned on p-channel transistors 1501 and 1502.

At time $T_G$, the $V_{PUP}$ signal transitions to a logic high voltage (1.8V), thereby turning off p-channel transistor 1509. The $V_{KICKN}$ then transitions to a logic low voltage (0V), such that the output of inverter 1521 provides a 1V signal to the lower plate of capacitor 1520, thereby driving a boosted voltage ($V_{PLUS}$=2V) onto node 1510, based on the size of kick capacitor 1520 vs the capacitance of the sub-word line segment $SWL_{0,0}$. At time $T_G$, this boosted voltage $V_{PLUS}$ is routed through turned on p-channel transistors 1501-1502, thereby providing a boosted sub-word line segment address signal $SWS_{A0}[0]$ (2.0V).

Just prior to time $T_H$, the $V_{KICKN}$ signal transitions to a logic high voltage (1V), such that the inverter 1521 drives a low signal 0V to the lower plate of capacitor 1520, thereby driving a lower voltage onto node 1520 ($V_{PLUS}$<2.0V). The $V_{PUP}$ signal then transitions to a logic low voltage (0V), thereby turning on p-channel transistor 1509, which pulls the voltage on node 1510 down to 1.8V ($V_{PLUS}$=1.8V). At time $T_H$, the voltage of the sub-word line segment address signal $SWS_{A0}[0]$ falls along with $V_{PLUS}$ to 1.8V, thereby completing the generation of the sub-word line segment address signal $SWS_{A0}[0]$.

As illustrated by FIG. 15A, circuit 1500 also generates $SWC_{1,0}$, $SWC_{2,0}$, and $SWC_{3,0}$ in response to SWL[1], SWL[2] and SWL[3], respectively, and SWS. However, as described above, only one of the sub-word line segment address signals $SWS_{A0}[0]$, $SWS_{A0}[1]$, $SWS_{A0}[^2]$ and $SWS_{A0}[3]$ is activated at any given time.

FIG. 16 is a block diagram illustrating the manner in which the $SWS_{A0}[0]$, $SWS_{A0}[1]$, $SWS_{A0}[2]$ and $SWS_{A0}[3]$ signals and the SRS[0] signal are used to control the sub-word line driver circuits of the portion of sub-array $A_0$ associated with the first two main word lines $MWL_0$ and $MWL_1$ of bank 11 in accordance with one embodiment of the present invention. Sub-word line driver circuits $SWD_{0,0}$, $SWD_{1,0}$, $SWD_{2,0}$ and $SWD_{3,0}$, which are associated with main word line $MWL_0$, are coupled to receive sub-word line segment address signals $SWS_{A0}[0]$, $SWS_{A0}[1]$, $SWS_{A0}[2]$ and $SWS_{A0}[3]$, respectively (in the manner illustrated by FIG. 9). Sub-word line driver circuits $SWD_{4,0}$, $SWD_{5,0}$, $SWD_{6,0}$ and $SWD_{7,0}$, which are associated with main word line $MWL_1$, are coupled to receive sub-word line segment address signals $SWS_{A0}[0]$, $SWS_{A0}[1]$, $SWS_{A0}[2]$ and $SWS_{A0}[3]$, respectively. This pattern repeats for the remaining sub-word line drivers of sub-array $A_0$. Each of the sub-word line drivers in sub-array $A_0$ is coupled to receive the sub-word line segment reset signal SRS[0].

The sub-word line segment address signals $SWS_{A1}[0]$, $SWS_{A1}[1]$, $SWS_{A1}[^2]$ and $SWS_{A1}[3]$ and the sub-word line segment reset signal SRS[1] signal are used in a similar manner to control the sub-word line driver circuits $SWD_{0,1}$, $SWD_{1,1}$, $SWD_{2,1}$, $SWD_{3,1}$, $SWD_{4,1}$, $SWD_{5,1}$, $SWD_{6,1}$, $SWD_{7,1}$, of the portion of sub-array $A_1$ associated with the first two main word lines $MWL_0$ and $MWL_1$ of bank 11.

Single Ended Sense Amplifier Operation

The manner in which the primary sense amplifiers are configured and used to access the bit cells will now be described. As will become apparent in view of the following description, the primary sense amplifiers operate as single-ended sense amplifiers. That is, each of the DRAM bit cells is accessed by sensing the voltage of a single corresponding bit line (unlike the prior art, which requires the sensing of voltages across a pair of bit lines, one of which is a dummy line capacitively held at the equalized reference voltage of Vbit/2).

Figure 17:
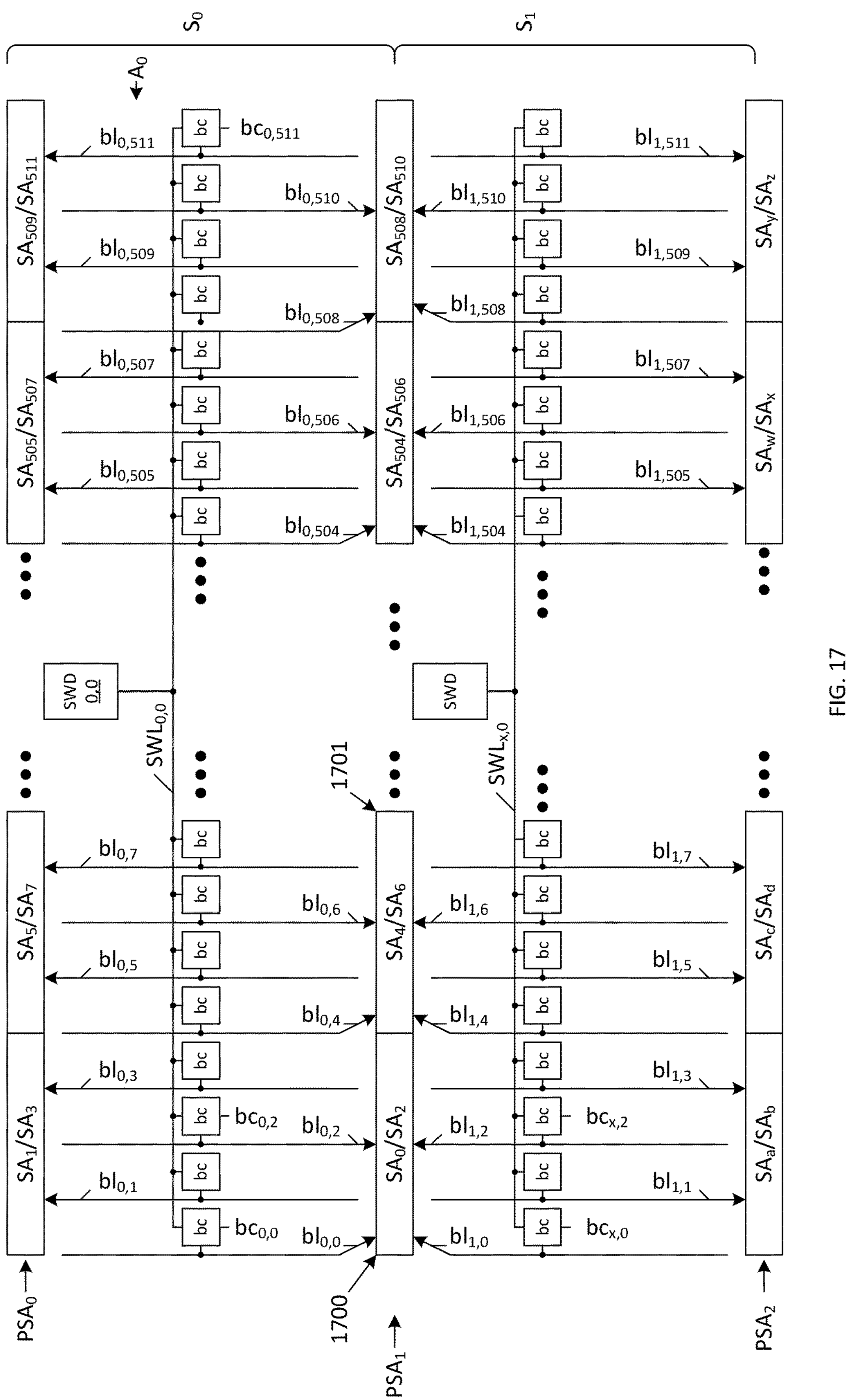
FIG. 17 is a block diagram illustrating the primary sense amplifiers and bit lines associated with a sub-array of the MTDRAM strip of FIG. 9 in accordance with one embodiment of the present invention.

FIG. 17 is a block diagram illustrating the individual primary sense amplifiers $SA_0$-$SA_{511}$ and the bit lines $bl_{0,1}$-$bl_{0,511}$ associated with the first sub-array $A_0$ of strip $S_0$ of memory bank 11 in accordance with one embodiment. Primary sense amplifier circuit $PSA_0$ is located adjacent to the upper edge of the sub-array $A_0$, and includes the odd numbered primary sense amplifiers of $SA_0$-$SA_{511}$ (e.g., $SA_1$, $SA_3$, $SA_5$, $SA_7$, etc.). Similarly, primary sense amplifier circuit $PSA_1$ is located adjacent to the lower edge of the sub-array $A_0$, and includes the even numbered primary sense amplifiers of $SA_0$-$SA_{511}$ (e.g., $SA_0$, $SA_2$, $SA_4$, $SA_6$, etc.). Each of the odd bit lines of $bl_{0,1}$-$bl_{0,511}$ (e.g., $bl_{0,1}$, $bl_{0,3}$, $bl_{0,5}$, etc.) is coupled to a corresponding odd-numbered primary sense amplifier in $PSA_0$, and each of the even bit lines of $bl_{0,1}$-$bl_{0,511}$ (e.g., $bl_{0,0}$, $bl_{0,2}$, $bl_{0,4}$, etc.) is coupled to a corresponding even-numbered primary sense amplifier in $PSA_1$.

The primary sense amplifier circuit $PSA_1$ is shared with the first sub-array of strip $S_1$ of memory bank 11, which includes bit lines $bl_{1,1}$-$bl_{1,511}$, as illustrated. Each of the even bit lines of $bl_{1,1}$-$bl_{1,511}$ (e.g., $bl_{1,0}$, $bl_{1,2}$, $bl_{1,4}$, $bl_{1,6}$, etc.) is coupled to a corresponding even-numbered primary sense amplifier in $PSA_1$.

FIG. 17 also illustrates the first sub-word line segment $SWL_{0,0}$ of the sub-array $A_0$, along with the corresponding sub-word line driver circuit $SWD_{0,0}$ (FIG. 16) and the corresponding DRAM bit cells (bc). More specifically, FIG. 17 illustrates the bit cells $bc_{0,0}$ and $bc_{0,2}$ coupled to the bit lines $bl_{0,0}$ and $bl_{0,2}$, respectively, and the sense amplifiers $SA_0$ and $SA_2$, respectively. FIG. 17 also illustrates two bit cells $bc_{1,0}$ and $bc_{1,2}$, which are coupled to the bit lines $bl_{1,0}$ and $bl_{1,2}$, respectively, within the first sub-array of strip $S_1$, and also to the sense amplifiers $SA_0$ and $SA_2$, respectively.

In the embodiment of FIG. 17, the sense amplifiers $SA_0$-$SA_{511}$ are grouped in pairs (e.g., sense amplifiers $SA_0$ and $SA_2$ are grouped as sense amplifier pair 1700, and sense amplifiers $SA_4$ and $SA_6$ are grouped as a sense amplifier pair 1701. Advantageously, the configuration of primary sense amplifiers $PSA_0$ and $PSA_1$ enables each sense amplifier pair to have a width corresponding to the pitch of four bit lines (e.g., sense amplifier pair 1701 has a width equal to the distance between bit lines $bl_{0,3}$ and $bl_{0,7}$). This configuration facilitates fitting the single-ended sense amplifiers within limited space in memory bank 11.

The operation of sense amplifiers $SA_0$ and $SA_2$ will now be described, in connection with a read operation to the first sub-word line segment $SWL_{0,0}$ of strip $S_0$.

Figure 18:
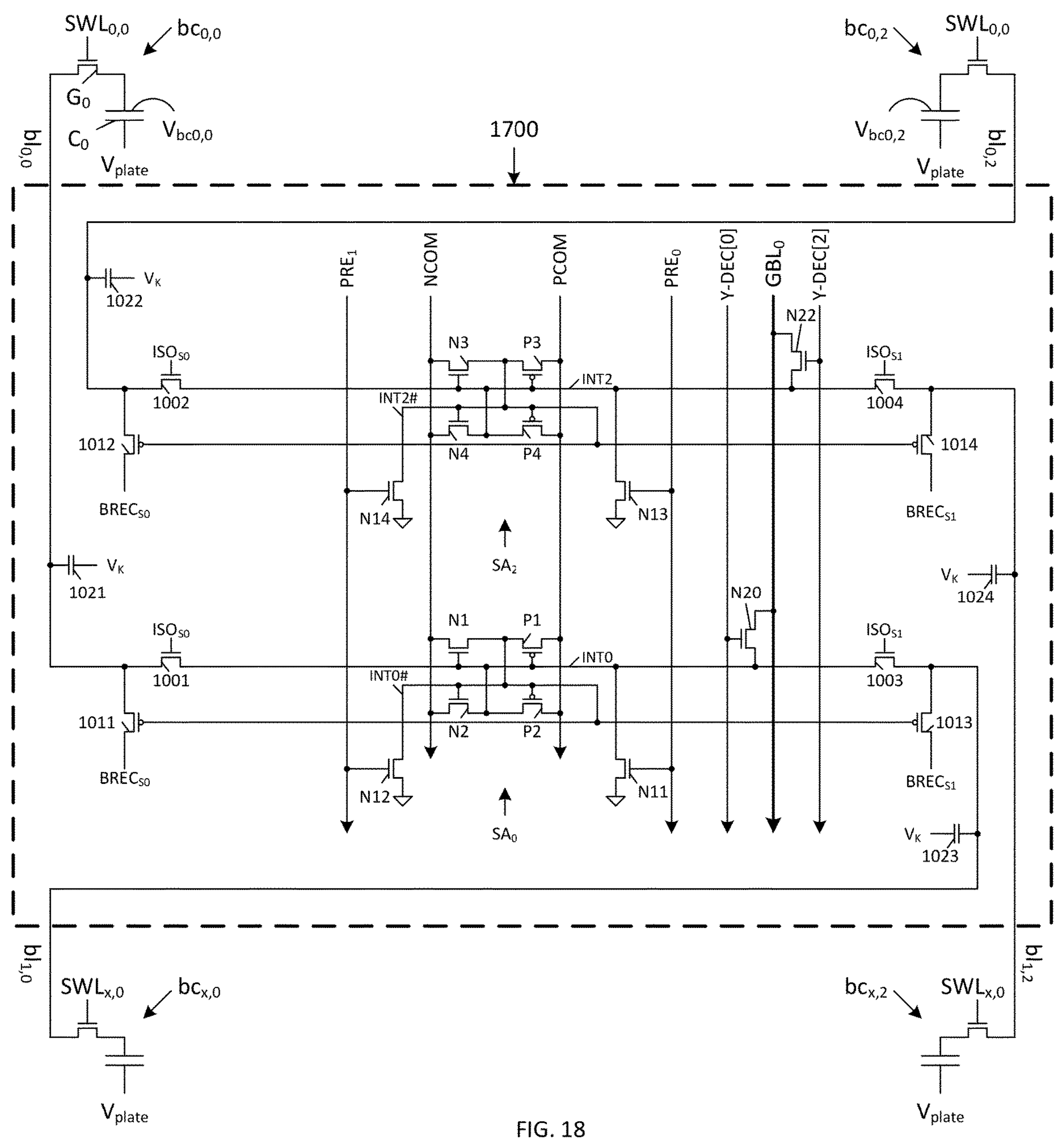
FIG. 18 is a circuit diagram of a pair of single-ended primary sense amplifiers of FIG. 17 in accordance with one embodiment of the present invention.

FIG. 18 is a circuit diagram of the primary sense amplifier pair 1700 in accordance with one embodiment. Primary sense amplifier pair 1700 includes sense amplifiers $SA_0$ and $SA_2$. Sense amplifier $SA_0$ includes p-channel transistors P1-P2 and n-channel transistors N1-N2, which are configured as cross-coupled inverters between the PCOM and NCOM terminals, as illustrated. The gates of transistors P1 and N1 are commonly coupled to the internal sense amplifier node INT0, and the gates of transistors P2 and N2 are commonly coupled to the internal sense amplifier node INT0#. N-channel transistor N11 is coupled between the internal sense amplifier node INT0 and ground. N-channel transistor N12 is coupled between the internal sense amplifier node INT0# and ground. The gates of n-channel transistors N11 and N12 are coupled to receive pre-charge control signals, $PRE_0$ and $PRE_1$, respectively.

Sense amplifier $SA_2$ includes p-channel transistors P3-P4 and n-channel transistors N3-N4 and N13-N14, which are configured in the same manner described above for p-channel transistors P1-P2 and n-channel transistors N1-N2 and N11-N12 of sense amplifier $SA_0$. The gates of transistors P3 and N3 are commonly coupled to the internal sense amplifier node INT2, and the gates of transistors P4 and N4 are commonly coupled to the internal sense amplifier node INT2#. N-channel transistors N13 and N14 are coupled between the internal sense amplifier nodes INT2 and INT2#, respectively, and ground. The gates of n-channel transistors N13 and N14 are coupled to receive pre-charge control signals, $PRE_0$ and $PRE_1$, respectively.

In accordance with one embodiment, the transistors N1-N4 and P1-P4 used to form the cross-coupled inverters of the sense amplifiers $SA_0$ and $SA_2$ are constructed using MST transistors, advantageously minimizing the mismatch of the threshold voltages of these transistors.

Primary sense amplifier pair 1700 also includes thick oxide, high voltage NMOS transistors 1001-1004, PMOS transistors 1011-1014, bit line voltage kick capacitors 1021-1024 and n-channel output select transistors N20 and N22.

NMOS transistors 1001 and 1003 are configured to couple/isolate the internal sense amplifier node INT0 to/from bit lines $bl_{0,0}$ and $bl_{1,0}$, respectively. NMOS transistors 1002 and 1004 are configured to couple/isolate the internal sense amplifier node INT2 to/from bit lines $bl_{0,2}$ and $bl_{1,2}$, respectively. The gates of NMOS isolation transistors 1001-1002 are coupled to receive an isolation signal $ISO_{S0}$ corresponding with strip $S_0$, and the gates of NMOS isolation transistors 1003-1004 are coupled to receive an isolation signal $ISO_{S1}$ corresponding with strip $S_1$.

PMOS transistors 1011 and 1012 are configured to couple/isolate the bit lines $bl_{0,0}$ and $bl_{0,2}$, respectively, to/from a bit line refresh control signal $BREC_{S0}$ associated with strip $S_0$. Similarly, PMOS transistors 1013 and 1014 are configured to couple/isolate the bit lines $bl_{1,0}$ and $bl_{1,2}$, respectively, to/from a bit line refresh control signal $BREC_{S1}$ associated with strip $S_1$. The gates of PMOS transistors 1011 and 1013 are coupled to internal sense amplifier node INT0#, and the gates of PMOS transistors 1012 and 1014 are coupled to internal sense amplifier node INT2 #.

Bit line voltage kick capacitors 1021, 1022, 1023 and 1024 are coupled to bit lines $bl_{0,0}$, $bl_{1,0}$, $bl_{1,0}$ and $bl_{1,2}$, respectively. Each of the kick capacitors 1021-1024 is further coupled to receive a kick control signal Vk, as illustrated.

Output select transistors N20 and N22 selectively couple the internal sense amplifier nodes INT0 and INT2, respectively, to global bit line $GBL_0$ in response to the decoded y-address values Y-DEC[0] and Y-DEC[2], respectively.

FIG. 18 also illustrates bit lines $bl_{1,0}$ and $bl_{1,2}$ of the adjacent strip $S_1$, which are also coupled to primary sense amplifier pair 1700. Bit cells $bc_{x,0}$ and $bc_{x,2}$ (which are coupled to corresponding sub-word line segment $SWL_{x,0}$) are coupled to bit lines $bl_{1,0}$ and $bl_{1,2}$, as illustrated. During a read access to strip $S_0$ (e.g., sub-word line segment $SWL_{0,0}$), the $ISO_{S1}$ signal is deactivated low, thereby isolating the bit lines $bl_{1,0}$ and $bl_{1,2}$ (and bit cells $bl_{1,0}$ and $bl_{1,2}$) of strip $S_1$ from the sense amplifiers $SA_0$ and $SA_2$.

Figure 19:
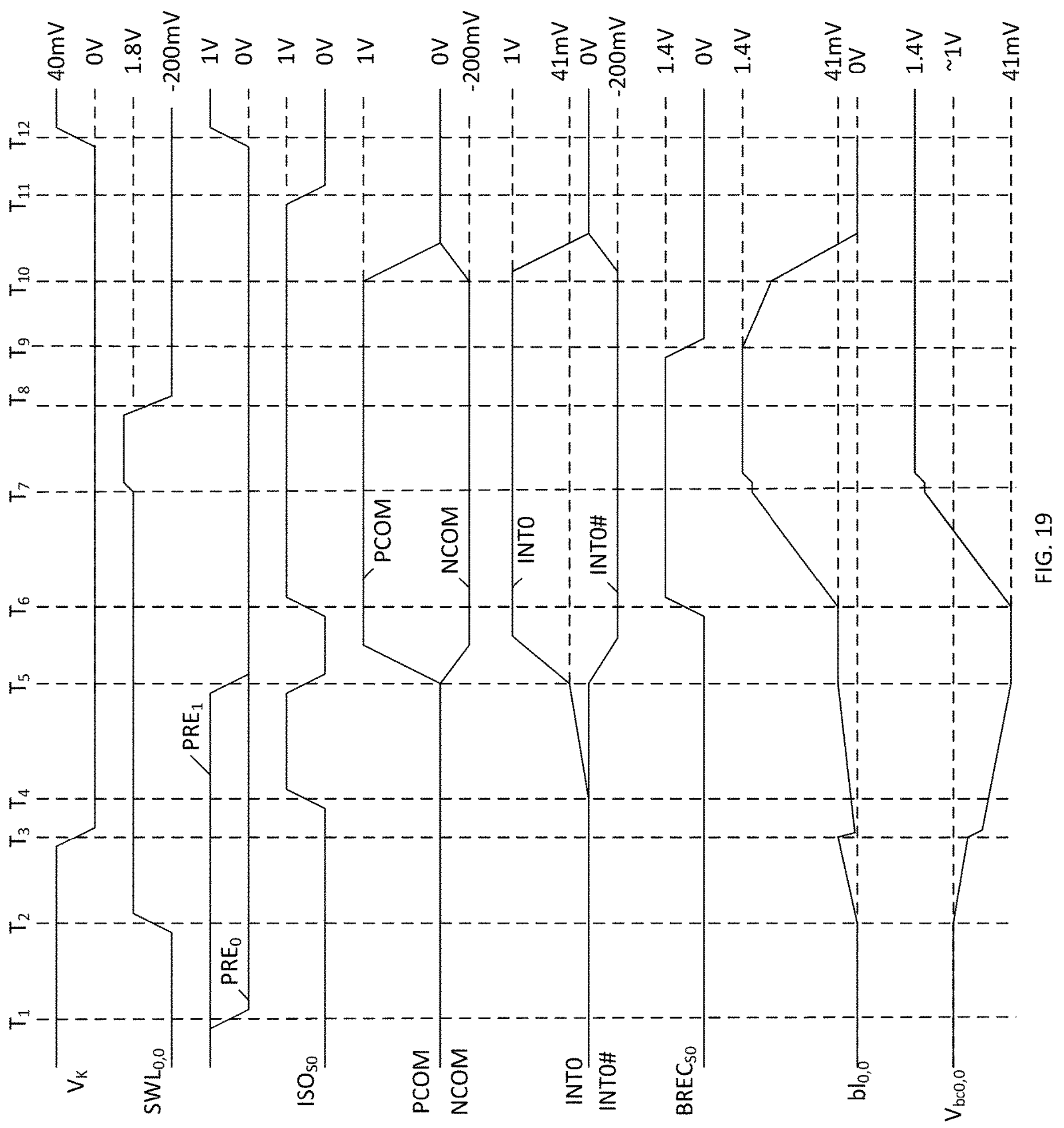
FIG. 19 is a waveform diagram illustrating a read operation to a bit cell coupled to a single-ended primary sense amplifier of FIG. 18 in accordance with one embodiment of the present invention, wherein the bit cell stores a logic '1' data value.
Figure 20:
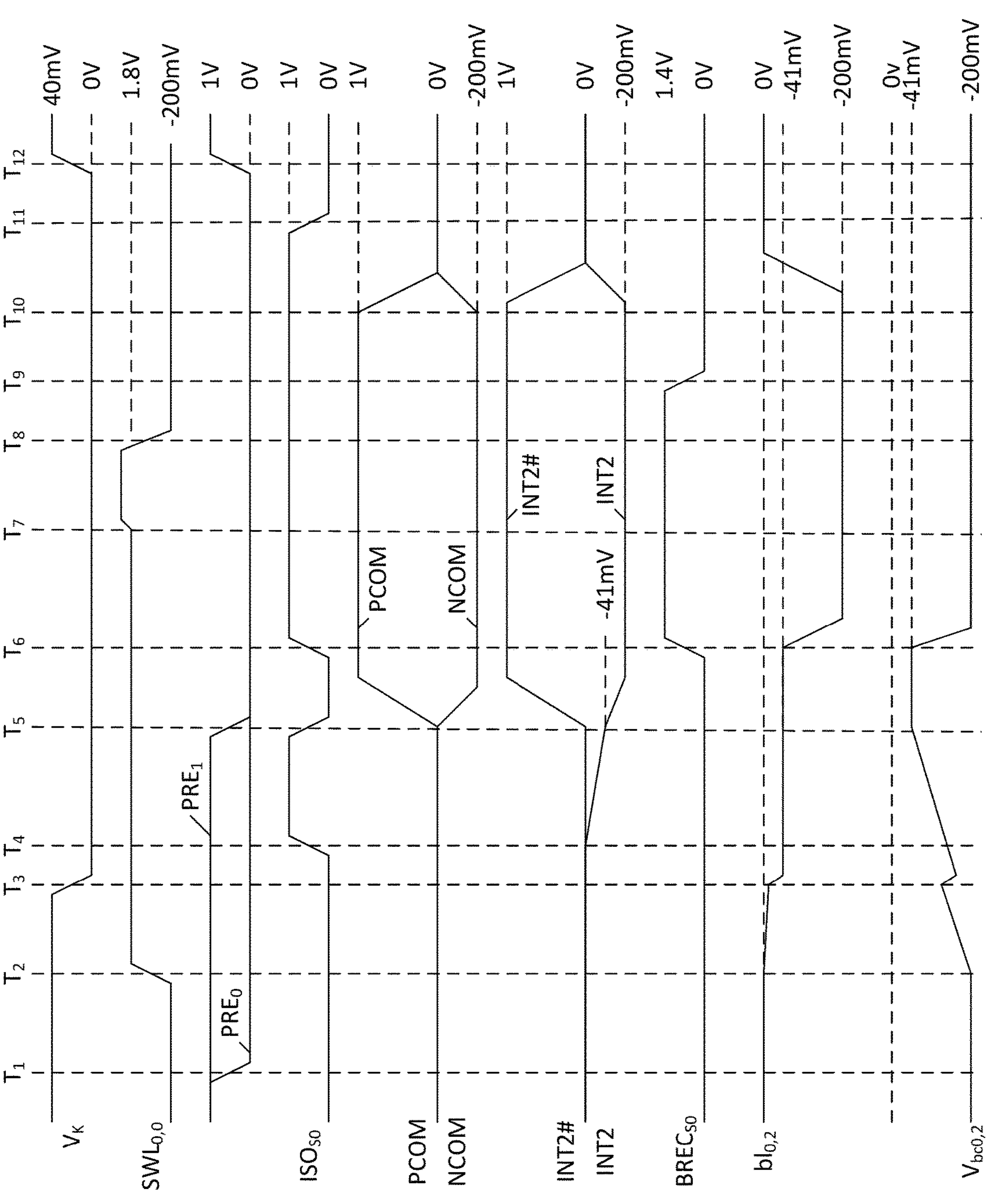
FIG. 20 is a waveform diagram illustrating a read operation to a bit cell coupled to a single-ended primary sense amplifier of FIG. 18 in accordance with one embodiment of the present invention, wherein the bit cell stores a logic '0' data value.

In the example described below, bit cell $bc_{0,0}$ stores a logic '1' value (FIG. 19) and bit cell $bc_{0,2}$ stores a logic '0' value (FIG. 20). In this example, the pass gate transistors of the bit cells are fabricated using MST technology, wherein these pass gate transistors are designed to be overdriven (i.e., the voltages applied to the gates of these pass gate transistors can be boosted) to apply a higher bit cell voltage to the bit cell capacitor. A read operation to sub-word line segment $SWL_{0,0}$ is described, highlighting the operation of primary sense amplifier pair 1700. FIGS. 19 and 20 are waveform diagrams illustrating the read accesses to bit cells $bc_{0,0}$ and $bc_{0,2}$, respectively. It is understood that the bit cells of sub-word line segment $SWL_{0,0}$ coupled to even bit lines are read to primary sense amplifier circuit $PSA_1$ in the same manner described below for bit cells $bc_{0,0}$ and $bc_{0,2}$. It is further understood that the bit cells of sub-word line segment $SWL_{0,0}$ coupled to odd bit lines are read to primary sense amplifier circuit $PSA_0$ in the same manner described below for bit cells $bc_{0,0}$ and $bc_{0,2}$.

Prior to Time T1

Prior to time T1 (FIGS. 19 and 20), the pre-charge signals $PRE_0$ and $PRE_1$ are activated high at 1V, thereby turning on n-channel transistors N11-N14. Under these conditions, internal sense amplifier nodes INT0, INT0#, INT2 and INT2# are pulled to GND. The sense amplifier supply voltages PCOM and NCOM are also held at GND prior to time T1. The p-well regions of n-channel transistors N1-N4 and N11-N14 are biased at 0V, and the n-well regions of p-channel transistors P1-P4 are biased at 1V.

The $BREC_{S0}$ and $BREC_{S1}$ voltages are held at GND. Under these conditions, PMOS transistors 1011-1014 are turned off. The $ISO_{S0}$ and $ISO_{S1}$ control voltages are also held at GND. Under these conditions, the NMOS isolation transistors 1001-1004 are turned off. The turned off transistors 1001-1004 isolate the primary sense amplifiers $SA_0$ and $SA_2$ from the bit lines $bl_{0,0}$, $bl_{0,2}$, $bl_{1,0}$ and $bl_{1,2}$.

Also prior to time T1, the bit lines $bl_{0,0}$, $bl_{0,2}$, $bl_{1,0}$ and $bl_{1,2}$ are pre-charged to GND. The kick control voltage Vk applied to kick capacitors 1021-1024 is held at a positive voltage that results in a 40 mV swing on the bit lines when the kick control voltage Vk transitions to a logic low voltage (e.g., 0V). The actual value of the kick control voltage Vk depends on the relative capacitances of the bit line and the kick capacitor.

The sub-word line segments $SWL_{0,0}$ and $SWL_{x,0}$ are held at the negative supply voltage of −200 mV, thereby ensuring that the pass gate transistors (e.g., pass gate transistor $G_0$) of the bit cells $bc_{0,0}$, $bc_{0,2}$, $bc_{x,0}$ and $bc_{x,0}$ are turned off hard. This advantageously reduces leakage in the bit cells $bc_{0,0}$, $bc_{0,2}$, $bc_{x,0}$ and $bc_{x,2}$ when these bit cells are not being accessed.

In the described example, the storage capacitor $C_0$ of bit cell $bc_{0,0}$ stores a bit cell voltage $V_{bc0,0}$ of about 1V. Note that this bit cell voltage $V_{bc0,0}$ has an initial programmed voltage of 1.4V, wherein this initial programmed voltage decreases over time. In one embodiment, the bit cell voltage can drop to a voltage of about 800 mV before the bit cell needs to be refreshed. That is, the bit cell can be successfully read as long as the bit cell voltage is 800 mV or greater.

In the described example, the storage capacitor of bit cell $bc_{0,2}$ stores a bit cell voltage $V_{bc0,2}$ of about −200 mV.

At Time T1

At time T1, the pre-charge control voltage $PRE_0$ is driven to GND, thereby turning off n-channel transistors N11 and N13, such that the internal sense amplifier nodes INT0 and INT2 are no longer actively pulled to GND through transistors N11 and N13.

At Time T2

At time T2, the selected sub-word line segment $SWL_{0,0}$ is driven from −200 mV up to the Vddp supply voltage of 1.8V, thereby turning on the pass gate transistors of bit cells $bc_{0,0}$ and $bc_{0,2}$, such that the bit cell voltages $V_{bc0,0}$ and $V_{bc0.2}$ are applied to the corresponding bit lines $bl_{0,0}$ and $bl_{0,2}$. Note that the selected word line segment $SWL_{0,0}$ is coupled to 512 corresponding bit cells $bc_{0,0}$-$bc_{0,511}$ in accordance with the description provided above in FIG. 9. The unselected sub-word line $SWL_{x,0}$ continues to be held at −200 mV.

Under these conditions, the charge stored by bit cell $bc_{0,0}$ discharges to bit line $bl_{0,0}$, causing the voltage on bit line $bl_{0,0}$ to rise from GND. In addition, the charge stored by bit cell $bc_{0,2}$ discharges bit line $bl_{0,2}$, causing the voltage on bit line $bl_{0,2}$ to fall below GND.

At Time T3

At time T3, after the bit cells $bc_{0,0}$ and $bc_{0,2}$ have been allowed to partially charge/discharge their corresponding bit lines $bl_{0,0}$ and $bl_{0,2}$ for a short period, the kick control voltage Vk transitions to GND (0V). Under these conditions, the voltages on the bit lines $bl_{0,0}$ and $bl_{0,2}$ are each kicked lower by a voltage of about 40 mV. This helps ensure that bit cells storing a logic low voltage (−200 mV) have a proper read margin.

At Time T4

At time T4, the $ISO_{S0}$ signal is driven high to 1V, thereby turning on NMOS transistors 1001 and 1002. Under these conditions, bit lines $bl_{0,0}$ and $bl_{0,2}$ are coupled to corresponding primary sense amplifiers $SA_0$ and $SA_2$. The $ISO_{S1}$ signal remains at GND, so the associated NMOS transistors 1003 and 1004 remain off, isolating bit lines $bl_{x,1}$ and $bl_{x,2}$ from the primary sense amplifiers $SA_0$ and $SA_2$.

Bit Line $Bl_{0,0}$

The INT0 voltage rises in response to rising voltage on bit line $bl_{0,0}$. The capacitance of the INT0 node is far less than the capacitance of the bit line $bl_{0,0}$, so charge sharing between the INT0 node and the bit line $bl_{0,0}$ results in only a slight reduction of the positive signal that results on the INT0 node and the bit line $bl_{0,0}$. The INT0 voltage must rise to a voltage greater than GND (i.e., INT0#) by a large enough margin to allow the primary sense amp $SA_0$ to accurately sense a high level under all process, voltage and temperature (PVT) variations that cover the full range of operating conditions in the specification. In the illustrated example, charge sharing between the INT0 node and the bit line $bl_{0,0}$ results in an INT0 voltage of 41 mV by time T5. Conversely, the bit cell voltage $V_{bc0,0}$ of the accessed bit cell $bc_{0,0}$ drops to 41 mV by time T5. The INT0# voltage remains pulled down to GND through turned on n-channel transistor N12 until time T5.

Bit Line $Bl_{0,2}$

The INT2 voltage falls in response to charge sharing with bit line $bl_{0,2}$. The INT2 voltage must fall to a voltage less than GND (i.e., INT2#) by a large enough margin to allow the primary sense amp $SA_2$ to accurately sense a low level under all PVTs and variation. In the illustrated example, the INT2 and $bl_{0,2}$ voltages fall to −41 mV by time T5. The INT2# voltage remains pulled down to GND through turned on n-channel transistor N14 until time T5.

At Time T5

At time T5, the $ISO_{S0}$ voltage is driven to GND, thereby turning off NMOS transistors 1001 and 1002, thereby isolating the bit lines $bl_{0,0}$ and $bl_{0,2}$ from the primary sense amplifiers $SA_0$ and $SA_2$. In addition, the pre-charge control voltage $PRE_1$ is driven to GND, thereby turning off n-channel pre-charge transistors N12 and N14, such that these pre-charge transistors N12 and N14 do not actively pull the INT0# and INT2# voltages to GND.

Also at time T5, the PCOM voltage is driven from GND toward a supply voltage of about 1V (or lower to save power), and the NCOM voltage is driven from GND toward to −200 mV to latch the primary sense amplifiers $SA_0$ and $SA_2$. The NCOM voltage needs to be driven lower than GND to provide headroom for sensing with cross coupled n-channel transistors N1-N2 and N3-N4 due to the low initial voltage level of INT0# and INT2#(i.e., GND). Note that the cross-coupled devices have very low threshold voltages near 0V.

Primary Sense Amplifier $SA_0$

Within primary sense amplifier $SA_0$, the relatively ‘high’ voltage (41 mV) of INT0 (with respect to the NCOM voltage of 0 to −200 mV) causes n-channel transistor N1 to turn on, thereby quickly pulling INT0# down from 0 mV to −200 mV.

The decreasing voltage of INT0#(GND to −200 mV), along with the increasing PCOM voltage (GND to 1V) causes p-channel transistor P2 to turn on, thereby pulling the INT0 voltage up from 41 mV to the PCOM voltage of 1V by time T6.

The voltage on bit line $bl_{0,0}$ and the corresponding bit cell voltage $V_{bc0,0}$ remain at approximately 41 mV from time T5 to time T6 (because the bit line $bl_{0,0}$ is isolated from the primary sense amplifier $SA_0$).

Primary Sense Amplifier $SA_2$

Within primary sense amplifier $SA_2$, the relatively ‘low’ voltage (−41 mV) of INT2 (with respect to the increasing PCOM voltage) the causes the p-channel transistor P3 to turn on, thereby pulling the INT2# voltage up from GND to 1V by time T5.

The increasing voltage of INT2#(GND to 1V), along with the decreasing NCOM voltage (GND to −200 mV) causes n-channel transistor N4 to turn on, thereby pulling the INT2 voltage down from −41 mV to −200 mV by time T6.

The voltage on bit line $bl_{0,2}$ and the corresponding bit cell voltage $V_{bc0,2}$ remain at approximately −41 mV from time T5 to T6 (because bit line $bl_{0,2}$ is isolated from the primary sense amplifier $SA_2$).

At Time T6

At time T6, the $ISO_{S0}$ signal is driven to 1V, thereby turning on NMOS transistors 1001 and 1002, re-coupling the bit lines $bl_{0,0}$ and $bl_{0,2}$ to the sense amplifiers $SA_0$ and $SA_2$. Under these conditions, the voltage on bit line $bl_{0,0}$ is pulled up (through NMOS transistor 1001) from 41 mV toward the INT0 voltage (1V) of sense amplifier $SA_0$. In addition, the voltage on bit line $bl_{0,2}$ is pulled down through NMOS transistor 1002 from −41 mV toward the INT2 voltage (−200 mV) of sense amplifier $SA_2$. Note that the Y-DEC[0] (or Y-DEC[2]) signal can be activated once the INT0 voltage reaches 1V or −200 mV.

Also at (or slightly after) time T6, the $BREC_{S0}$ voltage applied to the sources of PMOS transistors 1011 and 1012 is driven from 0V to 1.4V.

Sense amplifier $SA_0$ applies a low voltage (INT0 #=−200 mV) to the gate of PMOS transistor 1011, thereby turning this transistor on. As a result, the voltage of bit line $bl_{0,0}$ and the corresponding bit cell voltage $V_{bc0,0}$ are pulled up toward the $BREC_{S0}$ voltage of 1.4V. The INT0 voltage is not driven above 1.0V at this time due to the high threshold voltage of the NMOS isolation transistor 1001.

Sense amplifier $SA_2$ applies a high voltage (INT2 #=1V) to the gate of PMOS transistor 1012, thereby turning this transistor off. As a result, the $BREC_{S0}$ voltage of 1.4 volts is not applied to the corresponding bit line $bl_{0,2}$.

PMOS transistors 1011-1014 and NMOS transistors 1001-1004 allow the primary sense amplifiers $SA_0$ and $SA_2$ to operate with higher performance (e.g., bit lines can be charged to a higher voltage). Lower threshold voltage (thin gate oxide) transistors P1-P4 and N1-N4 advantageously operate at levels at or below 1V.

At Time T7

In the case where the bit cell pass gate transistor is fabricated in accordance with MST technology, at time T7, the sub-word line driver $SWD_{0,0}$ capacitively boosts the voltage on the selected sub-word line segment ($SWL_{0,0}$) above 1.8V, (e.g., to 2V) thereby overdriving the gates of the pass transistors of bit cells $bc_{0,0}$ and $bc_{0,2}$. Under these conditions, the bit cell voltage $V_{bc0,0}$ stored by bit cell $bc_{0,0}$ can be completely pulled up to the voltage applied to bit line $bl_{0,0}$ (i.e., $BREC_{S0}$=1.4V). Note that the operation of sub-word line driver $SWD_{0,0}$ is described above in connection with FIGS. 9, 13, 14, 15A-15B and 16.

In the case where the bit cell pass gate transistor is not fabricated in accordance with MST technology, this part of the operation is omitted. That is, the selected sub-word line segment ($SWL_{0,0}$) remains at 1.8V, and is not boosted. This causes the logic ‘1’ voltage written back to the bit cell to be lower by 200 mV, which causes a reduction (compared to the case implementing MST technology) in the time needed before a refresh operation must be implemented. However, the time needed before a refresh operation must be implemented is still much longer than the time needed before a refresh operation must be implemented in a conventional DRAM system using Vdd/2 sensing.

At Time T8

At time T8, the sub-word line driver $SWD_{0,0}$ is deactivated (whether from 1.8V or 2.0V), such that the voltage on the sub-word line segment $SWL_{0,0}$ drops to about −200 mV by time T9. As a result, the pass gate transistors of the bit cells coupled to the sub-word line segment $SWL_{0,0}$ are turned off, isolating the bit cell voltages from the bit line voltages. At this time, the bit cell $bc_{0,0}$ coupled to bit line $bl_{0,0}$ has been refreshed to a bit cell voltage $V_{bc0,0}$ of 1.4 V, and the bit cell $bc_{0,2}$ coupled to bit line $bl_{0,2}$ has been refreshed to a bit cell voltage $V_{bc0,2}$ of −200 mV.

At Time T9

At time T9, the $BREC_{S0}$ voltage is driven from 1.4V to GND, effectively turning off the PMOS transistor 1011 coupled to bit line $bl_{0,0}$. As a result, the voltage on bit line $bl_{0,0}$ begins to drop toward the INT0 voltage (1V).

At Time T10

Starting at time T10, the NCOM and PCOM voltages are driven back to GND. As a result, INT0# voltage rises from −200 mV to GND through turned on transistor N1. In addition, the INT0 voltage begins to fall from 1V toward GND (through turned on transistor P2). At this time, the INT0 node is still coupled to bit line $bl_{0,0}$ (through NMOS transistor 1001), so the voltage on bit line $bl_{0,0}$ also falls toward GND. The PCOM, NCOM, INT0, INT0# and $bl_{0,0}$ voltages all reach GND before time T11.

Within primary sense amplifier $SA_2$, the INT2 voltage begins to rise from −200 mV to GND through turned on transistor N4. In addition, the INT2# voltage begins to fall from 1V toward GND through turned on transistor P3. At this time, the INT2 node is still coupled to the bit line $bl_{0,2}$ through NMOS transistor 1002, so the voltage on bit line $bl_{0,2}$ also rises from −200 mV toward GND. The INT2, INT2# and $bl_{0,2}$ voltages all reach GND before time T11.

At Time T11

At time T11, the $ISO_{S0}$ voltage is driven from 1V to GND, turning off the NMOS transistors 1001 and 1002, and isolating the primary sense amplifiers $SA_0$ and $SA_2$ from bit lines $bl_{0,0}$ and $bl_{0,2}$.

At Time T12

At time T12, the pre-charge control voltages $PRE_0$ and $PRE_1$ are driven from GND to 1V to pre-charge the sense amplifiers $SA_0$ and $SA_2$ in the manner described above (prior to time T1), wherein INT0, INT0#, INT2 and INT2# are actively pulled to GND by transistors N11, N12, N13, and N14, respectively.

Also at time T12, the kick control voltage Vk also returns to its high level, enabling the capacitors 1021-1024 to charge prior to the next access.

In the manner described above, the primary sense amplifiers $SA_0$ and $SA_2$ operate as single-ended sense amplifiers to access the corresponding bit cells $bc_{0,0}$ and $bc_{0,2}$. That is, each of the primary sense amplifiers $SA_0$ and $SA_2$ is only required to sense the charge on a single corresponding bit line $bl_{0,0}$ and $bl_{0,2}$. This advantageously increases the density and reduces the required access power of the bit cell arrays.

In addition, the vertically aligned configuration of the sense amplifiers $SA_0$ and $SA_2$ illustrated by FIG. 18 advantageously allows this pair of sense amplifiers $SA_0/SA_2$ to be fabricated within a 4-bit line pitch in the MTDRAM bank 502 in the manner illustrated by FIG. 17.

Figure 21:
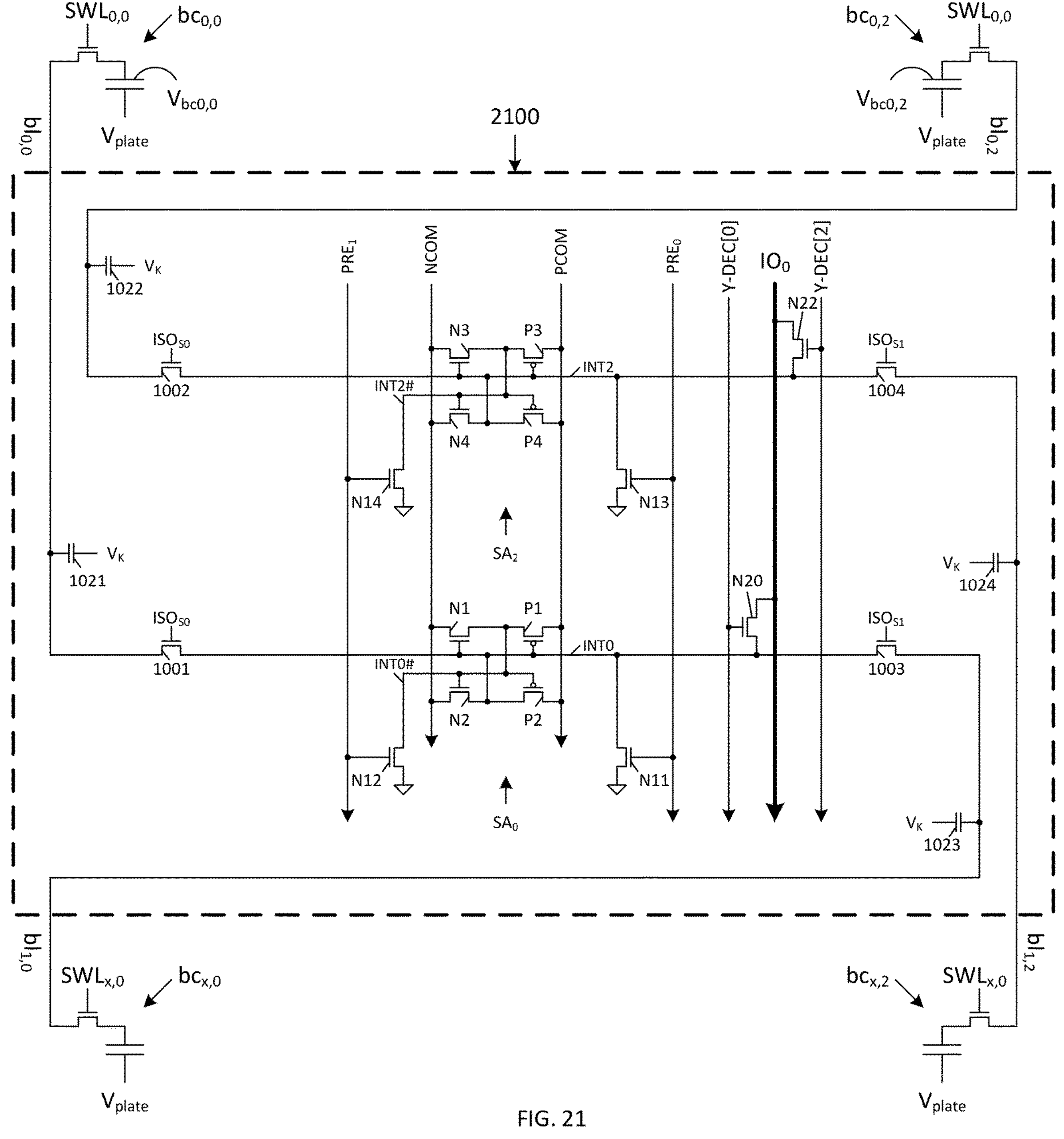
FIG. 21 is a circuit diagram of a pair of single-ended primary sense amplifiers of FIG. 17 in accordance with an alternate embodiment of the present invention.

FIG. 21 is a circuit diagram illustrating a sense amplifier pair 2100 including primary sense amplifiers $S_0$ and $S_2$ in accordance with an alternate embodiment of the present invention. Because sense amplifier pair 2100 is similar to sense amplifier pair 1700 (FIG. 18), similar elements in FIGS. 21 and 18 are labeled with similar reference numbers. In accordance with the alternate embodiment of FIG. 21, the bit cell pass gate transistors of the DRAM bit cells $bc_{0,0}$, $bc_{0,2}$, $bc_{x,0}$ and $bc_{x,2}$ are fabricated using conventional processing techniques (i.e., are not fabricated using MST technology). In this embodiment, the gates of the bit cell pass gate transistors are not overdriven to 2V during accesses to the DRAM bit cells. Thus, the sub-word line driver is not required to provide a boosted voltage on sub-word line segment $SWL_{0,0}$, as illustrated by FIGS. 19 and 20 (from time T7 to time T8).

In addition, the bit cell voltage representative of a logic high state is reduced, such that the PMOS transistors 1011-1014, which were used in sense amplifier pair 1700 to drive the voltages on the bit lines to 1.4 Volts, are not required in sense amplifier pair 2100, thereby reducing the number of transistors required by the sense amplifier pair 2100. In this embodiment, the PCOM high voltage is increased to 1.1V, and voltages on internal sense amplifier nodes INT0 and INT2 are used to drive the voltages on the corresponding bit lines $bl_{0,0}$ and $bl_{0,2}$. The gates of the NMOS isolation transistors 1001-1004 are driven to a high voltage of 1.8V, thereby enabling the full voltages on the internal sense amplifier nodes INT0 and INT2 to be driven onto the corresponding bit lines $bl_{0,0}$ and $bl_{0,2}$. In this embodiment, the isolation transistors 1001-1004 are fabricated with thick gate oxide layers to handle this high gate voltage.

Figure 22:
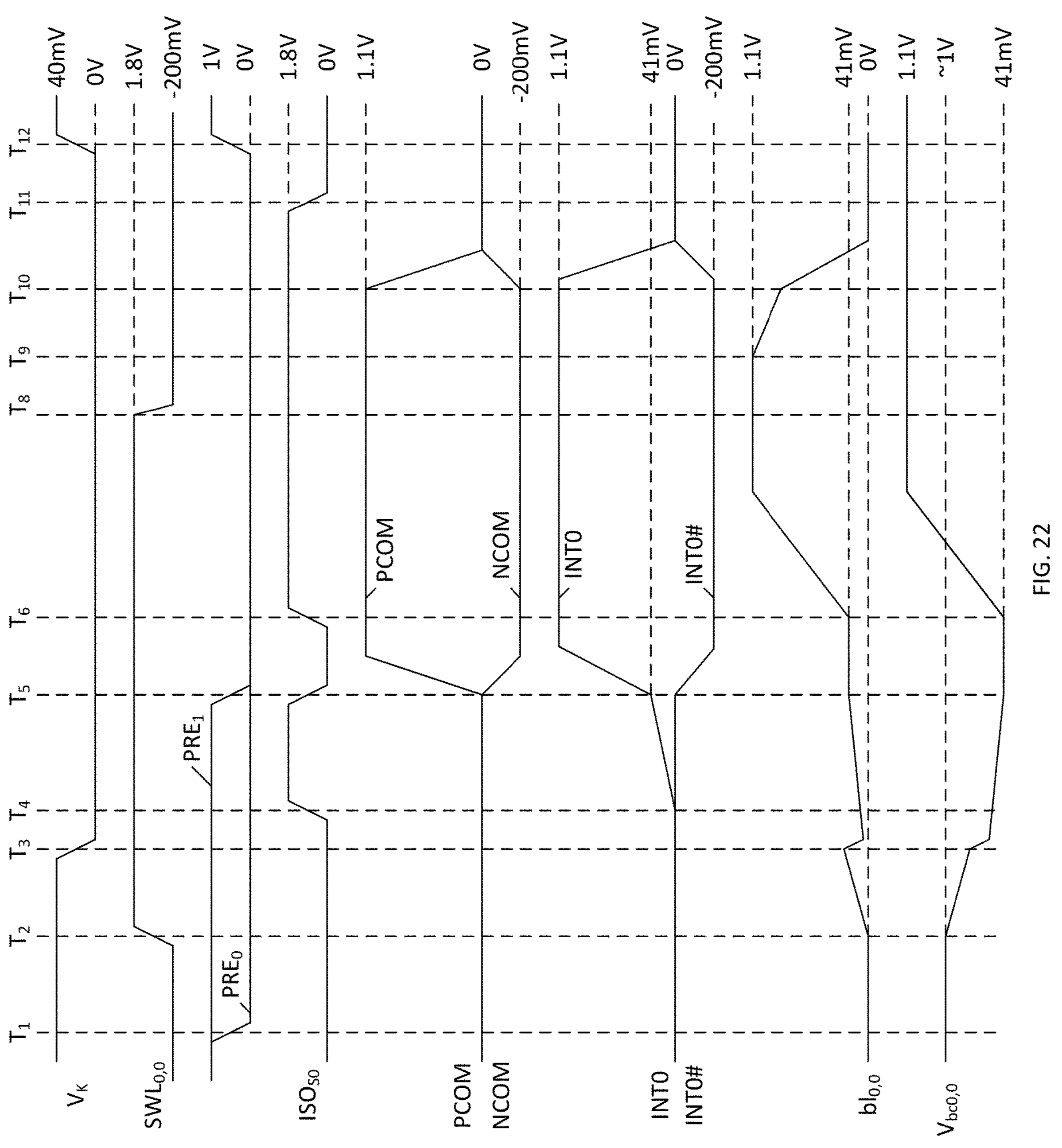
FIG. 22 is a waveform diagram illustrating a read operation to a bit cell coupled to a single-ended primary sense amplifier of FIG. 21 in accordance with one embodiment of the present invention, wherein the bit cell stores a logic '1' data value.
Figure 23:
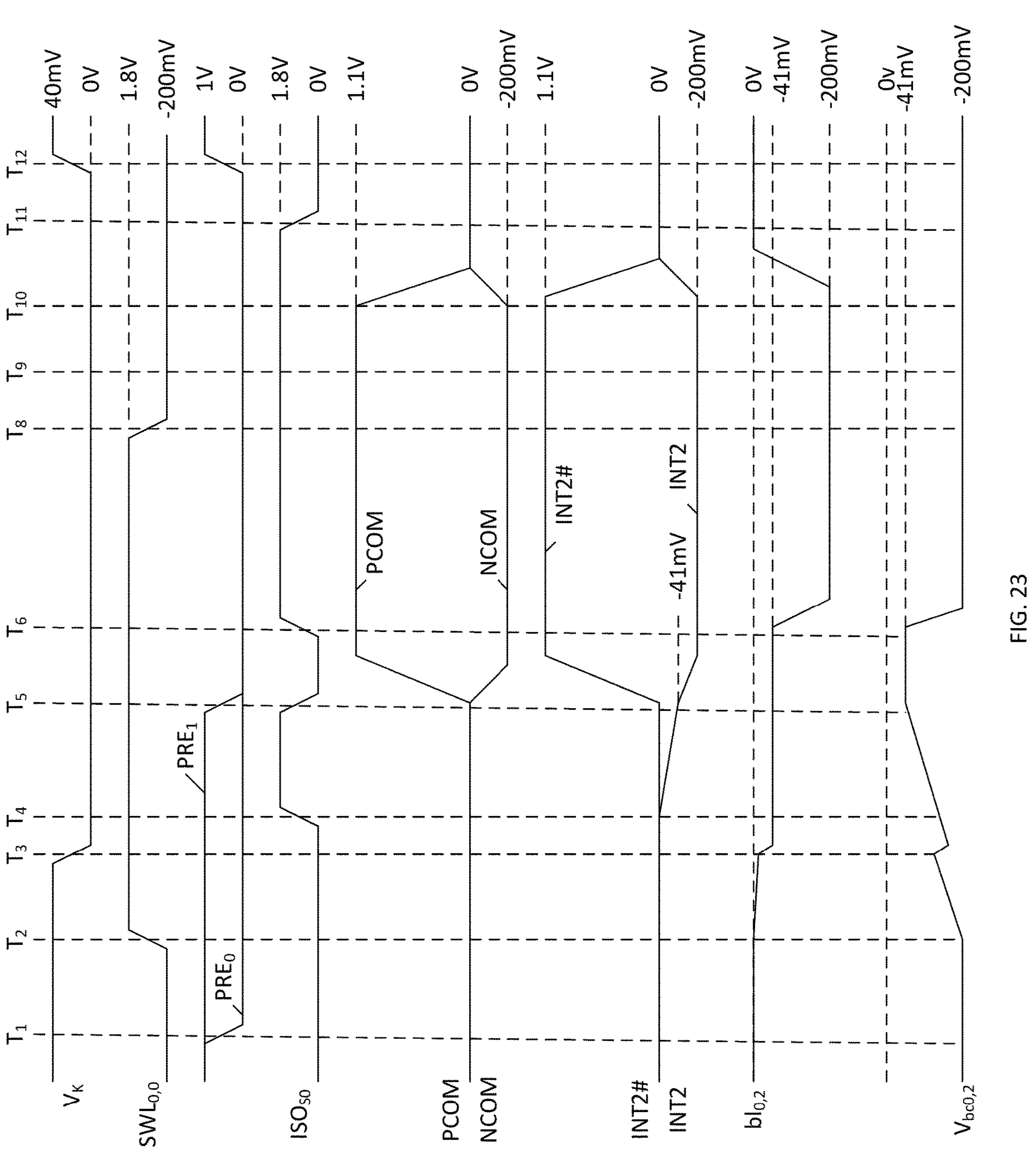
FIG. 23 is a waveform diagram illustrating a read operation to a bit cell coupled to a single-ended primary sense amplifier of FIG. 21 in accordance with one embodiment of the present invention, wherein the bit cell stores a logic '0' data value.

FIGS. 22 and 23 are waveform diagrams illustrating the read accesses to bit cells $bc_{0,0}$ and $bc_{0,2}$, respectively, using sense amplifier pair 2100 (wherein the bit cell $bc_{0,0}$ stores a logic high bit cell voltage, and bit cell $bc_{0,2}$ stores a logic low bit cell voltage). Because the waveform diagrams of FIGS. 22 and 23 are similar to the waveform diagrams of FIGS. 17 and 18, only the differences between these waveform diagrams are described herein.

As illustrated by FIGS. 22 and 23, the sub-word line voltage $SWL_{0,0}$ is not boosted between times T6 and T8. In addition, the PCOM voltage is raised to 1.1V, wherein the internal sense amplifier nodes INT0 and INT2# are driven to 1.1V by time T6. In addition, the high $ISO_{S0}$ voltage is increased to 1.8V. Thus, when the $ISO_{S0}$ voltage goes high at time T6, the full 1.1V on the internal sense amplifier node INT0 is applied to the corresponding bit line $bl_{0,0}$. As a result, the bit line $bl_{0,0}$ and the corresponding bit cell voltage $bc_{0,0}$ are pulled up to 1.1V by time T8. Thus, in the embodiment of FIGS. 21-23, the high bit cell voltage $bc_{0,0}$ is reduced to 1.1 V (from 1.4 V in the embodiment of FIGS. 18-20).

In the manner described above in connection with FIGS. 18-23, the GND voltage is effectively used as a reference voltage for performing read accesses with the single-ended sense amplifiers $S_0$ and $S_2$. That is, the voltage developed on bit line $bl_{0,0}$ (or bit line $bl_{0,2}$) is compared with the GND voltage to determine whether a logic '1' or logic '0' value was stored in the bit cell $bc_{0,0}$ (or the bit cell $bc_{0,2}$). This advantageously eliminates the need to generate a separate reference voltage for this purpose, which eliminates reference voltage (Vref) noise completely. This also eliminates the need to rely on a dummy bit line to provide the reference voltage required for a read access (as required by conventional DDR5 DRAM).

The ability to perform reliable read operations to a DRAM cell is dependent on several factors, including: the bit cell voltage stored by the DRAM cell at the end of a refresh period ($V_{CORE}$), the bit line pre-charge voltage ($V_{BLP}$), the ratio of the capacitance of the bit line ($C_B$) to the capacitance of the bit cell ($C_S$), and the capacitive coupling of the bit line to adjacent bit lines that are reading opposite data values.

The change in bit line voltage (ΔV) resulting from reading a DRAM cell having a bit cell voltage $V_{CORE}$ onto a bit line that has been pre-charged to $V_{BLP}$ in a DRAM array having a ratio of $C_B/C_S$ is defined by the following equation.

$$\Delta V = (V_{CORE} - V_{BLP})/(1 + C_B/C_S) \quad \text{Equation (1)}$$

In a conventional DRAM array (e.g., DDR5), read operations are performed by pre-charging and equalizing the bit line to be read and a dummy bit line to a voltage equal to Vdd/2. Thus, in a DRAM array that uses Vdd=1.1V (i.e., the logic high voltage initially written to a DRAM bit cell is 1.1V), the bit lines are initially pre-charged to 0.55 V ($V_{BLP}$=0.55V). If the bit cell voltage is 1.0V at the end of a refresh interval (i.e., $V_{CORE}$=1.0V), and the ratio of $C_B/C_S$ is 4, then ΔV for this DRAM array is 90 mV (i.e., (1.0-0.55)/(1+4)). Assuming a worst case bit line coupling of 20% (i.e., the voltage on the bit line being read is changed by 20% in response to capacitive coupling with surrounding bit lines having an opposite read voltage), then ΔV for the DRAM bit cell becomes 72 mV (i.e., 90 mV*0.8).

Note that as the $C_B/C_S$ ratio becomes greater (e.g., the bit lines become longer or the bit cell capacitance becomes lower), ΔV undesirably becomes smaller. For example, for a $C_B/C_S$ ratio of 9, ΔV for the above-described conventional DRAM array becomes 45 mV (i.e., (1.0-0.55)/(1+9)). Worst case bit line coupling of 20% brings ΔV down to 36 mV (i.e., 45 mV*0.8). It becomes difficult to reliably read data for such small values of ΔV. In a conventional DRAM array, this issue is symmetrical in both directions (i.e., reading a logic 0, and reading a logic 1).

In comparison, the single-ended sense amplifier of the embodiments described above will be described. If the bit cell voltage is −200 mV at the end of a refresh period (i.e., $V_{CORE}$=−200 mV), and the ratio of $C_B/C_S$ is 4, then ΔV for this DRAM array is −40 mV (i.e., (200 mV−0)/(1+4)). Assuming a worst case bit line coupling of 20%, then ΔV for this DRAM array becomes −32 mV (i.e., −40 mV*0.8). Capacitively kicking down the bit line voltage by 40 mV results in ΔV of −72 mV. In this example, the conventional DRAM array and the single-ended sense amplifier have the same ΔV.

To be symmetric, ΔV for a high level on the bit line needs to be 72 mV+40 mV+8 mV, or 120 mV. Thus, the bit cell voltage at the end of a refresh period ($V_{CORE}$) only needs to be 600 mV or higher ($V_{CORE}$=(120 mV)*(1+4)). This is significantly lower than the required $V_{CORE}$ voltage of a conventional DRAM bit cell, which is 1V in the present example. The refresh interval of a DRAM bit cell in accordance with the present invention is therefore extended by the time it takes for the DRAM bit cell voltage to further drop from 1V ($V_{CORE}$ of a conventional DRAM bit cell) to 600 mV. This represents a 5 to 10 times increase in the refresh interval (depending on the linearity of the bit cell leakage). Note that the refresh interval is extended even further if the high DRAM bit cell voltage is initially written to 1.4V as illustrated in FIGS. 18-19.

If the bit cell voltage of the single-ended sense amplifier embodiment of the present invention is −200 mV at the end of a refresh period (i.e., $V_{CORE}$=−200 mV), and the ratio of $C_B/C_S$ is 9, then ΔV for this DRAM bit cell is −20 mV (i.e., (200 mV−0)/(1+9)). Assuming a worst case bit line coupling of 20%, then ΔV for this DRAM array becomes −16 mV (i.e., 20 mV*0.8). Capacitively kicking down the bit line voltage by 30 mV (instead of 40 mV) results in ΔV of −46 mV. In this example, ΔV of the single-ended sense amplifier (−46 mV) is better than ΔV of a conventional DRAM array having a $C_B/C_S$ ratio of 9 (36 mV).

To be symmetric, ΔV for a high level on the bit line needs to be 46 mV+30 mV+4 mV, or 80 mV. Thus, the bit cell voltage at the end of a refresh period ($V_{CORE}$) needs to be 800 mV or higher ($V_{CORE}$=80 mV*(1+9)). The refresh interval of a DRAM bit cell in accordance with the present invention is therefore extended by the time it takes the DRAM bit cell voltage to further drop from 1V ($V_{CORE}$ of a conventional DRAM bit cell) to 800 mV. This represents about a 5× increase in the refresh interval (depending on the linearity of the bit cell leakage).

In another embodiment, the logic low voltage written to the bit cell coupled to the single-ended sense amplifier can be raised to −100 mV (from −200 mV). If the ratio of $C_B/C_S$ is 4, then ΔV for this DRAM array is −20 mV (i.e., (−100 mV−0)/(1+4)). Assuming a worst case bit line coupling of 20%, then ΔV for this DRAM array becomes −16 mV (i.e., −20 mV*0.8). Capacitively kicking down the bit line by 30 mV results in ΔV of −46 mV.

To be symmetric, ΔV for a high level on the bit line needs to be 46 mV+30 mV+4 mV, or 80 mV. Thus, the bit cell voltage at the end of a refresh period ($V_{CORE}$) needs to be 400 mV or higher ($V_{CORE}$=80 mV*(1+4)). The refresh interval of a DRAM bit cell in accordance with the present invention is therefore extended by the time it takes the DRAM bit cell voltage to further drop from 1V ($V_{CORE}$ of a conventional DRAM bit cell) to 400 mV. This represents a substantial increase in the refresh interval (depending on the linearity of the bit cell leakage).

In another embodiment, if the logic low voltage written to the bit cell coupled to the single-ended sense amplifier is −100 mV, and the ratio of $C_B/C_S$ is 9, then ΔV for this DRAM array is −10 mV (i.e., (−100 mV−0)/(1+9)). Assuming a worst case bit line coupling of 20%, then ΔV for this DRAM array becomes −8 mV (i.e., −10 mV*0.8). Capacitively kicking down the bit line by 30 mV results in ΔV of −38 mV. In this example, ΔV of the DRAM bit cell (−38 mV) is better than ΔV of a conventional DRAM bit cell having a $C_B/C_S$ ratio of 9 (36 mV).

To be symmetric, ΔV for a high level on the bit line needs to be 38 mV+30 mV+2 mV, or 70 mV. Thus, the bit cell voltage at the end of a refresh period ($V_{CORE}$) needs to be 700 mV or higher ($V_{CORE}$=70 mV*(1+9)). The refresh interval of a DRAM bit cell in accordance with the present invention is therefore extended by the time it takes the DRAM bit cell voltage to further drop from 1V ($V_{CORE}$ of a conventional DRAM bit cell) to 700 mV. This represents a substantial increase in the refresh interval (depending on the linearity of the bit cell leakage).

In view of the above-described examples, a circuit designer can readily modify the logic low DRAM bit cell voltage, the capacitive kick-down voltage, and the $C_B/C_S$ ratio (e.g., by controlling the bit line length and DRAM bit cell capacitance) to provide the desired tradeoffs between sensing margin and refresh interval.

Figure 24:
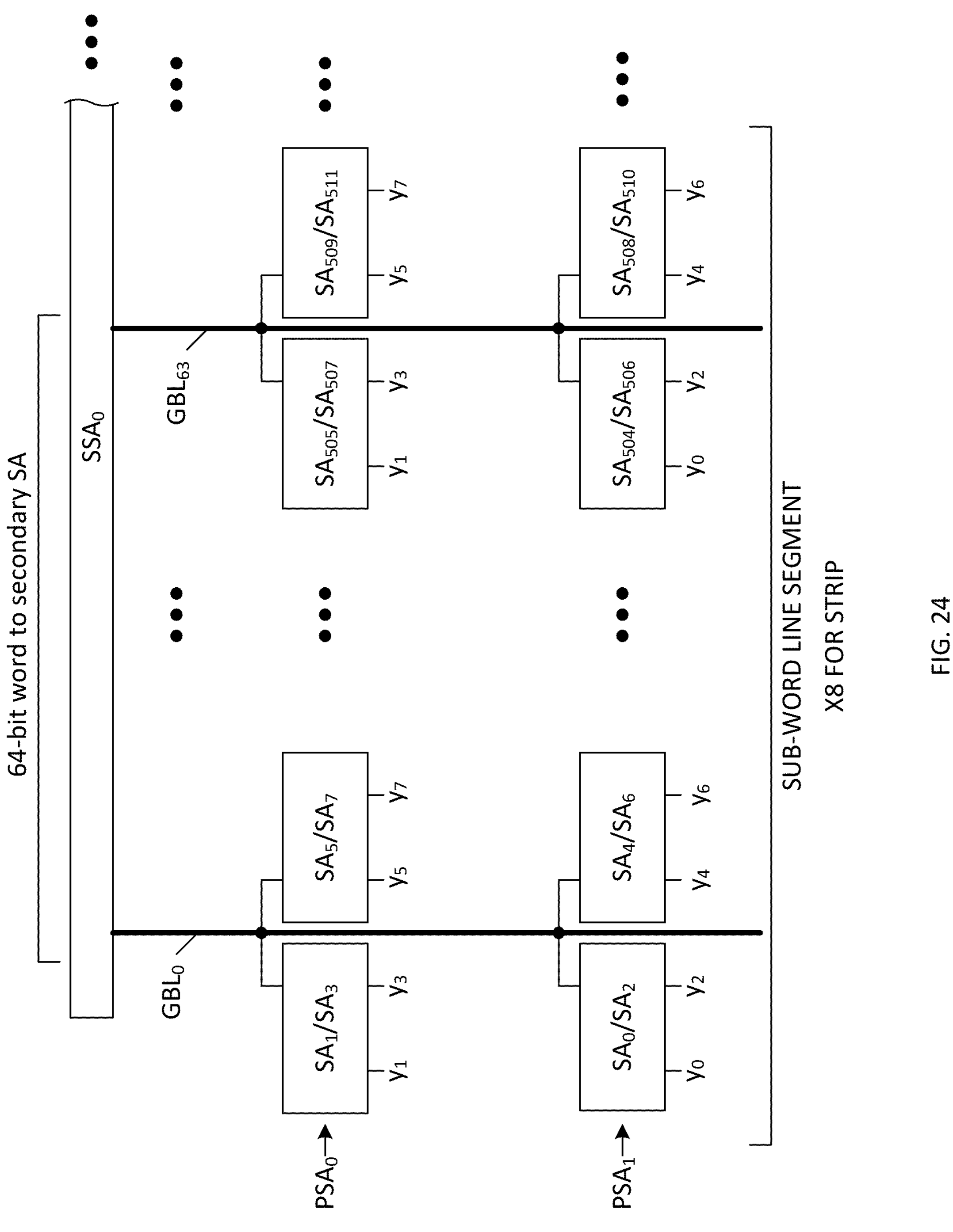
FIG. 24 is a block diagram illustrating the manner in which data is routed from a 512-bit section of the primary sense amplifier circuits associated with a sub-word line segment to a corresponding 64-bit section of a secondary sense amplifier circuit using 64 global bit lines, in accordance with one embodiment of the present invention.

FIG. 24 is a block diagram illustrating the manner in which data is routed from the portions of the primary sense amplifier circuits $PSA_0$ and $PSA_1$ associated with the sub-word line segment $SWL_{0,0}$ to the corresponding secondary sense amplifier circuit $SSA_0$ in accordance with one embodiment.

Each of the sub-word line segments is capable of reading/writing data from/to 512 corresponding bit cells. In the example described above, primary sense amplifier circuits $PSA_0$ and $PSA_1$ combine to read data from 512 bit cells $bc_{0,0}$ to $bc_{0,511}$ associated with sub-word line segment $SWL_{0,0}$ into corresponding primary sense amplifiers $SA_0$-$SA_{511}$. Each pair of primary sense amplifiers provides a single data value on a corresponding global bit line. In the example described above, any of the primary sense amplifiers $S_0$-$S_7$ of the primary sense amplifier pairs $SA_0/SA_2$, $SA_1/SA_3$, $SA_4/SA_6$ and $SA_5/SA_7$ may provide a read data value on global bit line $GBL_0$. More specifically: the read data value stored in primary sense amplifier $SA_n$ (n=0, 1, 2, 3, 4, 5, 6 or 7) is routed onto global bit line $GBL_0$ if the y-column address signal Y-DEC[n] has a value of '1' (and each of the other y-column address signals has a value of '0').

The circuit pattern described above is repeated for each successive set of four primary sense amplifier pairs. Thus, the four primary sense amplifier pairs ($SA_{504}/SA_{506}$), ($SA_{505}/SA_{507}$), ($SA_{508}/SA_{510}$) and ($SA_{509}/SA_{511}$) are coupled to global bit line $GBL_{63}$ in the manner illustrated. The read data value stored in primary sense amplifier $SA_{(504+n)}$ (n=0, 1, 2, 3, 4, 5, 6 or 7) is routed onto global bit line $GBL_{63}$ if the y-column address signal Y-DEC[n] has a value of '1' (and each of the other y-column address signals has a value of '0').

In this manner, a 64-bit data value is transferred from the primary sense amplifiers $PSA_0$-$PSA_1$ to the secondary sense amplifier $SSA_0$ on global bit lines $GBL_0$-$GBL_{63}$ during a read operation. In order to perform a burst read operation, the y-column address value is changed during successive cycles to read successive 64-bit data values from the already existing contents of primary sense amplifier circuits $PSA_0$-$PSA_1$. (e.g., a burst of four consecutive read accesses to the contents of primary sense amplifier circuits $PSA_0$-$PSA_1$ can be accomplished with successive y-column address values of '0000 0001', '0000 0010', 0000 0100' and 0000 1000').

Although FIG. 24 illustrates access circuitry for a single sub-word line segment $SWL_{0,0}$, it is understood that up to eight sub-word line segments of the corresponding strip $S_0$ can be accessed in parallel (i.e., up to eight 64-bit words can be read from the corresponding strip $S_0$ in parallel). In this embodiment, the secondary sense amplifier $SSA_0$ has a width of 512 bits.

In embodiments where only one 64-bit data value is read from a memory bank during any given read access (i.e., the embodiment of FIG. 11), output data values from all eight sub-word line segments of the strip $S_0$ are multiplexed onto the 64 global bit lines $GBL_0$-$GBL_{63}$, and the secondary sense amplifier $SSA_0$ has a width of 64 bits.

In accordance with one embodiment, the secondary sense amplifier circuits receive data values from the primary sense amplifier circuits (which have a signal swing of about 0.4 Volts), and in response provide output data values to the tertiary sense amplifier circuits having a signal swing of about 0.4 Volts). The tertiary sense amplifier circuits, in turn, provide output signals to the TSVs having a signal swing of about 0.4 Volts).

Figure 25:
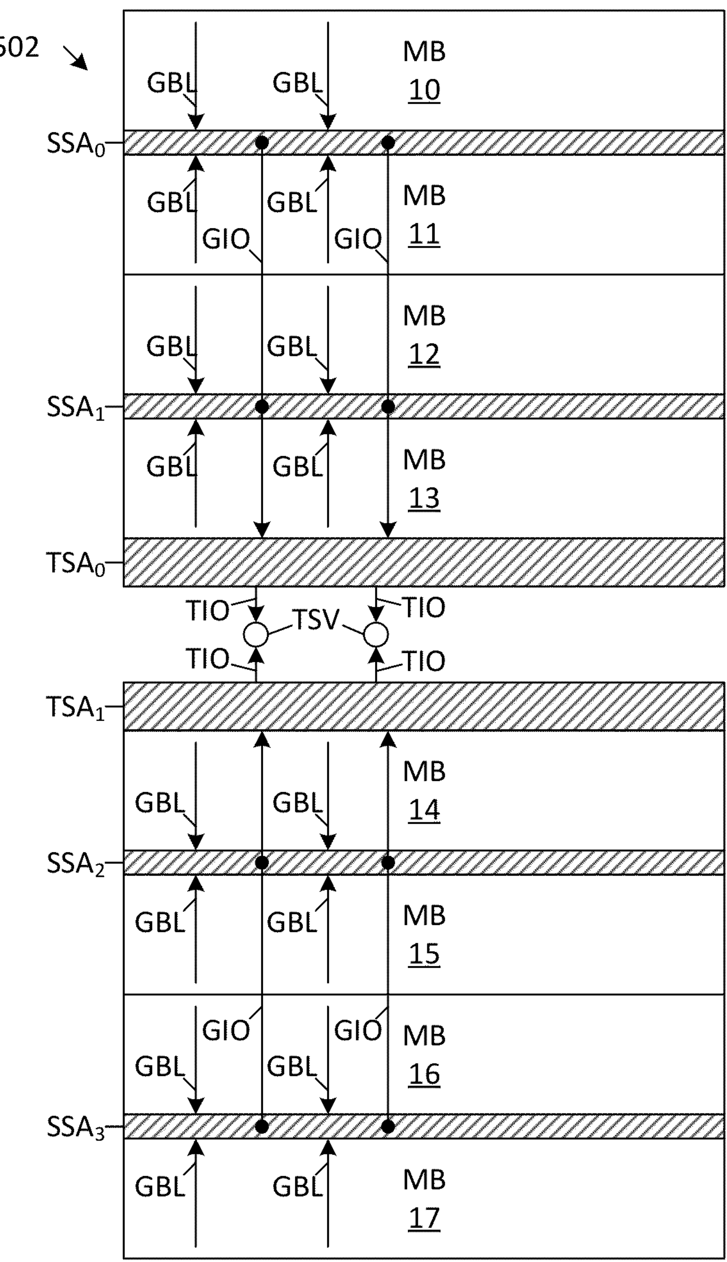
FIG. 25 is a block diagram of a unit cell in accordance with FIG. 7, generally illustrating the global bit line paths from the primary sense amplifiers to the secondary sense amplifiers, the global input/output (GIO) line paths from the secondary sense amplifiers the tertiary sense amplifiers, and the TSV input/output (TIO) line paths from the tertiary sense amplifiers to the TSVs in accordance with one embodiment of the present invention.

FIG. 25 is a block diagram of unit cell 502, generally illustrating the global bit line (GBL) paths from the primary sense amplifier circuits to the secondary sense amplifier circuits $SSA_0$-$SSA_3$, the global I/O (GIO) line paths from the secondary sense amplifier circuits $SSA_0$-$SSA_3$ to the tertiary sense amplifier circuits $TSA_0$-$TSA_1$, and the tertiary I/O (TIO) line paths from the tertiary sense amplifier circuits $TSA_0$ and $TSA_1$ to the TSV structures. In the embodiment illustrated by FIGS. 25, the GBL lines, GIO lines and TIO lines are all fabricated in the same metal layer of the MTDRAM chip 101, wherein the GIO lines extend in parallel between adjacent GBL lines.

In one embodiment, the primary sense amplifier circuits have a cycle time of 32 ns (i.e., read accesses can be initiated to a strip every 32 ns). However, it is understood that a burst read access can be performed, wherein 2, 4 or 8 data values previously stored in the primary sense amplifier circuits during a read access can be successively read out of the unit cell (without the need to wait 32 ns). In one embodiment, burst data read in this manner can be read out of the memory bank at a frequency of 2 GHz.

In accordance with one embodiment, the access cycle time of each MTDRAM bank is 4 ns. That is, data can be read from an address within a MTDRAM bank every 4 ns, unless access to the address is prevented by a previous access to the bank. In an embodiment where the primary sense amplifier circuits have a cycle time of 32 ns, once a read access is initiated to a particular strip in a unit cell, another read access to that same strip (or any adjacent strip) is prevented for 32 ns.

Although the present invention has been described using certain embodiments wherein the unit cells operate with a data word width of 64-bits, it is understood that in other embodiments, some of the unit cells are designed to have a data word width of 64-bits and other unit cells are designed to have one or more other data word widths. For example, other unit cells may be designed to have a 72-bit data word width and/or an 80-bit data word width. In these embodiments, the height (i.e., number of rows) in each of the unit cells is fixed (e.g., 4096 rows in the embodiments described above) to allow unit cells of different data widths to be placed adjacent to each other.

Moreover, although the present invention has been described in accordance with MTDRAM chips 101-104 having a certain number of TSV regions (e.g., four TSV regions 201-204), memory banks having a particular number of MTDRAM strips (e.g., memory banks 10-17, each having eight corresponding MTDRAM strips $S_0$-$S_7$), and a single input/output data channel per unit cell, it is understood that the above-described MTDRAM chips can have other configurations in other embodiments.

Figure 26:
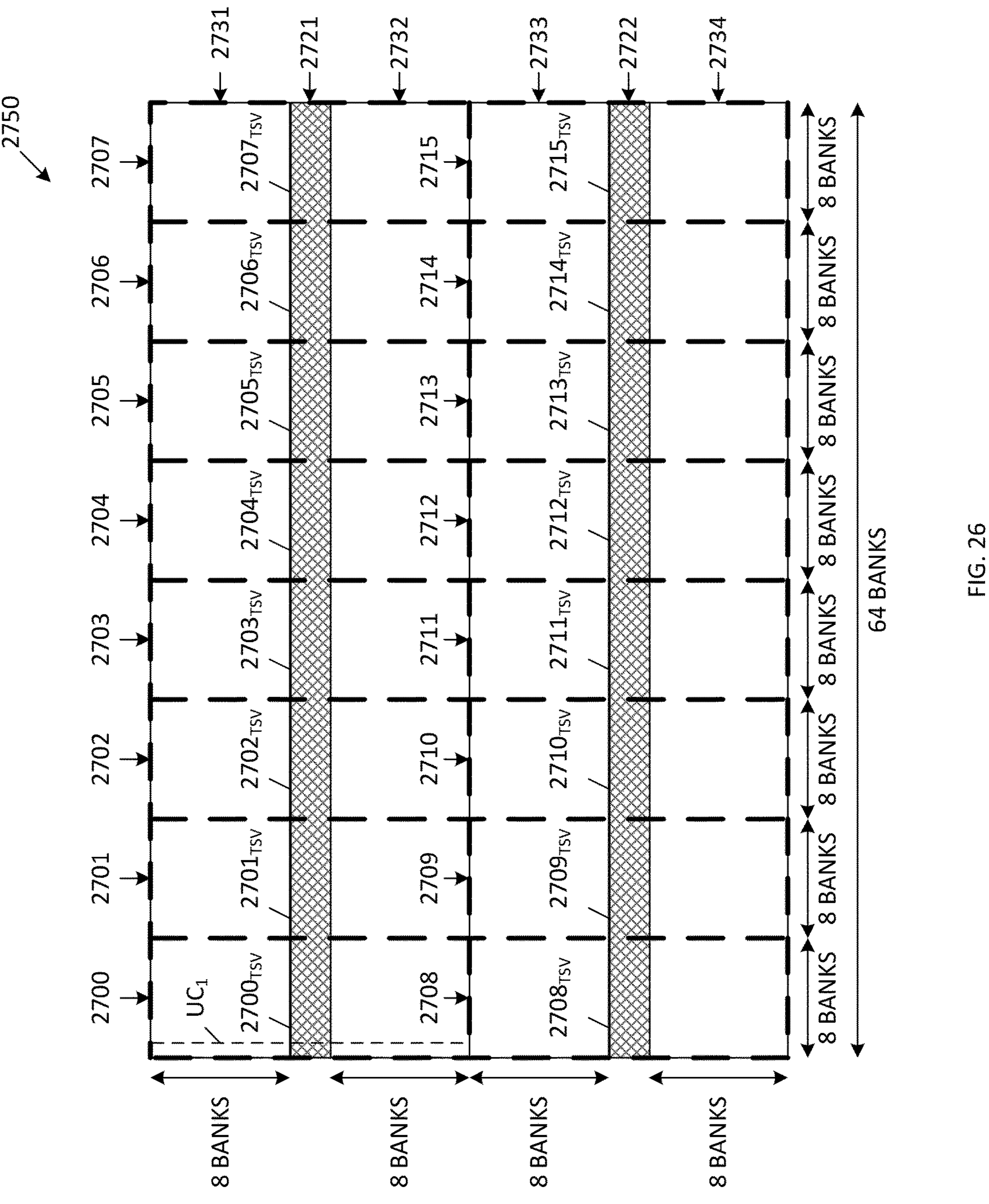
FIG. 26 is a block diagram that illustrates the layout of a 32 Gb MTDRAM chip in accordance with an alternate embodiment of the present invention.

For example, FIG. 26 illustrates the layout of a 32 Gb MTDRAM chip 2750 in accordance with an alternate embodiment of the present invention. MTDRAM chip 2750 includes sixteen independent 2 Gb sectors 2700-2715, which are arranged as illustrated. More specifically, MTDRAM only includes two main TSV strips 2721-2722 and four 8 Gb MTDRAM memory blocks 2731-2734, which extend horizontally across the MTDRAM chip 2750 as illustrated. TSV strips 2721-2722 are divided into TSV regions $\mathbf{2700}_{TSV}$-$\mathbf{2715}_{TSV}$, which service MTDRAM sectors 2700-2715, respectively. Each of the MTDRAM sectors 2700-2715 has a width of 8 memory banks, and a depth of 16 memory banks (wherein the memory banks have been described in detail above). An exemplary unit cell $UC_1$ is illustrated in FIG. 26 (wherein MTDRAM chip 2750 includes 128 unit cells identical to unit cell $UC_1$).

Figure 27:
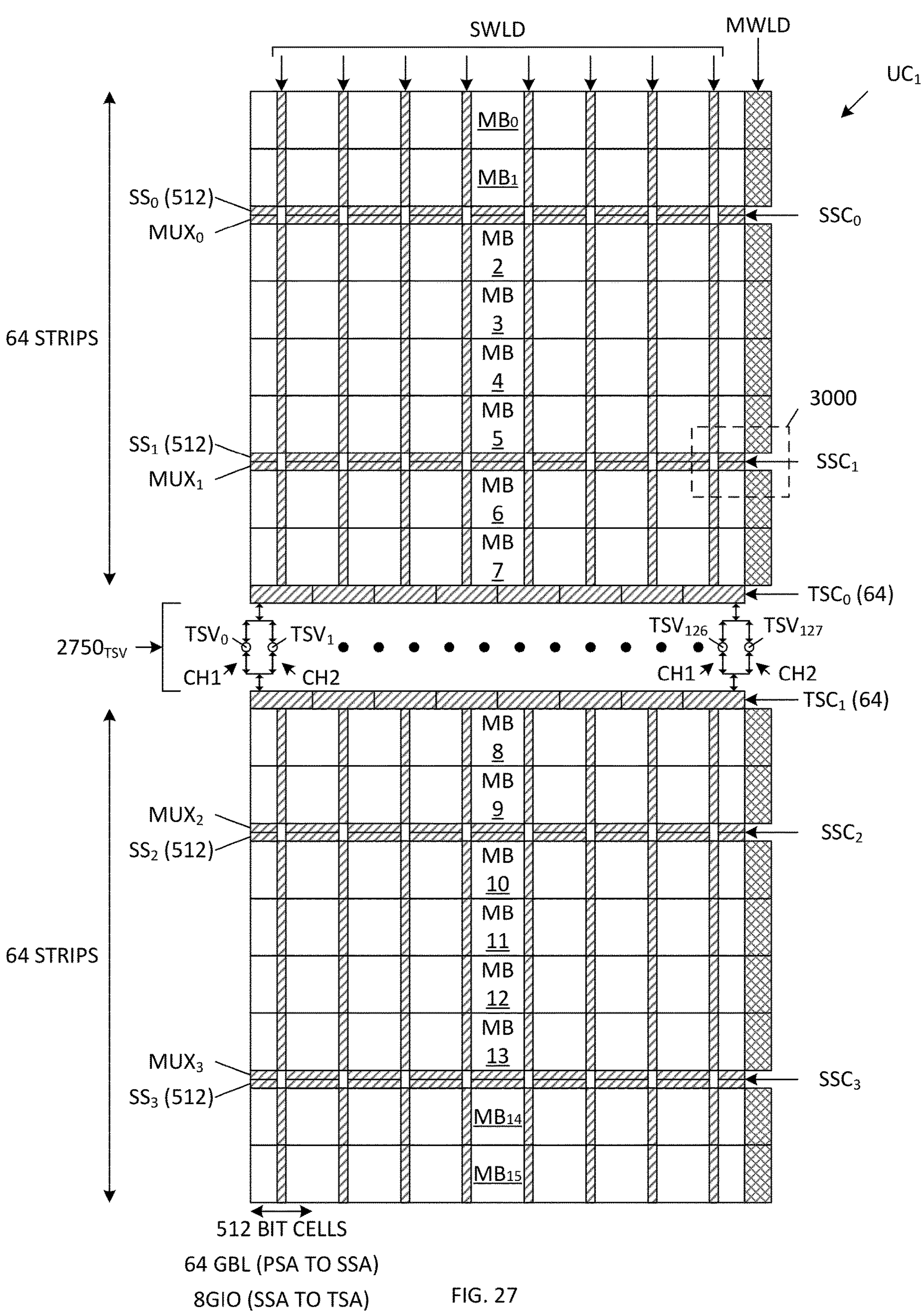
FIG. 27 is a block diagram of a unit cell of the MTDRAM chip of FIG. 26, which includes sixteen memory banks, four secondary sense amplifier circuits, two tertiary sense amplifier circuits, and a set of TSV structures that define two independent data channels in accordance with one embodiment of the present invention.

FIG. 27 is a block diagram of unit cell $UC_1$, which includes sixteen memory banks $MB_0$-$MB_{15}$, wherein each of these memory banks is identical to the memory bank 11 described above in connection with FIGS. 7 and 8. Thus, each of the memory banks $MB_0$-$MB_{15}$ includes eight MTDRAM strips, each having eight sub-arrays, as described above in connection with FIGS. 8 and 9. The main word line decoders/drivers are generally labeled MWLD, and the sub-word line decoders/drivers are generally labeled SWLD in FIG. 27. Although unit cell $UC_1$ includes sixteen memory banks $MB_0$-$MB_{15}$, and unit cell 502 of FIGS. 7-8 includes eight memory banks 10-17, each of these unit cells includes four secondary sense amplifier circuits. Thus, unit cell $UC_1$ includes secondary sense amplifier circuits $SSC_0$-$SSC_3$, wherein each of these secondary sense amplifier circuits is configured to receive data from the primary sense amplifiers within a corresponding set of four memory banks. More specifically, the secondary sense amplifier circuits $SSC_0$, $SSC_1$, $SSC_2$ and $SSC_3$ are coupled to receive data from the primary sense amplifier circuits within the sets of four memory banks $MB_0$-$MB_3$, $MB_4$-$MB_7$, $MB_8$-$MB_{11}$ and $MB_{12}$-$MB_{15}$, respectively. Each read operation accesses a 64-bit data word (from corresponding a corresponding 512 bit sub-word line segment) within one of the memory banks $MB_0$-$MB_{15}$. Such a read operation is described above in connection with FIGS. 18-24, wherein a 64-bit data word is transferred from 512 primary sense amplifiers of the primary sense amplifier circuits $PSA_0$-$PSA_1$ to the secondary sense amplifier circuit $SSA_0$ on 64 global bit lines $GBL_0$-$GBL_{63}$. Because there are eight 512-bit sub-word line segments per memory bank, each of the secondary sense amplifier circuits $SSC_0$-$SSC_3$ includes a total of 512 (64×8) secondary sense amplifiers. More specifically, secondary sense amplifier circuits $SSC_0$, $SSC_1$, $SSC_2$ and $SSC_3$ include secondary sense amplifier sets $SS_0$, $SS_1$, $SS_2$ and $SS_3$, respectively (wherein each of the secondary sense amplifier sets $SS_0$-$SS_3$ includes 512 secondary sense amplifiers).

Each of the secondary sense amplifier circuits $SSC_0$-$SSC_3$ also includes a corresponding 8-to-1 multiplexer circuit that routes one 64-bit data word from the corresponding secondary sense amplifier sets $SS_0$-$SS_3$ to a corresponding tertiary sense amplifier circuit on 64 global input/output (GIO) lines. More specifically, the secondary sense amplifier circuit $SSC_0$ includes an 8-to-1 multiplexer circuit $MUX_0$ that routes data from 64 of the 512 secondary sense amplifiers in secondary sense amplifier set $SS_0$ onto a first set of 64 GIO lines (e.g., $GIO_1$[63:0]), which are coupled to the 64 tertiary sense amplifiers of tertiary sense amplifier circuit $TSC_0$. The secondary sense amplifier circuit $SSC_1$ also includes an 8-to-1 multiplexer circuit $MUX_1$ that routes data from 64 of the 512 secondary sense amplifiers in secondary sense amplifier set $SS_1$ onto the first set of 64 GIO lines ($GIO_1$[63:0]), which are coupled to the 64 tertiary sense amplifiers of tertiary sense amplifier circuit $TSC_0$. Note that only one of the secondary sense amplifier circuits $SSC_0$-$SSC_1$ provides a 64-bit data value to the tertiary sense amplifier circuit $TSC_0$ at a given time.

Within the lower half of unit cell $UC_1$, the secondary sense amplifier circuit $SSC_2$ includes an 8-to-1 multiplexer circuit $MUX_2$ that routes data from 64 of the 512 secondary sense amplifiers in secondary sense amplifier set $SS_2$ onto a second set of 64 GIO lines (e.g., $GIO_2$[63:0]), which are coupled to the 64 tertiary sense amplifiers of tertiary sense amplifier circuit $TSC_1$. The secondary sense amplifier circuit $SSC_3$ also includes an 8-to-1 multiplexer circuit $MUX_3$ that routes data from 64 of the 512 secondary sense amplifiers in secondary sense amplifier set $SS_3$ onto the second set of 64 GIO lines ($GIO_2$[63:0]), which are coupled to the 64 tertiary sense amplifiers of tertiary sense amplifier circuit $TSC_1$. Note that only one of the secondary sense amplifier circuits $SSC_2$-$SSC_3$ provides a 64-bit data value to the tertiary sense amplifier circuit $TSC_1$ at a given time.

As illustrated by FIG. 27, unit cell $UC_1$ includes a TSV set $\mathbf{2750}_{TSV}$, which is centrally located between the tertiary sense amplifier circuits $TSC_0$ and $TSC_1$. In addition to the various control/address TSV structures described above, which are not shown in FIG. 27 for clarity, the TSV set $\mathbf{2750}_{TSV}$ includes 128 TSV structures $TSV_0$-$TSV_{127}$, which are coupled to both tertiary sense amplifier circuits $TSC_0$ and $TSC_1$. More specifically, each of the 64 data bits stored in the tertiary sense amplifier circuits $TSC_0$ and $TSC_1$ is coupled to a pair of the TSV structures $TSV_0$-$TSV_{127}$. For example, the first data bit stored by each of the tertiary sense amplifier circuits $TSC_0$ and $TSC_1$ is coupled to both $TSV_0$ and $TSV_1$, as illustrated, and the last data bit stored by each of the tertiary sense amplifier circuits $TSC_0$ and $TSC_1$ is coupled to both $TSV_{125}$ and $TSV_{127}$, as illustrated. The even numbered TSV structures ($TSV_0$, $TSV_2$, . . . $TSV_{126}$) define a first 64-bit data channel (CH1), and the odd numbered TSV structures ($TSV_1$, $TSV_3$, . . . $TSV_{127}$) define a second 64-bit data channel (CH2). In accordance with one embodiment, two accesses can be performed in parallel within unit cell $UC_1$. In this embodiment, a first 64-bit data value can be transferred between the first tertiary sense amplifier circuit $TSC_0$ and one of the 64-bit data channels CH1 or CH2, while a second 64-bit data value can be simultaneously transferred between the second tertiary sense amplifier circuit $TSC_1$ and the other one of the 64-bit data channels CH1 or CH2. In one embodiment, the TSV structures $TSV_0$-$TSV_{127}$ that form the 64-bit channels CH1 and CH2 are only coupled to the corresponding processor (e.g., processor 400) on the ASIC controller 110 (in the manner specified by FIG. 6A or 6C above). In an alternate embodiment, the TSV structures $TSV_0$-$TSV_{127}$ that form the 64-bit channels CH1 and CH2 are coupled to a corresponding processor (e.g., processor 400) on the ASIC controller 110 and also to corresponding tertiary sense amplifier circuits on stacked MTDRAM chips 102-104 (in the manner specified by FIG. 6B above).

Figure 28:
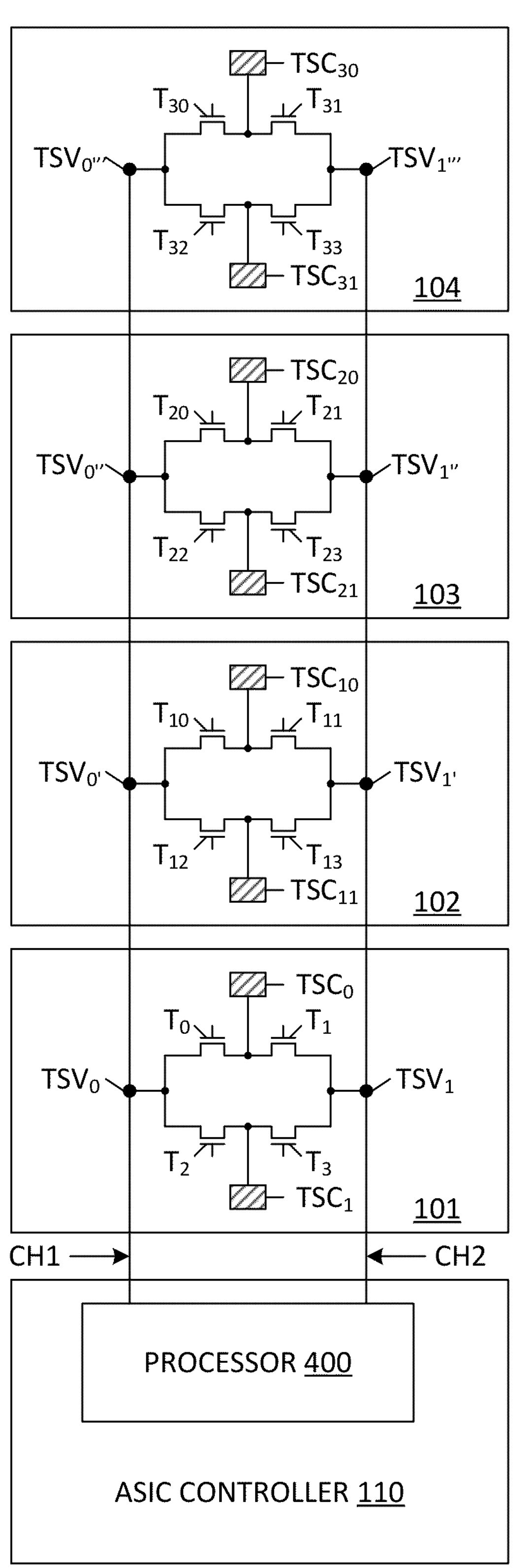
FIG. 28 is a block diagram illustrating the connection of the set of TSV structures of the unit cell of FIG. 27 to a corresponding processor on an ASIC controller, as well as to corresponding sets of TSV structures of unit cells located on other MTDRAM chips, in accordance with another embodiment of the present invention.

FIG. 28 is a block diagram illustrating the connection of TSV structures $TSV_0$ and $TSV_1$ of unit cell $UC_1$ on MTDRAM chip 101 to processor 400 on ASIC controller 110, as well as to corresponding TSV structures $TSV_{0'}$ and $TSV_{1'}$ of a corresponding unit cell on MTDRAM chip 102, corresponding TSV structures $TSV_{0''}$ and $TSV_{1''}$ of a corresponding unit cell on MTDRAM chip 103, and corresponding TSV structures $TSV_{0'''}$ and $TSV_{1'''}$ of a corresponding unit cell on MTDRAM chip 104. The TSV structures $TSV_0$ and $TSV_1$ are coupled to the first tertiary sense amplifier circuit $TSC_0$ by switching transistors $T_0$ and $T_1$, respectively, and the TSV structures $TSV_0$ and $TSV_1$ are coupled to the second tertiary sense amplifier circuit $TSC_1$ by switching transistors $T_2$ and $T_3$, respectively. Transistors $T_0$ and $T_1$ selectively couple the first tertiary sense amplifier $TSC_0$ to $TSV_0$ (channel CH1) and $TSV_1$ (channel CH2), respectively. Similarly, transistors $T_2$ and $T_3$ selectively couple the second tertiary sense amplifier $TSC_2$ to $TSV_0$ (channel CH1) and $TSV_1$ (channel CH2), respectively.

In a similar manner: transistors $T_{10}$-$T_{13}$ selectively couple the tertiary sense amplifier circuits $TSC_{10}$ and $TSC_{11}$ to $TSV_{0'}$ (channel CH1) and $TSV_{1'}$ (channel CH2) on MTDRAM chip 102; transistors $T_{20}$-$T_{23}$ selectively couple the tertiary sense amplifier circuits $TSC_{20}$ and $TSC_{21}$ to $TSV_{0''}$ (channel CH1) and $TSV_{1''}$ (channel CH2) on MTDRAM chip 103; and transistors $T_{31}$-$T_{33}$ selectively couple the tertiary sense amplifier circuits $TSC_{30}$ and $TSC_{31}$ to $TSV_{0'''}$ (channel CH1) and $TSV_{1'''}$ (channel CH2) on MTDRAM chip 104. It is understood that the remaining TSV structures $TSV_2$-$TSV_{127}$ of unit cell $UC_1$ are connected to processor 400 and corresponding TSV structures on MTDRAM chips 102-104 in the same manner as TSV structures $TSV_0$-$TSV_1$.

The configuration of FIG. 28 advantageously enables a wide range of connections between the tertiary sense amplifier circuits $TSC_0$-$TSC_1$, $TSC_{10}$-$TSC_{11}$, $TSC_{20}$-$TSC_{21}$ and $TSC_{30}$-$TSC_{31}$ and the processor 400. For example, a first 64-bit data value can be transmitted between processor 400 and any one of the tertiary sense amplifier circuits $TSC_0$-$TSC_1$, $TSC_{10}$-$TSC_{11}$, $TSC_{20}$-$TSC_{21}$ and $TSC_{30}$-$TSC_{31}$ on the first channel CH1, while a second 64-bit data value can be simultaneously transmitted between processor 400 and any other one of the tertiary sense amplifier circuits $TSC_0$-$TSC_1$, $TSC_{10}$-$TSC_{11}$, $TSC_{20}$-$TSC_{21}$ and $TSC_{30}$-$TSC_{31}$ on the second channel CH2. Similarly, a first 64-bit data value can be transmitted between any two of the tertiary sense amplifier circuits $TSC_0$-$TSC_1$, $TSC_{10}$-$TSC_{11}$, $TSC_{20}$-$TSC_{21}$ and $TSC_{30}$-$TSC_{31}$ on the first channel CH1, while a second 64-bit data value can be simultaneously transmitted between any other two of the tertiary sense amplifier circuits $TSC_0$-$TSC_1$, $TSC_{10}$-$TSC_{11}$, $TSC_{20}$-$TSC_{21}$ and $TSC_{30}$-$TSC_{31}$ on the second channel CH2.

Figure 29:
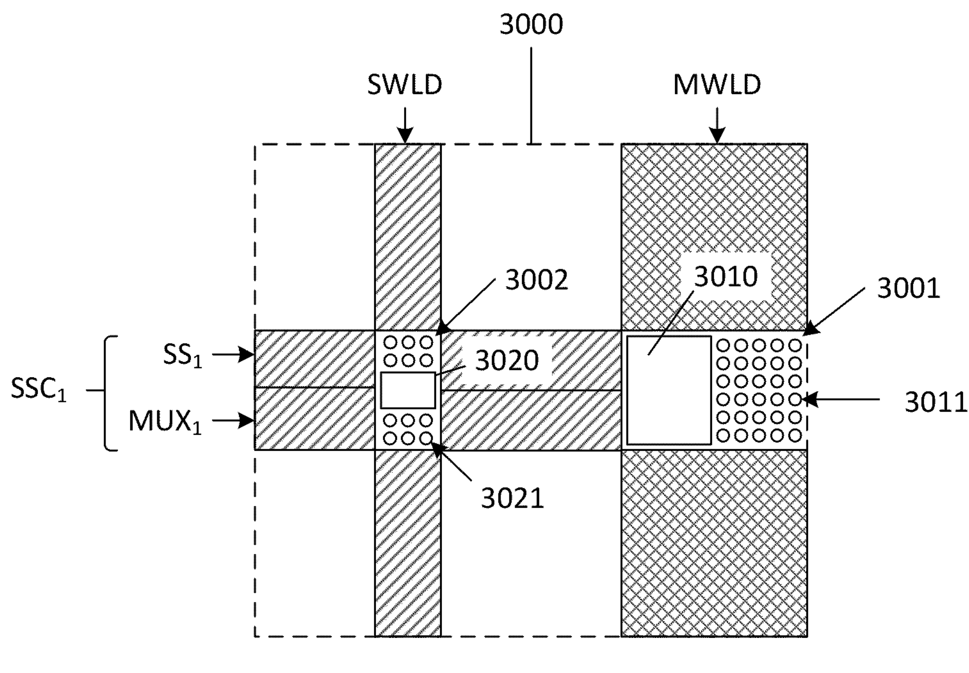
FIG. 29 is a block diagram illustrating a highlighted region of the unit cell of FIG. 27, wherein TSVs, secondary sense amplifier control circuitry and secondary sense amplifier repeater circuitry is located in regions between main word line drivers and regions between sub-word line drivers in accordance with another embodiment of the present invention.

FIG. 29 is a block diagram illustrating the highlighted region 3000 of FIG. 27 in accordance with one embodiment of the present invention. A first open region 3001 exists between adjacent main word line decoder/driver circuits (MWLD). In accordance with one embodiment, secondary sense amplifier control circuitry 3010 (i.e., circuitry for enabling addressed secondary sense amplifiers $SS_1$ within secondary sense amplifier circuit $SSC_1$, and for controlling the multiplexer circuit $MUX_1$ within secondary sense amplifier circuit $SSC_1$), and a plurality of TSV structures 3011 are fabricated in the first open region 3001. In one embodiment, the TSV structures 3011 are used to carry the main word line address signals used by the main word line decoders/drivers to select/activate the main word lines. Advantageously, locating the secondary sense amplifier control circuitry 3010 and the TSV structures 3011 in the above-described manner makes use of layout area that might otherwise be wasted. Moreover, the location of TSV structures 3011 advantageously provides low-delay signal paths to the main word line decoder/driver circuits.

A second open region 3002 exists between adjacent sub-word line decoder/driver circuits (SWLD). In accordance with one embodiment, secondary sense amplifier control repeater circuitry 3020 (i.e., circuitry for repeating the control signals provided by secondary sense amplifier control circuitry 3010), and a plurality of TSV structures 3021 are fabricated in the second open region 3002. In one embodiment, the TSV structures 3021 are used to carry the sub-word line address/control signals used by the sub-word line decoders/drivers to select/activate the sub-word word lines. Advantageously, locating the repeater circuitry 3020 and the TSV structures 3021 as described above makes use of layout area that might otherwise be wasted. Moreover, the location of the TSV structures 3021 advantageously provides low-delay signal paths to the sub-word line decoder/driver circuits. Although the TSV sets 3011 and 3021 are illustrated with particular numbers of TSV structures, it is understood that the actual number of TSV structures in each of the TSV sets 3011 and 3021 is selected in view of the operational requirements of the unit cell $UC_1$.

Figure 30:
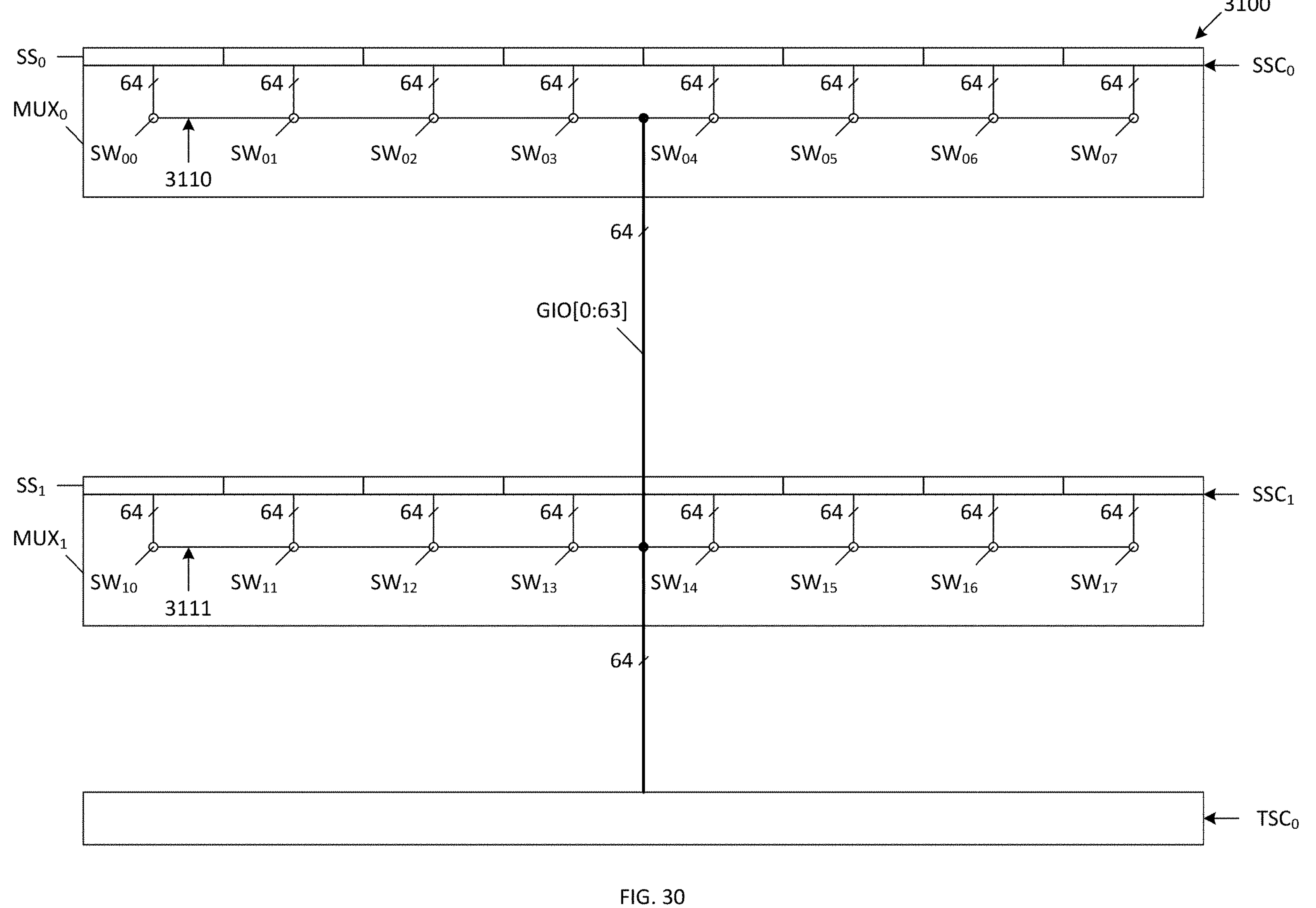
FIG. 30 is a schematic diagram illustrating multiplexer circuits for routing data between secondary sense amplifier circuits and a tertiary sense amplifier circuit of the unit cell of FIG. 27 on global input/output lines, in accordance with one embodiment of the present invention.

FIG. 30 is a circuit diagram illustrating secondary sense amplifier circuits $SSC_0$ and $SSC_1$, including secondary sense amplifiers $SS_0$ and $SS_1$ and multiplexer circuits $MUX_0$ and $MUX_1$, global I/O lines GIO[0:63] and tertiary sense amplifier circuit $TSC_0$, in accordance with one embodiment of the present invention. Eight 64-bit switches $SW_{00}$-$SW_{07}$, which are included in multiplexer circuit $MUX_0$, are controlled to selectively couple up to one 64-bit data value stored in the secondary sense amplifiers $SS_0$ to the global I/O lines GIO[0:63], as illustrated. Similarly, eight 64-bit switches $SW_{10}$-$SW_{17}$, which are included in multiplexer circuit $MUX_1$, are controlled to selectively couple up to one 64-bit data value stored in the secondary sense amplifiers $SS_1$ to the global I/O lines GIO[0:63], as illustrated. At any given time, only one (or none) of the sixteen 64-bit switches $SW_{00}$-$SW_{07}$ $SW_{10}$-$SW_{17}$, is enabled. In one embodiment, the switches $SW_{00}$-$SW_{07}$ $SW_{10}$-$SW_{17}$ are controlled in response to the bank address and the sub-word line segment address. For example, switch $SW_{00}$ is enabled for an access to the first sub-word line segment of any one of the memory banks $MB_0$-$MB_3$ of unit cell $UC_1$, and switch $SW_{17}$ is enabled for an access to the last sub-word line segment of any one of the memory banks $MB_4$-$MB_7$.

In the illustrated embodiment, the multiplexer circuits $MUX_0$ and $MUX_1$ include corresponding sets of 64 parallel lines, which are shown as elements 3110 and 3111, respectively, in FIG. 30. Each of the 64 parallel lines in set 3110 (and each of the 64 parallel lines in set 3111) is connected to a corresponding one of the 64 global I/O lines GIO[0:63], and thereby to a corresponding one of the tertiary sense amplifiers in the 64-bit tertiary sense amplifier circuit $TSC_0$. These connections are illustrated by the solid black circles in FIG. 30. In addition, each of the 64-bit switches $SW_{00}$-$SW_{07}$ couples a corresponding set of 64 of the secondary sense amplifiers $SS_0$ to the 64 parallel lines in set 3110. Similarly, each of the 64-bit switches $SW_{10}$-$SW_{17}$ couples a corresponding set of 64 of the secondary sense amplifiers $SS_1$ to the 64 parallel lines in set 3111.

It is understood that the secondary sense amplifier circuits $SSC_2$ and $SSC_3$ (including secondary sense amplifiers $SS_2$ and $SS_3$ and multiplexer circuits $MUX_2$ and $MUX_3$) and the tertiary sense amplifier circuit $TSC_1$ (along with a corresponding set of 64 global I/O lines) are configured in the same manner illustrated by FIG. 30.

The above-described configuration of multiplexers MUX0 and MUX1 advantageously results in a relatively low number of global I/O lines (64) that must be fabricated over the unit cell $UC_1$.

Although the invention has been described in connection with several embodiments, it is understood that this invention is not limited to the embodiments disclosed, but is capable of various modifications, which would be apparent to a person skilled in the art. Accordingly, the present invention is limited only by the following claims.

The invention claimed is:

1. A dynamic random access memory (DRAM) system comprising:

- a first array of DRAM cells arranged in a plurality of rows and columns, wherein each of the columns of DRAM cells is coupled to a corresponding bit line; and
- a plurality of single-ended sense amplifiers, each coupled to a corresponding bit line of the first array of DRAM cells, wherein each of the single-ended sense amplifiers comprises:
  - a kick capacitor coupled to the corresponding bit line;
  - a latch circuit having a first internal node for storing a data value; and
  - an isolation transistor coupling the corresponding bit line to the first internal node of the latch circuit, wherein the corresponding bit line is the only bit line of the first array of DRAM cells coupled to the latch circuit.

2. The DRAM system of claim 1, wherein the latch circuit further comprises:

- a first p-channel transistor having a source coupled to a first control node, a gate coupled to the first internal node and a drain coupled to a second internal node;
- a first n-channel transistor having a source coupled to a second control node, a gate coupled to the first internal node and a drain coupled to the second internal node;
- a second p-channel transistor having a source coupled to the first control node, a gate coupled to the second internal node and a drain coupled to the first internal node; and a second n-channel transistor having a source coupled to the second control node, a gate coupled to the second internal node and a drain coupled to the first internal node.

3. The DRAM system of claim 2, further comprising:

a first pre-charge transistor for selectively coupling the first internal node to a ground voltage supply; and a second pre-charge transistor for selectively coupling the second internal node to the ground voltage supply.

4. The DRAM system of claim 2, further comprising:

means for varying a voltage applied to the first control node between ground and a positive supply voltage; and means for varying a voltage applied to the second control node between ground and a negative supply voltage.

5. The DRAM system of claim 2, wherein each of the single-ended sense amplifiers further comprises: a p-channel transistor having a gate coupled to the second internal node, a drain coupled to the corresponding bit line, and a source coupled to receive a bit line refresh control signal.

6. The DRAM system of claim 2, wherein the first p-channel transistor, the first n-channel transistor, the second p-channel transistor and the second n-channel transistor have matched threshold voltages.

7. The DRAM system of claim 2, wherein the isolation transistor has a thick gate oxide layer relative to the first p-channel transistor, the first n-channel transistor, the second p-channel transistor and the second n-channel transistor.

8. The DRAM system of claim 1, further comprising means for varying a voltage applied to the kick capacitor during a read access.

9. The DRAM system of claim 1, wherein the kick capacitor is coupled to receive a kick control signal that causes a voltage on the corresponding bit line to be kicked lower during a read access.

10. The DRAM system of claim 9, wherein each of the single-ended sense amplifiers further comprises a second isolation transistor coupling the corresponding bit line of the second array of DRAM cells to the first internal node of the latch circuit, wherein the corresponding bit line of the second array of DRAM cells is the only bit line of the second array of DRAM cells coupled to the latch circuit.

11. The DRAM system of claim 9, further comprising a second array of DRAM cells arranged in a plurality of rows and columns, wherein each of the columns of DRAM cells in the second array of DRAM cells is coupled to a corresponding bit line, wherein each of the plurality of single-ended sense amplifiers is further coupled to a corresponding bit line of the second array of DRAM cells.

12. The DRAM system of claim 1, wherein each of the single-ended sense amplifiers further comprises an output select transistor that selectively couples the first internal node to a global bit line.

13. The DRAM system of claim 1, wherein the first array of DRAM cells includes only 512 rows of DRAM cells.

14. A method of operating a dynamic random access memory (DRAM) system comprising:

pre-charging a bit line coupled to a DRAM cell to ground;

pre-charging first and second internal nodes of a sense amplifier latch to ground;

driving first and second supply voltage terminals of the sense amplifier latch to ground;

activating a word line coupled to the DRAM cell, thereby causing the DRAM cell to develop a read voltage on the bit line;

activating a kick capacitor to drive down the read voltage developed on the bit line; then coupling the bit line to the first internal node of the sense amplifier latch, thereby applying the read voltage developed on the bit line to the first internal node of the sense amplifier latch; then isolating the bit line from the first internal node of the sense amplifier latch;

driving the first supply voltage terminal of the sense amplifier latch to a first supply voltage above ground, and driving the second supply voltage terminal of the sense amplifier latch to a second supply voltage; and then coupling the bit line to the first internal node of the sense amplifier latch.

15. The method of claim 14, wherein activating the word line comprises, initially applying a positive voltage to the word line, and then boosting the positive voltage.

16. The method of claim 14, further comprising isolating the bit line from the first internal node of the sense amplifier latch when activating the word line and activating the kick capacitor.

17. The method of claim 14, further comprising allowing the first internal node to float at ground before coupling the bit line to the first internal node of the sense amplifier latch.

18. The method of claim 14, wherein activating the word line comprises driving a word line voltage on the word line from a negative voltage to a positive voltage.

19. The method of claim 14, wherein activating the word line and activating the kick capacitor develops a negative read voltage on the bit line when the DRAM cell stores a data value having a first logic state, and develops a positive read voltage on the bit line when the DRAM cell stores a data value having a second logic state.

20. The method of claim 19, wherein the sense amplifier latch compares the read voltage applied to the first internal node with a voltage on the second internal node of the sense amplifier latch, which has been pre-charged to ground.

21. The method of claim 20, wherein the second internal node initially floats at ground when the sense amplifier compares the read voltage applied to the first internal node with the voltage on the second internal node of the sense amplifier latch.

22. The method of claim 19, further comprising:

pulling the second internal node from ground up to the first supply voltage, and pulling the first internal node from the negative read voltage down to the second supply voltage if the DRAM cell stores a data value having the first logic state; and pulling the second internal node from ground down to the second supply voltage, and pulling the first internal node up from the positive read voltage to the first supply voltage if the DRAM cell stores a data value having the second logic state.

23. The method of claim 22, further comprising pulling the bit line up to a boosted positive voltage greater than the first supply voltage in response to pulling the second internal node to the second supply voltage, and isolating the bit line from the boosted positive voltage in response to pulling the second internal node to the first supply voltage.

24. The method of claim 14, wherein coupling the bit line to the first internal node and isolating the bit line from the first internal node is implemented by an isolation transistor coupling the bit line and the first internal node.

25. The method of claim 24, wherein the isolation transistor is enabled to couple the bit line to the first internal node by applying a boosted positive voltage, greater than the first supply voltage, to a gate of the isolation transistor.

26. A dynamic random access memory (DRAM) system comprising:

a first integrated circuit chip including a plurality of processors;

a second integrated circuit chip including a first plurality of independent DRAM arrays, wherein each of the first plurality of independent DRAM arrays is connected to a corresponding one of the plurality of processors on the first integrated circuit chip; and refresh control circuitry located on the first integrated circuit chip, wherein the refresh control circuitry initiates refresh operations to the first plurality of DRAM arrays on the second integrated circuit chip.

27. The DRAM system of claim 26, wherein the first integrated circuit chip comprises an interconnect structure that couples each of the plurality of processors.

28. The DRAM system of claim 26, further comprising a plurality of through silicon via (TSV) structures connecting the first and second integrated circuit chips.

29. The DRAM system of claim 26, further comprising a third integrated circuit chip including a plurality of DRAM arrays, wherein each of the plurality of DRAM arrays of the third integrated circuit chip is connected to a corresponding one of the plurality of processors on the first integrated circuit chip.

30. The DRAM system of claim 29, further comprising:

a first set of through silicon via (TSV) structures connecting the first and second integrated circuit chips; and a second set of TSV structures connecting the first and third integrated circuit chips, wherein the second set of TSV structures extend through the first integrated circuit chip.

31. The DRAM system of claim 26, further comprising a power management integrated circuit coupled to the first integrated circuit chip and the second integrated circuit chip, wherein the power management integrated circuit provides a first plurality of supply voltages to the first integrated circuit chip and the second integrated circuit chip, and a second plurality of supply voltages only to the second integrated circuit chip.

32. A dynamic random access memory (DRAM) system comprising:

a first integrated circuit chip including a plurality of processors;

a second integrated circuit chip including a first plurality of independent DRAM sectors, wherein each of the first plurality of independent DRAM sectors is connected to a corresponding one of the plurality of processors on the first integrated circuit chip via a first plurality of through silicon via (TSV) interconnect structures; and a third integrated circuit chip including a second plurality of independent DRAM sectors, wherein each of the second plurality of independent DRAM sectors is connected to a corresponding one of the plurality of processors on the first integrated circuit chip via a second plurality of TSV interconnect structures, wherein the second plurality of TSV interconnect structures extend through the first integrated circuit chip.

33. A dynamic random access memory (DRAM) unit cell located on an integrated circuit chip, wherein the DRAM unit cell comprises:

a plurality of through silicon vias (TSVs) that extend through the integrated circuit chip;

a first plurality of DRAM banks that are aligned along a first axis; and a second plurality of DRAM banks that are aligned along the first axis, wherein the plurality of TSVs are located between the first and second plurality of DRAM banks along the first axis, wherein the plurality of TSVs transmit address and control signals for accessing the first and second plurality of DRAM banks, and wherein the plurality of TSVs transmit read and write data for the first and second plurality of DRAM banks, wherein each of the first and second plurality of DRAM banks includes:

a plurality of strips, wherein each strip includes:

a plurality of corresponding rows of DRAM bit cells of the DRAM bank;

a first primary sense amplifier circuit located adjacent to a first one of the plurality of corresponding rows of DRAM bit cells, wherein a first subset of the DRAM bit cells is coupled to the first primary sense amplifier circuit; and a second primary sense amplifier circuit located adjacent to a last one of the plurality of corresponding rows of DRAM bit cells, wherein a second subset of the DRAM bit cells are coupled to the second primary sense amplifier circuit.

34. A dynamic random access memory (DRAM) unit cell comprising:

a first memory bank having:

a plurality of rows and columns of DRAM cells, wherein the plurality of rows of the first memory bank are divided into N DRAM strips, wherein N is an integer greater than one, and wherein each of the N DRAM strips of the first memory bank includes a plurality of consecutive rows of the DRAM cells of the first memory bank;

a plurality of N+1 primary sense amplifier circuits, wherein each of the N DRAM strips of the first memory bank is coupled to a corresponding pair of the primary sense amplifier circuits of the first memory bank;

a second memory bank having:

a plurality of rows and columns of DRAM cells, wherein the plurality of rows of the second memory bank are divided into N DRAM strips, and wherein each of the N DRAM strips of the second memory bank includes a plurality of consecutive rows of the DRAM cells of the second memory bank;

a plurality of N+1 primary sense amplifier circuits, wherein each of the N DRAM strips of the second memory bank is coupled to a corresponding pair of the primary sense amplifier circuits of the second memory bank; and a secondary sense amplifier circuit located between the first and second memory banks, wherein the secondary sense amplifier circuit is coupled to each of the primary sense amplifier circuits of the first and second memory banks.

35. The DRAM unit cell of claim 34, wherein a first half of the columns of DRAM cells in one of the N DRAM strips of the first memory bank is coupled to a first one of the primary sense amplifier circuits of the first memory bank, and a second half of the columns of the one of the N DRAM strips of the first memory bank is coupled to a second one of the primary sense amplifier circuits of the first memory bank.

36. The DRAM unit cell of claim 34, wherein each of the N DRAM strips of the first memory bank comprises:

a plurality of main word lines; and a plurality of virtual sub-word lines, wherein each of the main word lines is coupled to a corresponding plurality of the virtual sub-word lines, and wherein each of the virtual sub-word lines is coupled to a row of the DRAM cells of the first memory bank.

37. The DRAM unit cell of claim 36, wherein each of the virtual sub-word lines comprises a plurality of independent sub-word line segments, wherein each sub-word line segment is coupled to a plurality of consecutive DRAM cells in a row of the DRAM cells of the first memory bank.

38. The DRAM unit cell of claim 37, further comprising a plurality of sub-word line drivers, wherein each of the sub-word line drivers is coupled to a corresponding one of the sub-word line segments.

39. The DRAM unit cell of claim 38, wherein each of the sub-word line drivers is coupled to receive a main word line signal from a corresponding one of the plurality of main word lines, and a sub-word line segment select signal for selecting the sub-word line segment coupled to the sub-word line driver.

40. The DRAM unit cell of claim 37, further comprising an instruction for specifying an access to the first memory bank of the DRAM unit cell comprising:

a bank address for selecting the first memory bank;

a main word line address for selecting one of the plurality of main word lines of the first memory bank; and a sub-word line segment address for selecting one of the sub-word line segments of the plurality of virtual sub-word lines coupled to the selected one of the plurality of main word lines.

41. The DRAM unit cell of claim 40, wherein the instruction further comprises:

a column select address for selecting a word within the selected one of the sub-word line segments;

a burst value for indicating a burst length of the access; and a read/write value for indicating whether the access is a read access or a write access.

42. A dynamic random access memory (DRAM) system comprising:

a first set of DRAM cells arranged in a plurality of rows and four columns, wherein each of the four columns of DRAM cells in the first set of DRAM cells is coupled to a corresponding bit line of a first group of four bit lines;

a second set of DRAM cells arranged in a plurality of rows and four columns, wherein each of the four columns of DRAM cells in the second set of DRAM cells is coupled to a corresponding bit line of a second group of four bit lines; and a first single-ended sense amplifier pair located between the first and second sets of DRAM cells, wherein the first single-ended sense amplifier pair comprises:

a first single-ended sense amplifier;

a second single-ended sense amplifier;

a first transistor for selectively coupling and decoupling the first single-ended sense amplifier to a first bit line of the first group of bit lines;

a second transistor for selectively coupling and decoupling the first single-ended sense amplifier to a first bit line of the second group of bit lines, wherein the first and second transistors are controlled such that the first single-ended sense amplifier is coupled to, at most, one bit line at a time;

a third transistor for selectively coupling and decoupling the second single-ended sense amplifier to a second bit line of the first group of bit lines;

a fourth transistor for selectively coupling and decoupling the second single-ended sense amplifier to a second bit line of the second group of bit lines, wherein the third and fourth transistors are controlled such that the second single-ended sense amplifier is coupled to, at most, one bit line at a time.

43. The DRAM system of claim 42, wherein the first single-ended sense amplifier pair has a width less than or equal to a width corresponding to four times a pitch between adjacent ones of the bit lines.

44. The DRAM system of claim 43, further comprising:

a second single-ended sense amplifier pair located adjacent to the first set of DRAM cells, wherein the second single-ended sense amplifier pair comprises:

a third single-ended sense amplifier;

a fourth single-ended sense amplifier;

a fifth transistor for selectively coupling and decoupling the third single-ended sense amplifier to a third bit line of the first group of bit lines; and a sixth transistor for selectively coupling and decoupling the fourth single-ended sense amplifier to a fourth bit line of the first group of bit lines.

45. The DRAM system of claim 44, further comprising a global bit line coupled to the first and second single-ended sense amplifiers of the first single-ended sense amplifier pair and the third and fourth single-ended sense amplifiers of the second single-ended sense amplifier pair.

46. The DRAM system of claim 44, further comprising:

a third single-ended sense amplifier pair located adjacent to the second set of DRAM cells, wherein the third single-ended sense amplifier pair comprises:

a fifth single-ended sense amplifier;

a sixth single-ended sense amplifier;

a seventh transistor for selectively coupling and decoupling the fifth single-ended sense amplifier to a third bit line of the second group of bit lines; and an eighth transistor for selectively coupling and decoupling the sixth single-ended sense amplifier to a fourth bit line of the second group of bit lines.

47. The DRAM system of claim 46, further comprising a global bit line coupled to the first and second single-ended sense amplifiers of the first single-ended sense amplifier pair, the third and fourth single-ended sense amplifiers of the second single-ended sense amplifier pair and the fifth and sixth single-ended sense amplifiers of the third single-ended sense amplifier pair.

48. The DRAM system of claim 44, further comprising a global bit line coupled to the first and second single-ended sense amplifiers of the first single-ended sense amplifier pair.

* * * * *